US012672441B2

(12) United States Patent
Park et al.

(10) Patent No.: US 12,672,441 B2
(45) Date of Patent: *Jun. 30, 2026

(54) DISPLAY DEVICE

(71) Applicant: SAMSUNG DISPLAY CO., LTD.,
Yongin-si (KR)

(72) Inventors: Jun Hyun Park, Suwon-si (KR);
Hyeong Seok Kim, Hwaseong-si (KR);
Young Wan Seo, Hwaseong-si (KR);
Yu Jin Lee, Suwon-si (KR); **Cheol
Gon Lee**, Suwon-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 206 days.

This patent is subject to a terminal dis-
claimer.

(21) Appl. No.: 18/732,051

(22) Filed: Jun. 3, 2024

(65) Prior Publication Data

US 2024/0389405 A1 Nov. 21, 2024

Related U.S. Application Data

(63) Continuation of application No. 18/051,951, filed on
Nov. 2, 2022, now Pat. No. 12,004,384, which is a
(Continued)

(30) Foreign Application Priority Data

Mar. 6, 2020 (KR) ........................ 10-2020-0028208

(51) Int. Cl.
*H10K 59/126* (2023.01)
*G09G 3/3233* (2016.01)
(Continued)

(52) U.S. Cl.
CPC ......... *H10K 59/126* (2023.02); *G09G 3/3233*
(2013.01); *H10D 86/451* (2025.01);
(Continued)

(58) Field of Classification Search
CPC ........ H10K 59/35; H10K 59/40; H10K 59/82;
H10K 59/122–124; H10K 59/126;
(Continued)

(56) References Cited

U.S. PATENT DOCUMENTS 10,283,581 B2 5/2019 Kim
10,381,485 B2 8/2019 Kang et al.
(Continued)

FOREIGN PATENT DOCUMENTS

CN 108363520 A 8/2018
CN 207947006 10/2018
(Continued)

OTHER PUBLICATIONS

Notice of Allowance dated Jul. 19, 2022 in corresponding U.S.
Appl. No. 17/139,676.
(Continued)

*Primary Examiner* — Prabodh M Dharia
(74) *Attorney, Agent, or Firm* — F. CHAU &
ASSOCIATES, LLC

(57) ABSTRACT

A display device includes a display panel having a general
area including first subpixels, and a sensor area including
second subpixels and light-transmitting area. Each of the
first subpixels and the second subpixels includes a first
active layer disposed on a substrate and formed of a first
material, a first gate layer disposed on the first active layer,
a second gate layer disposed on the first gate layer, a second
active layer disposed on the second gate layer and formed of
a second material different from the first material, a third
gate layer disposed on the second active layer, and a
light-blocking layer disposed between the substrate and the
first active layer and overlapping the second active layer in
a thickness direction.

22 Claims, 28 Drawing Sheets

Related U.S. Application Data continuation of application No. 17/139,676, filed on Dec. 31, 2020, now Pat. No. 11,508,795.

(51) Int. Cl.
  *H10D 86/40* (2025.01)
  *H10D 86/60* (2025.01)
(52) U.S. Cl.
  CPC ..... *H10D 86/60* (2025.01); *G09G 2300/0426* (2013.01); *G09G 2300/0809* (2013.01); *G09G 2320/0233* (2013.01)
(58) Field of Classification Search
  CPC ............. H10K 59/131; H10K 59/1213; H10K 59/1216; H10K 59/1315; H10D 86/451; H10D 86/60; H10D 86/423; H10D 89/10; G09G 3/3233; G09G 2300/0819; G09G 2300/0842; G09G 2300/0861; G09G 2300/0426; G09G 2300/0809; G09G 2320/0233; G09G 2320/0238
  USPC ........................................................ 345/214
  See application file for complete search history.

(56)          References Cited

U.S. PATENT DOCUMENTS

| | | | |
|---|---|---|---|
| 10,615,240 B2 | 4/2020 | Song et al. | |
| 10,707,351 B2 | 7/2020 | Kang et al. | |
| 11,158,698 B2 | 10/2021 | Song et al. | |
| 11,411,115 B2 | 8/2022 | Kang et al. | |
| 11,508,795 B2 | 11/2022 | Park et al. | |
| 11,869,974 B2 | 1/2024 | Kang et al. | |
| RE50,012 E | 6/2024 | Song | |
| 2015/0192810 A1 | 7/2015 | Koo et al. | |
| 2015/0356920 A1 | 12/2015 | Na et al. | |
| 2017/0287986 A1 | 10/2017 | Jeong et al. | |
| 2018/0061908 A1 | 3/2018 | Shim et al. | |
| 2018/0122883 A1 | 5/2018 | Beak et al. | |
| 2018/0145123 A1* | 5/2018 | Kim | H10D 86/481 |
| 2018/0190744 A1 | 7/2018 | Oh et al. | |
| 2018/0211088 A1 | 7/2018 | Cho et al. | |
| 2019/0066598 A1* | 2/2019 | Kim | G09G 3/3291 |
| 2019/0074324 A1 | 3/2019 | Kim et al. | |
| 2019/0140028 A1 | 5/2019 | Kim et al. | |
| 2020/0098795 A1 | 3/2020 | Jung et al. | |
| 2020/0117046 A1 | 4/2020 | Hwang et al. | |
| 2020/0193120 A1 | 6/2020 | Chen | |
| 2021/0043692 A1 | 2/2021 | Cha et al. | |
| 2021/0280659 A1 | 9/2021 | Park et al. | |
| 2022/0334430 A1 | 10/2022 | Chen et al. | |
| 2023/0292560 A1 | 9/2023 | Park et al. | |

FOREIGN PATENT DOCUMENTS

| | | |
|---|---|---|
| KR | 10-2016-0047133 A | 5/2016 |
| KR | 10-2016-0128547 A | 11/2016 |
| KR | 10-2017-0073969 | 6/2017 |
| KR | 10-2018-0012442 | 2/2018 |
| KR | 10-1840123 | 3/2018 |
| KR | 10-2018-0050478 A | 5/2018 |
| KR | 10-2018-0074260 | 7/2018 |
| KR | 10-2018-0078813 A | 7/2018 |
| WO | 2016076592 A1 | 5/2016 |

OTHER PUBLICATIONS

Office Action dated Mar. 10, 2022 in corresponding U.S. Appl. No. 17/139,676.

Office Action issued in corresponding Chinese Patent Application No. CN 202110238547.5 on Feb. 27, 2026.

* cited by examiner

SP1, SP2

ACTL: ACT3, DT-ACT, ACT5
GTL1: G3, DT-G, G5
GTL2: VDDL1
SDL: DL, BE1, ANDE, VDDL2

ACTL: ACT3, DT-ACT, ACT5
GTL1: G3, DT-G, G5
GTL2: VDDL1
SDL: DL, BE1, ANDE, VDDL2

ACTL: ACT3, DT-ACT, ACT5
GTL1: G3, DT-G, G5
GTL2: VDDL1
SDL: DL, BE1, ANDE, VDDL2

DISPLAY DEVICE

CROSS-REFERENCE TO RELATED APPLICATIONS

This application is a continuation application of U.S. patent application Ser. No. 18/051,951 filed Nov. 2, 2022, which is a continuation application of U.S. patent application Ser. No. 17/139,676 filed Dec. 31, 2020 which issued as U.S. Pat. No. 11,508,795 on Nov. 22, 2022, which claims priority under 35 U.S.C. § 119 to Korean Patent Application No. 10-2020-0028208, filed on Mar. 6, 2020, the disclosures of which are incorporated by reference herein in their entirety.

TECHNICAL FIELD

Example embodiments of the present disclosure relate to a display device.

DISCUSSION OF THE RELATED ART

Display devices may be utilized in various electronic devices such as, for example, smartphones, digital cameras, notebook computers, navigation systems, smart televisions, etc. Examples of display devices include flat panel display devices such as liquid crystal display (LCD) devices, field emission display (FED) devices, and organic light-emitting diode (OLED) display devices. An OLED display device includes light-emitting elements which allow pixels of a display panel to emit light, and can thus display an image without the aid of a backlight unit that provides light to the display panel.

As display devices are utilized in a greater variety of electronic devices, the demand for display devices with various design features has increased. For example, the display area of a smartphone may be increased by removing some holes, which allow for the installation of sensor devices therein, from the front surface of a display device of the smartphone. For example, sensor devices previously installed in such holes may instead overlap the display panel of the smartphone. Thus, some pixels in the display panel may overlap the sensor devices and may thus be affected by the sensor devices.

SUMMARY

Example embodiments of the present disclosure provide a display device capable of improving the characteristics of transistors by blocking light incident upon subpixels.

Example embodiments of the present disclosure also provide a display device capable of uniformly maintaining the luminance of a display panel by matching compensated values of first subpixels with compensated values of second subpixels.

According to an example embodiment, a display device includes a display panel having a general area including a plurality of first subpixels, and a sensor area including a plurality of second subpixels and light-transmitting area. The light-transmitting area transmit light therethrough. Each of the first subpixels and the second subpixels includes a first active layer disposed on a substrate and formed of a first material, a first gate layer disposed on the first active layer, a second gate layer disposed on the first gate layer, a second active layer disposed on the second gate layer and formed of a second material different from the first material, a third gate layer disposed on the second active layer, and a light-blocking layer disposed between the substrate and the first active layer and overlapping the second active layer in a thickness direction.

In an example embodiment, each of the first subpixels and the second subpixels further includes a driving transistor that controls a driving current provided to a light-emitting element, a first transistor that selectively provides an initialization voltage to a first node that is a gate electrode of the driving transistor, a second transistor that selectively connects the first node and a second node that is a drain electrode of the driving transistor, and a first capacitor connected between a driving voltage line and the first node. An active area of the driving transistor is disposed in the first active layer, an active area of the first transistor is disposed in the second active layer, and an active area of the second transistor is disposed in the second active layer.

In an example embodiment, the gate electrode of the driving transistor, a source electrode of the first transistor, a source electrode of the second transistor, and a first electrode of the first capacitor are connected to one another via the first node. The light-blocking layer overlaps the gate electrode of the driving transistor, the source electrode of the first transistor, the source electrode of the second transistor, and the first electrode of the first capacitor.

In an example embodiment, each of the first subpixels and the second subpixels further includes a third transistor that selectively provides a data voltage to a third node that is a source electrode of the driving transistor, a fourth transistor that selectively connects the driving voltage line and the third node, a fifth transistor that selectively connects the second node and a fourth node that is an anode electrode of the light-emitting element, and a sixth transistor that selectively provides the initialization voltage to the fourth node. An active area of the third transistor, an active area of the fourth transistor, an active area of the fifth transistor, and an active area of the sixth transistor are disposed in the first active layer.

In an example embodiment, the light-blocking layer overlaps the third through sixth transistors in the thickness direction.

In an example embodiment, the light-blocking layer is electrically connected to one of the first through fourth nodes.

In an example embodiment, the second gate layer of each of the second subpixels includes a metal layer overlapping the second active layer in the thickness direction.

In an example embodiment, the light-blocking layer is electrically connected to a driving voltage line or an initialization voltage line.

According to an example embodiment, a display device includes a display panel having a general area including a plurality of first subpixels, and a sensor area including a plurality of second subpixels and a light-transmitting area. The light-transmitting area transmits light therethrough. Each of the first subpixels and the second subpixels includes a first active layer disposed on a substrate and formed of a first material, a first gate layer disposed on the first active layer, a second gate layer disposed on the first gate layer, a second active layer disposed on the second gate layer and formed of a second material different from the first material, a third gate layer disposed on the second active layer, and a light-blocking layer disposed between the substrate and the first active layer and overlapping the first active layer in a thickness direction.

In an example embodiment, each of the first subpixels and the second subpixels further includes a driving transistor that controls a driving current provided to a light-emitting element, a first transistor that selectively provides an initialization voltage to a first node that is a gate electrode of the driving transistor, a second transistor that selectively connects the first node and a second node that is a drain electrode of the driving transistor, and a first capacitor connected between a driving voltage line and the first node. An active area of the driving transistor is disposed in the first active layer, an active area of the first transistor is disposed in the second active layer, and an active area of the second transistor is disposed in the second active layer.

In an example embodiment, each of the first subpixels and the second subpixels further includes a third transistor that selectively provides a data voltage to a third node that is a source electrode of the driving transistor, a fourth transistor that selectively connects the driving voltage line and the third node, a fifth transistor that selectively connects the second node and a fourth node that is an anode electrode of the light-emitting element, and a sixth transistor that selectively provides the initialization voltage to the fourth node. An active area of the third transistor, an active area of the fourth transistor, an active area of the fifth transistor, and an active area of the sixth transistor are disposed in the first active layer.

In an example embodiment, the second gate layer includes a metal layer overlapping the second active layer in the thickness direction.

In an example embodiment, the light-blocking layer does not overlap the metal layer in the thickness direction.

In an example embodiment, the metal layer of each of the first subpixels does not overlap the light-blocking layer in the thickness direction, and the metal layer of each of the second subpixels overlaps the light-blocking layer in the thickness direction.

In an example embodiment, the light-blocking layer of each of the second subpixels overlaps the second active layer in the thickness direction.

In an example embodiment, the light-blocking layer is electrically connected to a driving voltage line or an initialization voltage line.

According to an example embodiment, a display device includes a display panel having a general area including a plurality of first subpixels, and a sensor area including a plurality of second subpixels and a light-transmitting area. The light-transmitting area transmits light therethrough. Each of the first subpixels and the second subpixels includes a driving transistor that controls a driving current provided to a light-emitting element, a first transistor that selectively provides an initialization voltage to a first node that is a gate electrode of the driving transistor, a second transistor that selectively connects the first node and a second node that is a drain electrode of the driving transistor, and a first capacitor connected between a driving voltage line and the first node. Each of the second subpixels further includes a light-blocking layer overlapping the driving transistor, the first and second transistors, and the first capacitor in a thickness direction.

In an example embodiment, the display panel includes a substrate supporting the first subpixels and the second subpixels, and an active layer disposed on the substrate and including an active area of the driving transistor, an active area of the first transistor, and an active area of the second transistor. The light-blocking layer is disposed between the substrate and the active layer.

In an example embodiment, each of the first subpixels further includes a light-blocking layer overlapping the driving transistor, the first and second transistors, and the first capacitor in the thickness direction.

In an example embodiment, each of the second subpixels further includes a third transistor that selectively provides a data voltage to a third node that is a source electrode of the driving transistor, a fourth transistor that selectively connects the driving voltage line and the third node, a fifth transistor that selectively connects the second node and a fourth node that is an anode electrode of the light-emitting element, and a sixth transistor that selectively provides the initialization voltage to the fourth node. The light-blocking layer of each of the second subpixels overlaps the third through sixth transistors in the thickness direction.

According to the aforementioned and other example embodiments of the present disclosure, a display device may include first subpixels in a general area and second subpixels in a sensor area. The second subpixels may be affected by light emitted from sensor devices. However, since each of the second subpixels includes a light-blocking layer, light incident upon the transistors of each of the second subpixels can be blocked. Accordingly, the luminance of a display panel can be uniformly maintained by matching the compensated values of the first subpixels with the compensated values of the second subpixels.

According to the aforementioned and other example embodiments of the present disclosure, each of the first subpixels and the second subpixels may include a capacitor, which is connected between a driving voltage line and the gate electrode of a driving transistor. Since each of the first subpixels and the second subpixels includes a light-blocking layer, each of the first subpixels and the second subpixels can block light incident upon the node to which the capacitor is connected, via the light-blocking layer, and can thus increase the turn-on characteristics, threshold-voltage characteristics, and subthreshold swing (SS) characteristics of the transistors thereof. Accordingly, the luminance of the display panel can be uniformly maintained by matching the compensated values of the first subpixels with the compensated values of the second subpixels.

According to the aforementioned and other example embodiments of the present disclosure, each of the first subpixels can block light incident upon the transistors thereof, with the use of a light-blocking layer, and each of the second subpixels can double-block light incident upon the transistors thereof, with the use of a light-blocking layer and a metal layer. Accordingly, the luminance of the display panel can be uniformly maintained by matching the compensated values of the first subpixels with the compensated values of the second subpixels.

BRIEF DESCRIPTION OF THE DRAWINGS

The above and other features of the present disclosure will become more apparent by describing in detail example embodiments thereof with reference to the accompanying drawings, in which.

DETAILED DESCRIPTION

Figure 1:
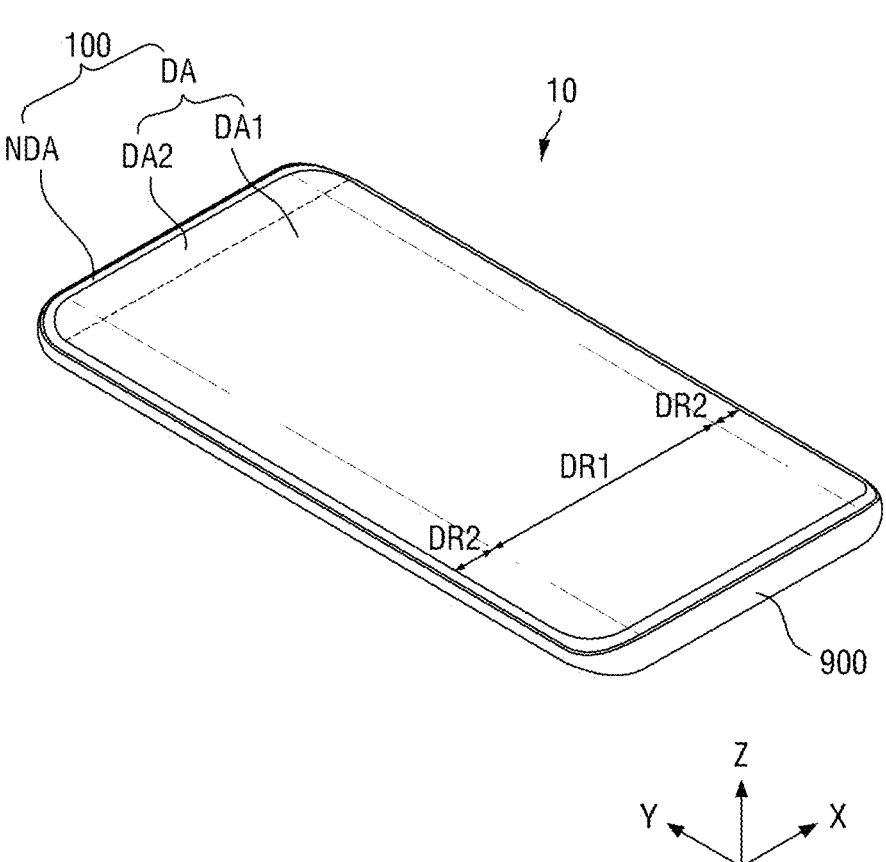
FIG. 1 is a perspective view of a display device according to an example embodiment of the present disclosure.

Example embodiments of the present disclosure will be described more fully hereinafter with reference to the accompanying drawings. Like reference numerals may refer to like elements throughout the accompanying drawings.

As used herein, the term "example embodiments" refers to non-limiting examples of devices or methods employing one or more aspects of the present disclosure. It is apparent, however, that various example embodiments may be practiced without these specific details or with one or more equivalent arrangements. In other instances, well-known structures and devices are shown in block diagram form to avoid unnecessarily obscuring illustrations of various example embodiments. Further, various example embodiments may be different, but do not have to be exclusive. For example, specific shapes, configurations, and characteristics of an example embodiment may be used or implemented in another example embodiment.

Unless otherwise specified, the illustrated example embodiments are to be understood as providing example features of varying detail of some ways in which the present disclosure may be implemented in practice. Therefore, unless otherwise specified, the features, components, modules, layers, films, panels, regions, and/or aspects, etc. (hereinafter individually or collectively referred to as "elements") of the various example embodiments may be otherwise combined, separated, interchanged, and/or rearranged without departing from the spirit and scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. When an example embodiment may be implemented differently, a specific process order may be performed differently from the described order. For example, two consecutively described processes may be performed substantially at the same time or performed in an order opposite to the described order.

When an element such as, for example, a layer, is referred to as being "on," "connected to," or "coupled to" another element or layer, it may be directly on, connected to, or coupled to the other element or layer, or intervening elements or layers may be present. Other words used to describe the relationship between elements should be interpreted in a like fashion. The term "connected" may refer to physical, electrical, and/or fluid connection, with or without intervening elements.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that are not substantially perpendicular to one another. For the purposes of this disclosure, "at least one of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side," etc., may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

As used herein, the singular forms, "a," "an," and "the" are intended to include the plural forms as well, unless the context clearly indicates otherwise. Moreover, the terms "comprises," "comprising," "includes," and/or "including," when used in this disclosure, specify the presence of stated features, integers, steps, operations, elements, components, and/or groups thereof, but do not preclude the presence or addition of one or more other features, integers, steps, operations, elements, components, and/or groups thereof.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing, as would be understood by a person having ordinary skill in the art. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, etc., which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the present disclosure. Further, the blocks, units, and/or modules of some example embodiments may be physically combined into more complex blocks, units, and/or modules without departing from the scope of the present disclosure.

Figure 2:
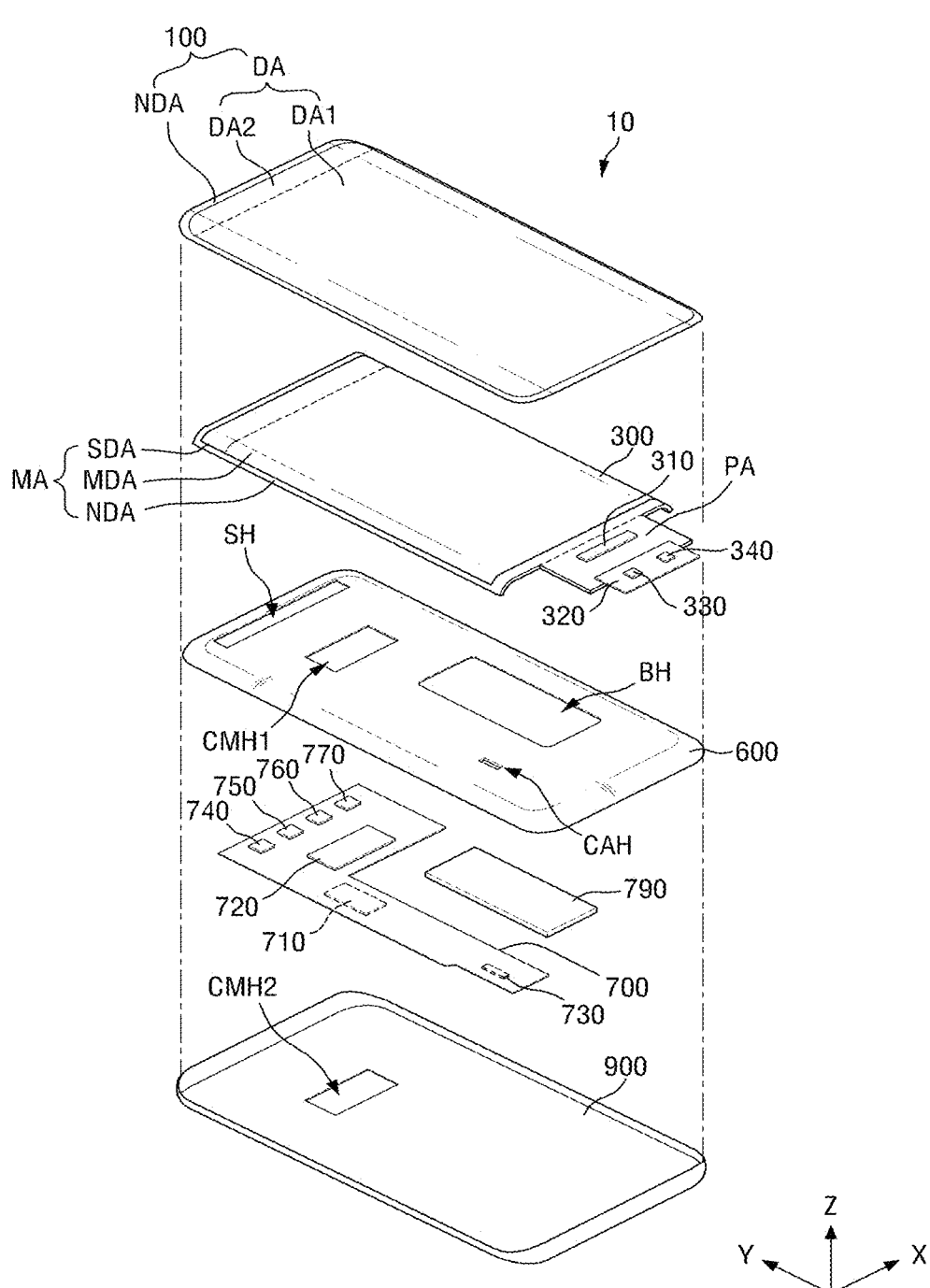
FIG. 2 is an exploded perspective view of the display device of FIG. 1.

FIG. 1 is a perspective view of a display device according to an example embodiment of the present disclosure. FIG. 2 is an exploded perspective view of the display device of FIG. 1.

Referring to FIGS. 1 and 2, a display device 10 includes a cover window 100, a display panel 300, a bracket 600, a main circuit board 700, and a lower cover 900.

Unless specified otherwise, the terms "above", "top", and "top surface", as used herein, refer to an upward direction from the display device 10, e.g., a Z-axis direction, and the terms "below", "bottom", and "bottom surface", as used herein, refer to a downward direction from the display device 10, e.g., the opposite direction of the Z-axis direction. Also, unless specified otherwise, the terms "left", "right", "upper", and "lower", as used herein, refer to their respective directions as viewed from above the display device 10, e.g., in a plan view. For example, the terms "left", "right", "upper", and "lower" refer to the opposite direction of an X-axis direction, the X-axis direction, a Y-axis direction, and the opposite direction of the Y-axis direction, respectively.

The display device 10, which is a device for displaying a moving or still image, may be used as the display screen of, for example, a portable electronic device such as a mobile phone, a smartphone, a tablet personal computer (PC), a smartwatch, a watchphone, a mobile communication terminal, an electronic notepad, an electronic book (e-book), a portable multimedia player (PMP), a navigation device, an ultra-mobile PC (UMPC), and also as the display screen of various other products such as, for example, a television (TV), a laptop computer, a monitor, a billboard, or an Internet-of-Things (IoT) device.

The display device 10 may have a rectangular shape in a plan view. For example, as illustrated in FIGS. 1 and 2, the display device 10 may have a rectangular shape with a pair of short sides extending in a first direction (or the X-axis direction) and a pair of long sides extending in a second direction (or the Y-axis direction) in a plan view. The corners at which the short sides and the long sides of the display device 10 meet may be rounded with a predetermined curvature or may be substantially right-angled. The planar shape of the display device 10 is not particularly limited. For example, in example embodiments, the display device 10 may be formed in various shapes other than a rectangular shape, such as, for example, another polygonal shape, a circular shape, or an elliptical shape.

The display device 10 may include a first region DR1, which is substantially flat, and second regions DR2, which extend from the left and right sides of the first region DR1 toward the long sides of the display device 10, respectively. The second regions DR2 may be formed to be substantially flat or curved. In a case in which the second regions DR2 are formed to be substantially flat, the first region DR1 may form an obtuse angle with the second regions DR2. In a case in which the second regions DR2 are formed to be curved, the second regions DR2 may have a uniform curvature or a variable curvature.

FIG. 1 illustrates that the second regions DR2 extend from the left and right sides of the first region DR1, but the present disclosure is not limited thereto. Alternatively, in an example embodiment, the second regions DR2 may extend from only one of the left and right sides of the first region DR1. Alternatively, in an example embodiment, the second regions DR2 may extend not only from the left and right sides, but also from one of the upper and lower sides, of the first region DR1. The second regions DR2 will hereinafter be described as being disposed on the left and right sides of the display device 10.

The cover window 100 may be disposed on the display panel 300 and may cover the top surface of the display panel 300. The cover window 100 may protect the top surface of the display panel 300.

The cover window 100 may be disposed in the first region DR1 and in the second regions DR2. The cover window 100 may include a display part DA, which corresponds to the display panel 300, and a light-blocking part NDA, which corresponds to the rest of the display device 10. The display part DA may include first and second display parts DA1 and DA2. The second display part DA2 may be disposed on one side of the first display part DA1, for example, on the upper side of the first display part DA1, as illustrated in FIGS. 1 and 2. The first and second display parts DA1 and DA2 may be disposed in the first region DR1 and in the second regions DR2. The light-blocking part NDA may be opaque. Alternatively, the light-blocking part NDA may be formed as a decorative layer with a pattern that can be viewed when no image is displayed.

The display panel 300 may be disposed below the cover window 100. The display panel 300 may be disposed in the first region DR1 and in the second regions DR2. An image displayed by the display panel 300 may be viewed from the first region DR1 and the second regions DR2 through the cover window 100. Thus, the image displayed by the display panel 300 may be viewed from the top surface and the left and right edges of the display device 10 through the cover window 100.

The display panel 300 may be a light-emitting display panel including light-emitting elements. For example, the display panel 300 may be an organic light-emitting diode (OLED) display panel including OLEDs, a micro-light-emitting diode (micro-LED) display panel using micro-LEDs, a quantum-dot light-emitting diode (QLED) display panel using QLEDs, or an inorganic electroluminescent (EL) display panel using an inorganic semiconductor. For convenience of description, the display panel 300 will hereinafter be described as being an OLED display panel. However, the display panel 300 is not limited thereto.

The display panel 300 may include a main area MA and a protruding area PA, which protrudes from one side of the main area MA. For example, the protruding area PA may protrude from the lower side of the main area MA.

The main area MA may include a general area MDA, a sensor area SDA, and a non-display area NDA.

The general area MDA may overlap the first display part DA1 of the cover window 100. The sensor area SDA may overlap the second display part DA2 of the cover window 100. The sensor area SDA may be disposed on one side of the general area MDA, for example, on the upper side of the general area MDA, as illustrated in FIG. 2, but the present disclosure is not limited thereto. Alternatively, in an example embodiment, the sensor area SDA may be disposed near corners of the display panel 300 to be surrounded by the general area MDA. FIG. 2 illustrates that the display panel 300 includes one sensor area SDA, but the present disclosure is not limited thereto. Alternatively, in an example embodiment, the display panel 300 may include a plurality of sensor areas SDA.

Each of the general area MDA and the sensor area SDA may include a plurality of pixels, scan lines and data lines, which are connected to the pixels, and power supply lines.

The non-display area NDA may be defined as edges of the display panel 300. The non-display area NDA may include a scan driving unit (e.g., a scan driving circuit) for applying scan signals to the scan lines and link lines for connecting the data lines and a display driving unit 310 (e.g., a display driving circuit).

The protruding area PA may protrude from one side of the main area MA. FIG. 2 illustrates that the protruding area PA protrudes from the lower side of the general area MDA. The length of the protruding area PA may be smaller than the length than main area MA. For example, the length in the first direction (or the X-axis direction) of the protruding area PA may be smaller than the length in the first direction (or the X-axis direction) of the main area MA.

The protruding area PA may include a bending area and a pad area. The pad area may be disposed on one side of the bending area, and the main area MA may be disposed on the other side of the bending area. For example, the pad area may be disposed on the lower side of the bending area, and the main area MA may be disposed on the upper side of the bending area.

The display panel 300 may be flexible and may thus be foldable, bendable, or rollable. Thus, the display panel 300 can be bent in the bending area along a thickness direction (or the Z-axis direction).

The display panel 300 may include the display driving unit 310, a circuit board 320, a power supply unit 330 (e.g., a power supply circuit), and a touch driving unit 340 (e.g., a touch driving circuit).

The display driving unit 310 may output signals and voltages for driving the display panel 300. For example, the display driving unit 310 may provide data voltages to the data lines. Also, the display driving unit 310 may provide power supply voltages to the power supply lines and may provide scan control signals to the scan driving unit.

The circuit board 320 may be attached to pads via an anisotropic conductive film (ACF). Lead lines of the circuit board 320 may be electrically connected to the pads of the display panel 300. For example, the circuit board 320 may be a flexible film such as a flexible printed circuit board (FPCB), a printed circuit board (PCB), or a chip-on-film (COF).

The power supply unit 330 may be disposed on the circuit board 320 to provide driving voltages to the display driving unit 310 and the display panel 300. For example, the power supply unit 330 may generate a driving voltage and may supply the driving voltage to driving voltage lines, and the power supply unit 330 may generate a low-potential voltage and may provide the low-potential voltage to cathode electrodes of light-emitting elements of subpixels. For example, the driving voltage generated by the power supply unit 330 may be a high-potential voltage for driving OLEDs, and the low-potential voltage may be a low-potential voltage for driving the OLEDs.

The touch driving unit 340 may be disposed on the circuit board 320 to measure the capacitance of touch electrodes. For example, the touch driving unit 340 may determine the presence of touch input from a user and the location of the touch input based on variations in the capacitances of the touch electrodes. The touch input may refer to input made by the user's touching of the surface of the display device 10 with a finger or an object such as a pen. The touch driving unit 340 may determine the location of the touch input by differentiating touch electrodes where the touch input has occurred from touch electrodes where the touch input has not occurred.

The bracket 600 may be disposed below the display panel 300. The bracket 600 may be formed of, for example, plastic, a metal, or a combination thereof. For example, the bracket 600 may include a first camera hole CMH1 in which a first camera sensor 720 is inserted, a battery hole BH in which a battery 790 is disposed, a cable hole CAH through which a cable connected to the display driving unit 310 or the circuit board 320 passes, and a sensor hole SH in which sensor devices 740, 750, 760, and 770 are disposed. Alternatively, in an example embodiment, the bracket 600 does not include the sensor hole SH and does not overlap the sensor area SDA of the display panel 300.

The main circuit board 700 and the battery 790 may be disposed below the bracket 600. The main circuit board 700 may be a PCB or an FPCB.

The main circuit board 700 may include a main processor 710, the first camera sensor 720, a main connector 730, and the sensor devices 740, 750, 760, and 770. The first camera sensor 720 may be disposed on both the top and bottom surfaces of the main circuit board 700, the main processor 710 may be disposed on the top surface of the main circuit board 700, and the main connector 730 may be disposed on the bottom surface of the main circuit board 700. The sensor devices 740, 750, 760, and 770 may be disposed on the top surface of the main circuit board 700.

The main processor 710 may control all functions of the display device 10. For example, the main processor 710 may provide digital video data to the display driving unit 310 so that the display panel 300 may display an image. The main processor 710 may receive touch data from the touch driving unit 340, may determine the coordinates of touch input from the user, and may execute an application corresponding to an icon at the coordinates of the touch input.

The main processor 710 may control the display device 10 in accordance with sensor signals input thereto from the sensor devices 740, 750, 760, and 770. For example, the main processor 710 may determine whether an object is present in the proximity of the top surface of the display device 10 in accordance with a proximity sensor signal input thereto from a proximity sensor 740. In an example embodiment, in a call mode, if an object is present in the proximity of the top surface of the display device 10, the main processor 710 does not execute an application corresponding to an icon at the touch coordinates of touch input from the user.

The main processor 710 may determine the brightness of the top surface of the display device 10 based on an illumination sensor signal input thereto from an illumination sensor 750. The main processor 710 may adjust the luminance of an image displayed by the display panel 300 in accordance with the brightness of the top surface of the display device 10.

The main processor 710 may determine whether an iris image of the user matches a previously-stored iris image based on an iris sensor signal input thereto from an iris sensor 760. If the iris image of the user matches the previously-stored iris image, the main processor 710 may unlock the display device 10 and may display a home screen on the display panel 300.

The first camera sensor 720 may process a still or moving image obtained by an image sensor and may output the processed image to the main processor 710. For example, the first camera sensor 720 may be a complementary metal-oxide-semiconductor (CMOS) image sensor or a charge-coupled device (CCD) image sensor, but the present disclosure is not limited thereto. The first camera sensor 720 may be exposed at the bottom of the lower cover 900 by a second camera hole CMH2 and may capture an image of an object or the background below the display device 10.

A cable that passes through the cable hole CAH of the bracket 600 may be connected to the main connector 730. Accordingly, the main circuit board 700 may be electrically connected to the display driving unit 310 or the circuit board 320.

The sensor devices 740, 750, 760, and 770 may include the proximity sensor 740, the illumination sensor 750, the iris sensor 760, and a second camera sensor 770.

The proximity sensor 740 may determine whether an object is present in the proximity of the top surface of the display device 10. For example, the proximity sensor 740 may include a light source that outputs light and a light receiver that receives light reflected from an object. The proximity sensor 740 may determine the presence of an object in the proximity of the top surface of the display device 10 based on the amount of light reflected from the object. Since the proximity sensor 740 is disposed to overlap, in the thickness direction (or the Z-axis direction), the sensor hole SH, the sensor area SDA of the display panel 300, and the second display part DA2 of the cover window 100, the proximity sensor 740 may generate a proximity sensor signal based on whether an object is present in the proximity of the top surface of the display device 10 and may output the generated proximity sensor signal to the main processor 710.

The illumination sensor 750 may detect the brightness of the top surface of the display device 10. The illumination sensor 750 may include a resistor whose resistance varies depending on the brightness of light incident thereupon. The illumination sensor 750 may determine the brightness of the top surface of the display device 10 based on the resistance of the resistor. Since the illumination sensor 750 is disposed to overlap, in the thickness direction (or the Z-axis direction), the sensor hole SH, the sensor area SDA of the display panel 300, and the second display part DA2 of the cover window 100, the illumination sensor 750 may generate an illumination sensor signal based on the brightness of the top surface of the display device 10 and may output the generated illumination sensor signal to the main processor 710.

The iris sensor 760 may determine whether a captured iris image of the user matches an iris image previously stored in a memory. The iris sensor 760 may generate an iris sensor signal based on whether the iris image of the user matches the iris image previously stored in the memory, and may output the generated iris sensor signal to the main processor 710.

The second camera sensor 770 may process image frames obtained by an image sensor, such as a still or moving image, and may output the processed image frames to the main processor 710. For example, the second camera sensor 770 may be a CMOS or CCD image sensor, but the present disclosure is not limited thereto. The pixel quantity of the second camera sensor 770 may be smaller than the pixel quantity of the first camera sensor 720, and the size of the second camera sensor 770 may also be smaller than the size of the first camera sensor 720. Since the second camera sensor 770 is disposed to overlap, in the thickness direction (or the Z-axis direction), the sensor hole SH, the sensor area SDA of the display panel 300, and the second display part DA2 of the cover window 100, the second camera sensor 770 may capture an image of an object or the background above the display device 10.

The types of the sensor devices 740, 750, 760, and 770 are not particularly limited, and the sensor devices 740, 750, 760, and 770 may further include, for example, a fingerprint scanner, a strobe, an optical sensor, a proximity sensor, an indicator, a solar panel, etc.

The battery 790 may be disposed not to overlap the main circuit board 700 in the third direction (or the Z-axis direction). The battery 790 may overlap the battery hole BH of the bracket 600.

The main circuit board 700 may further include a mobile communication module (e.g., a mobile communication circuit), which can transmit wireless signals to, or receive wireless signals from, at least one of, for example, a base station, an external terminal, and a server via a mobile communication network. The wireless signals may include, for example, audio signals, video call signals, and various types of data that can be transmitted with text/multimedia messages.

The lower cover 900 may be disposed below the main circuit board 700 and the battery 790. The lower cover 900 may be coupled and fixed to the bracket 600. The lower cover 900 may form the bottom exterior of the display device 10. The lower cover 900 may be formed of, for example, plastic, a metal, or a combination thereof.

The lower cover 900 may include the second camera hole CMH2, which exposes the bottom of the first camera sensor 720. The location of the first camera sensor 720 and the locations of the first and second camera holes CMH1 and CMH2, which correspond to the first camera sensor 720, are not limited to those illustrated in FIG. 2.

Figure 3:
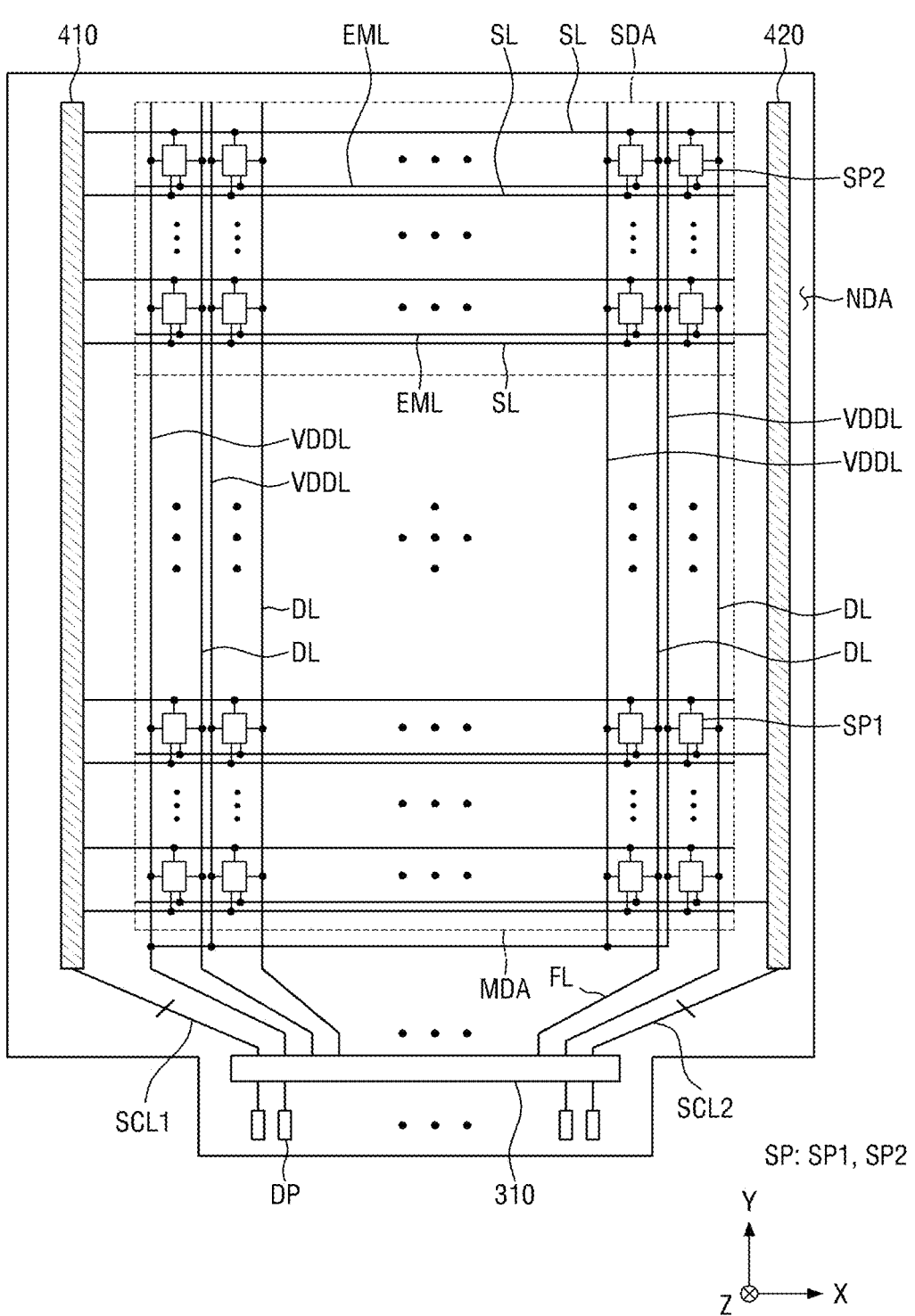
FIG. 3 is a plan view of a display panel according to an example embodiment of the present disclosure.
Figure 4:
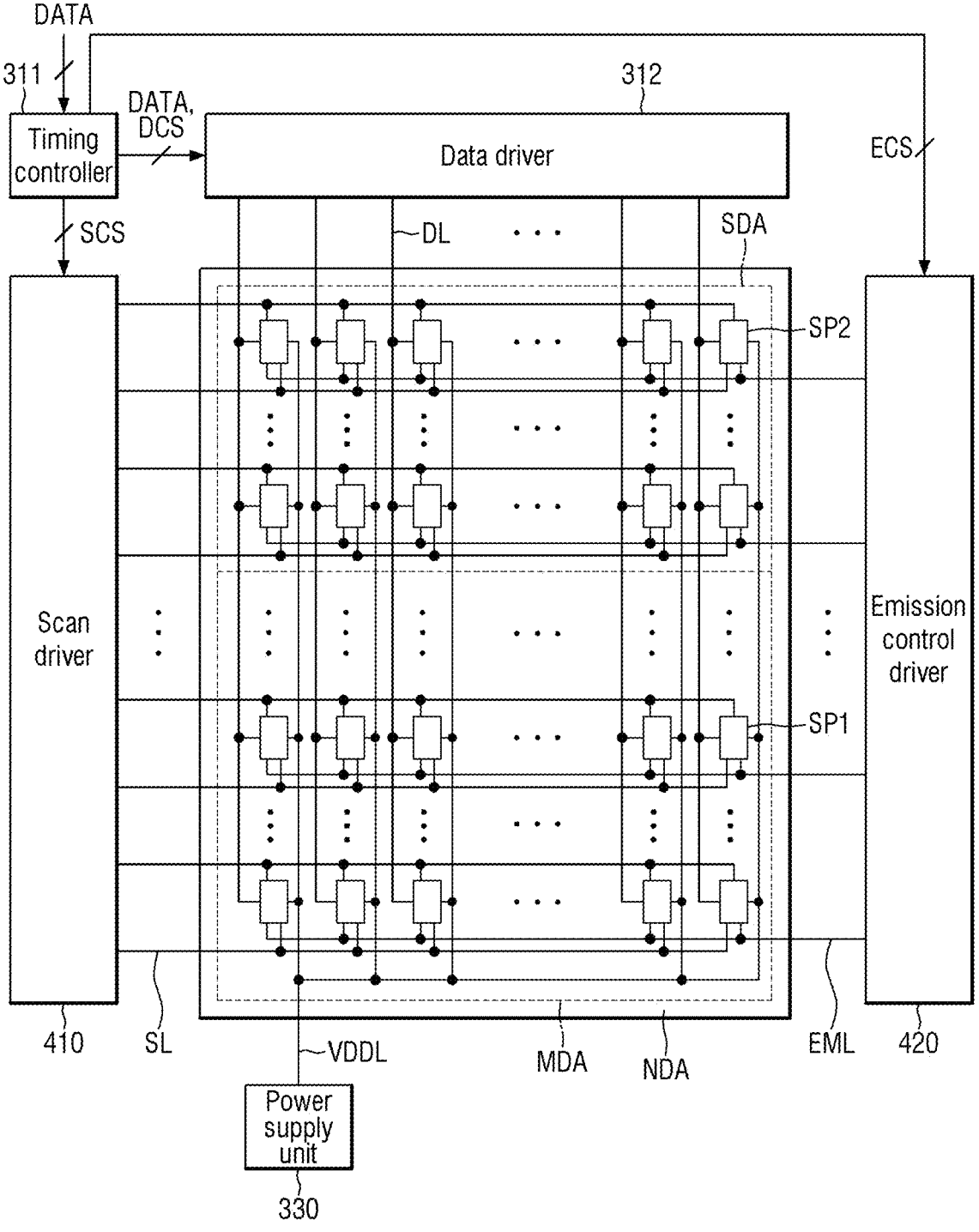
FIG. 4 is a block diagram illustrating the display panel of FIG. 3 and a display driving unit according to an example embodiment of the present disclosure.

FIG. 3 is a plan view of a display panel according to an example embodiment of the present disclosure. FIG. 4 is a block diagram illustrating the display panel of FIG. 3 and a display driving unit according to an example embodiment of the present disclosure.

Referring to FIGS. 3 and 4, a display panel 300 may include a general area MDA, a sensor area SDA, and a non-display area NDA.

The general area MDA may include first subpixels SP1 and driving voltage lines VDDL, scan lines SL, emission control lines EML, and data lines DL, which are connected to the first subpixels SP1.

Each of the first subpixels SP1 may be connected to at least one scan line SL, at least one data line DL, at least one emission control line EML, and at least one driving voltage line VDDL. FIGS. 3 and 4 illustrate that each of the first subpixels SP1 is connected to two scan lines SL, one data line DL, one emission control line EML, and one driving voltage line VDDL, but the present disclosure is not limited thereto. Alternatively, in an example embodiment, each of the first subpixels SP1 may be connected to three or more scan lines SL.

Each of the first subpixels SP1 may include a driving transistor, at least one switching transistor, a light-emitting element, and a capacitor.

The first subpixels SP1 may receive a driving voltage VDD via the driving voltage lines VDDL. The driving voltage VDDL may be a high-potential voltage for driving the light-emitting elements of the first subpixels SP1.

The scan lines SL and the emission control lines EML may extend in the first direction (or the X-axis direction) and may be spaced apart in the second direction (or the Y-axis direction), which crosses the first direction (or the X-axis direction).

The data lines DL and the driving voltage lines VDDL may extend in the second direction (or the Y-axis direction) and may be spaced apart in the first direction (or the X-axis direction).

The sensor area SDA may include second subpixels SP2 and driving voltage lines VDDL, scan lines SL, emission control lines EML, and data lines DL, which are connected to the second subpixels SP2.

Each of the second subpixels SP2 may be connected to at least one scan line SL, at least one data line DL, at least one emission control line ELM, and at least one driving voltage line VDDL. FIGS. 3 and 4 illustrate that each of the second subpixels SP2 is connected two scan lines SL, one data line DL, one emission control line EML, and one driving voltage line VDDL, but the present disclosure is not limited thereto. Alternatively, in an example embodiment, each of the second subpixels SP2 may be connected to three or more scan lines SL.

Each of the second subpixels SP2 may include a driving transistor, at least one switching transistor, a light-emitting element, and a capacitor.

The second subpixels SP2 may receive a driving voltage VDD via the driving voltage lines VDDL connected thereto. The driving voltage VDD received by the second subpixels SP2 may be a high-potential voltage for driving the light-emitting elements of the second subpixels SP2.

For example, the number of first subpixels SP1 per unit area of the general area MDA may be greater than the number of second subpixels SP2 per unit area of the sensor area SDA. The first subpixels SP1 may be densely provided in the general area MDA, which is an area for the main function of the display device 10, e.g., for the display of an image. The sensor area SDA may include a pixel area in which the second subpixels SP2 are disposed, and a light-transmitting area which transmits light therethrough. Thus, as the size of the light-transmitting area of the sensor area SDA increases, the number of second subpixels SP2 per unit area may become much smaller than the number of first subpixels SP1 per unit area.

The non-display area NDA may be defined as the entire display panel 300 except for the general area MDA and the sensor area SDA. The non-display area NDA may include a scan driver 410 (e.g., a scan driver circuit) which applies scan signals to scan lines SL, fan-out lines FL which connect data lines DL and a display driving unit 310, and pads DP which are connected to a circuit board 320. The display driving unit 310 and the pads DP may be disposed in a pad area of the display panel 300. The pads DP may be disposed closer than the display driving unit 310 to one side of the pad area.

Referring to FIG. 4, the display driving unit 310 may include a timing controller 311 (e.g., a timing controller circuit) and a data driver 312 (e.g., a data driver circuit).

The timing controller 311 may receive digital video data DATA and timing signals from the circuit board 320. The timing controller 311 may generate scan control signals SCS based on the timing signals to control the operation timing of the scan driver 410, may generate emission control signals ECS to control the operation timing of an emission control driver 420, and may generate data control signals DCS to control the operation timing of the data driver 312. The timing controller 311 may output the scan control signals SCS to the scan driver 410 via a first scan control line SCL1 (see FIG. 3). The timing controller 311 may output the emission control signals ECS to the emission control driver 420 via a second scan control line SCL2 (see FIG. 3). The first and second scan control lines SCL1 and SCL2 are illustrated as being single wires, but the present disclosure is not limited thereto. Alternatively, in an example embodiment, each of the first and second scan control lines SCL1 and SCL2 may include a plurality of wires that provides different signals.

The timing controller 311 may output the digital video data DATA and the data control signals DCS to the data driver 312.

The data driver 312 may convert the digital video data DATA into analog data voltages and may output the analog data voltages to the data lines DL via the fan-out lines FL. Scan signals from the scan driver 410 may select subpixels to which to provide data voltages, and the selected subpixels may receive the data voltages via their respective data lines DL.

Referring back to FIG. 3, the scan driver 410 may be disposed on one side of the non-display area NDA, outside the general area MDA and the sensor area SDA. The emission control driver 420 may be disposed on the other side of the non-display area NDA, outside the genera area MDA and the sensor area SDA. Alternatively, the scan driver 410 and the emission control driver 420 may both be disposed on the same side of the non-display area NDA, outside the general area MDA and the sensor area SDA.

The scan driver 410 may include a plurality of thin-film transistors (TFTs) for generating scan signals based on the scan control signals SCS, and the emission control driver 420 may include a plurality of TFTs for generating emission signals based on the emission control signals ECS. For example, the TFTs of the scan driver 410 and the TFTs of the emission control driver 420 may be formed in the same layer as TFTs of subpixels (SP1 and SP2).

Figure 5:
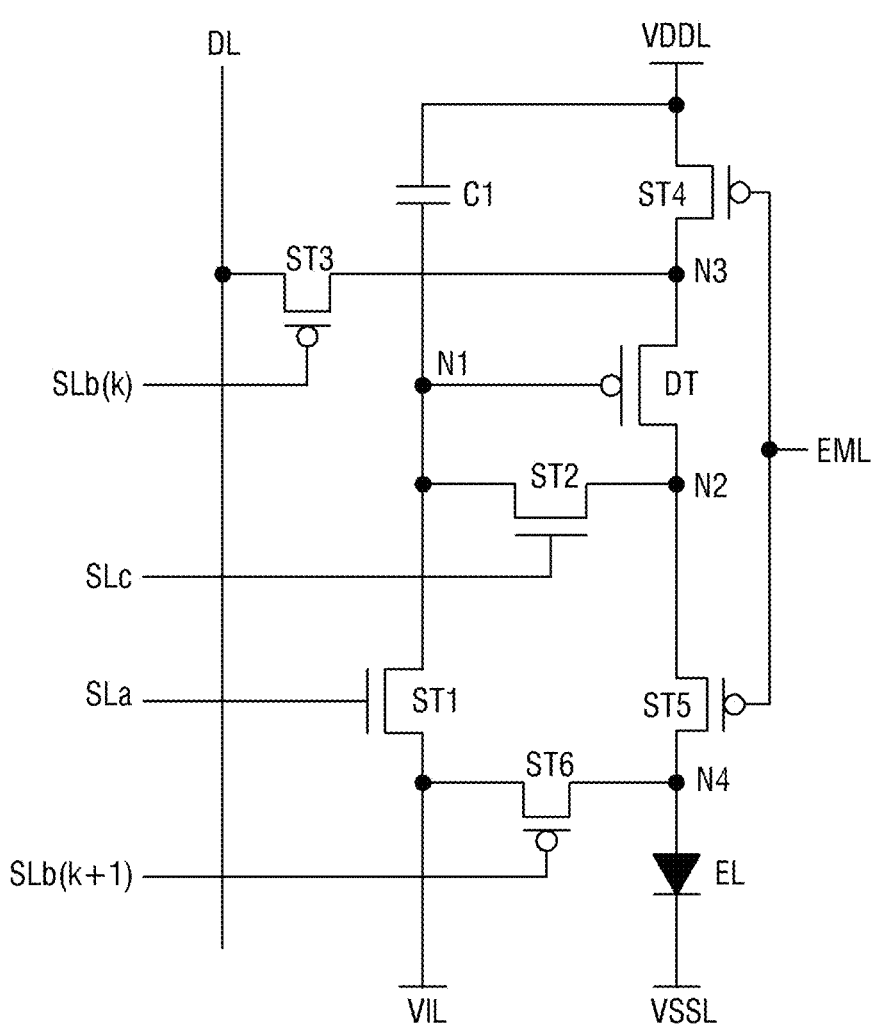
FIG. 5 is a circuit diagram of a subpixel according to an example embodiment of the present disclosure.
Figure 6:
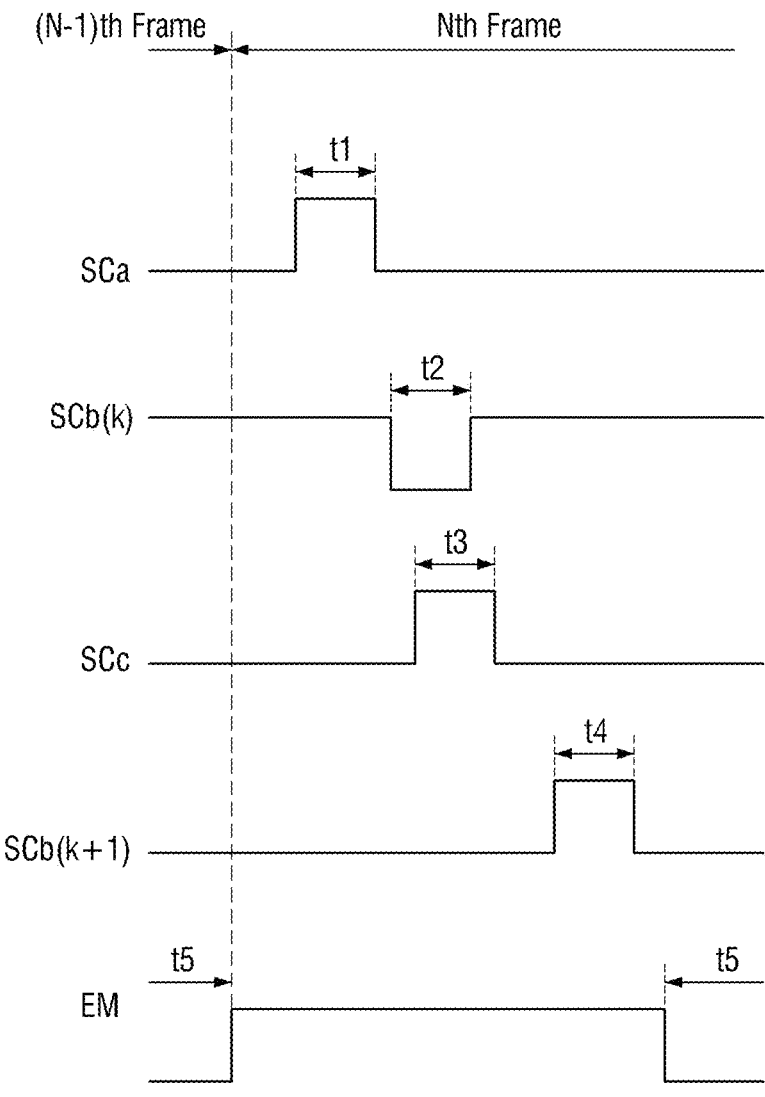
FIG. 6 is a waveform diagram illustrating signals provided to the subpixel of FIG. 5.

FIG. 5 is a circuit diagram of a subpixel according to an example embodiment of the present disclosure. FIG. 6 is a waveform diagram illustrating signals provided to the subpixel of FIG. 5. A subpixel SP of FIG. 5 may correspond to the first subpixels SP1 or the second subpixels SP2 of FIGS. 3 and 4.

Referring to FIGS. 5 and 6, the display panel 300 may include a plurality of subpixels SP, which are arranged in k rows (where k is a natural number) and j columns (where j is a natural number). For example, the general area MDA of the display panel 300 may include first subpixels SP1, and the sensor area SDA of the display panel 300 may include second subpixels SP2. Each of first or second subpixels SP1 or SP2 in a k-th row may be connected to a first scan line SLa, second scan lines SLb(k) and SLb(k+1), a third scan line SLc, an emission control line EML, a data line DL, a driving voltage line VDDL, and an initialization voltage line VIL.

Each of the first subpixels SP1 and the second subpixels SP2 may include a driving transistor DT, a light-emitting element EL, a plurality of switching elements, and a first capacitor C1. The switching elements may include first through sixth transistors ST1 through ST6.

The driving transistor DT may include a gate electrode, a source electrode, and a drain electrode. The gate electrode of the driving transistor DT may be connected to a first node N1, the drain electrode of the driving transistor DT may be connected to a second node N2, and the source electrode of the driving transistor DT may be connected to a third node N3. The driving transistor DT may control a source-drain current or a driving current Isd in accordance with a data voltage Vdata applied to the gate electrode of the driving transistor DT. The driving current Isd, which flows through the channel of the driving transistor DT, may be proportional to the square of the difference between a threshold voltage Vth and a source-gate voltage Vsg, which is the voltage between the source and gate electrodes of the driving transistor DT. For example, $Isd=k'\times(Vsg-Vth)^2$ where k' is a proportionality coefficient determined by the structure and physical characteristics of the driving transistor DT, Vsg is the source-gate voltage of the driving transistor DT, and Vth is the threshold voltage of the driving transistor DT.

The light-emitting element EL may receive the driving current Isd and may thus emit light. For example, the driving current Isd controlled by the driving transistor DT may be provided to the light-emitting element EL. The amount of light emitted by the light-emitting element EL or the luminance of the light-emitting element EL may be proportional to the magnitude of the driving current Isd.

The light-emitting element EL may be an OLED including an anode electrode, a cathode electrode, and an organic light-emitting layer, which is disposed between the anode electrode and the cathode electrode. Alternatively, in an example embodiment, the light-emitting element EL may be an inorganic EL element including an anode electrode, a cathode electrode, and an inorganic semiconductor, which is disposed between the anode electrode and the cathode electrode. Alternatively, in an example embodiment, the light-emitting element EL may be a QLED including an anode electrode, a cathode electrode, and a quantum-dot light-emitting layer, which is disposed between the anode electrode and the cathode electrode. Alternatively, in an example embodiment, the light-emitting element EL may be a micro-LED.

The anode electrode of the light-emitting element EL may be connected to a fourth node N4. The anode electrode of the light-emitting element EL may be connected to the drain electrodes of the fifth and sixth transistors ST5 and ST6 via the fourth node N4. The cathode electrode of the light-emitting element EL may be connected to a low-potential line VSSL. Parasitic capacitance may be formed between the anode electrode and the cathode electrode of the light-emitting element EL.

The first transistor ST1 may be turned on by a first scan signal SCa from the first scan line SLa to connect the initialization voltage line VIL and the first node N1, which is the gate electrode of the driving transistor DT. As the first transistor ST1 is turned on by the first scan signal SCa, the first transistor ST1 may discharge the gate electrode of the driving transistor DT to an initialization voltage VI. Thus, the first transistor ST1 may selectively provide the initialization voltage VI to the first node N1, and thus, to the gate electrode of the driving transistor DT. The gate electrode of the first transistor ST1 may be connected to the first scan line SLa, the drain electrode of the first transistor ST1 may be connected to the initialization voltage line VIL, and the source electrode of the first transistor ST1 may be connected to the first node N1. The source electrode of the first transistor ST1 may be connected to the gate electrode of the driving transistor DT, the source electrode of the second transistor ST2, and the first electrode of the first capacitor C1 via the first node N1.

The second transistor ST2 may be turned on by a third scan signal SCc from the third scan line SLc to connect the second node N2, which is the drain electrode of the driving transistor DT, and the first node N1, which is the gate electrode of the driving transistor DT. Thus, the second transistor ST2 may selectively connect the first node N1, which is the gate electrode of the driving transistor DT, and the second node N2, which is the drain electrode of the driving transistor DT. The gate electrode of the second transistor ST2 may be connected to the third scan line SLc, the drain electrode of the second transistor ST2 may be connected to the second node N2, and the source electrode of the second transistor ST2 may be connected to the first node N1. The drain electrode of the second transistor ST2 may be connected to the drain electrode of the driving transistor DT and the source electrode of the fifth transistor ST5 via the second node N2. The source electrode of the second transistor ST2 may be connected to the gate electrode of the driving transistor DT, the source electrode of the first transistor ST1, and the first electrode of the first capacitor C1 via the first node N1.

The third transistor ST3 may be turned on by a second scan signal SCb(k) from the second scan line SLb(k) to connect the data line DL and the third node N3, which is the source electrode of the driving transistor DT. The second scan line SLb(k) may be connected to subpixels SP in the k-th row. The third transistor ST3 may be turned on by the second scan signal SCb(k) to provide the data voltage Vdata to the third node N3. That is, the third transistor ST3 may selectively provide the data voltage Vdata to the third node N3, which is the source electrode of the driving transistor DT. The gate electrode of the third transistor ST3 may be connected to the second scan line SLb(k), the source electrode of the third transistor ST3 may be connected to the data line DL, and the drain electrode of the third transistor ST3 may be connected to the third node N3. The drain electrode of the third transistor ST3 may be connected to the source electrode of the driving transistor DT and the drain electrode of the fourth transistor ST4 via the third node N3.

The fourth transistor ST4 may be turned on by an emission signal EM from the emission control line EML to connect the driving voltage line VDDL and the third node N3, which is the source electrode of the driving transistor DT. That is, the fourth transistor ST4 may selectively connect the driving voltage line VDDL and the third node N3. The gate electrode of the fourth transistor ST4 may be connected to the emission control line EML, the source electrode of the fourth transistor ST4 may be connected to the driving voltage line VDDL, and the drain electrode of the fourth transistor ST4 may be connected to the third node N3. The drain electrode of the fourth transistor ST4 may be connected to the source electrode of the driving transistor DT and the drain electrode of the third transistor ST3 via the third node N3.

The fifth transistor ST5 may be turned on by the emission signal EM from the emission control line EML to connect the second node N2, which is the drain electrode of the driving transistor DT, and the fourth node N4, which is the anode electrode of the light-emitting element EL. That is, the fifth transistor ST5 may selectively connect the second node N2, which is the drain electrode of the driving transistor DT, and the fourth node N4, which is the anode electrode of the light-emitting element EL. The gate electrode of the fifth transistor ST5 may be connected to the emission control line EML, the source electrode of the fifth transistor ST5 may be connected to the second node N2, and the drain electrode of the fifth transistor ST5 may be connected to the fourth node N4. The source electrode of the fifth transistor ST5 may be connected to the drain electrode of the driving transistor DT and the drain electrode of the second transistor ST2 via the second node N2. The drain electrode of the fifth transistor ST5 may be connected to the anode electrode of the light-emitting element EL and the drain electrode of the sixth transistor ST6 via the fourth node N4.

When the fourth transistor ST4, the driving transistor DT, and the fifth transistor ST5 are all turned on, the driving current Isd may be supplied to the light-emitting element EL.

The sixth transistor ST6 may be turned on by a second scan signal SCb(k+1) from the second scan line SLb(k+1) to connect the initialization voltage line VIL and the fourth node N4, which is the anode electrode of the light-emitting element EL. The second scan line SLb(k+1) may be connected to subpixels SP in a (k+1)-th row of the display panel 300. The sixth transistor ST6 may be turned on by the second scan signal SCb(k+1) to discharge the anode electrode of the light-emitting element EL to the initialization voltage VI. Thus, the sixth transistor ST6 may selectively provide the initialization voltage VI to the fourth node N4. The gate electrode of the sixth transistor ST6 may be connected to the second scan line SLb(k+1), the source electrode of the sixth transistor ST6 may be connected to the initialization voltage line VIL, and the drain electrode of the sixth transistor ST6 may be connected to the fourth node N4. The drain electrode of the sixth transistor ST6 may be connected to the anode electrode of the light-emitting element EL and the drain electrode of the sixth transistor ST5 via the fourth node N4.

Each of the driving transistor DT and the third through sixth transistors ST3 through ST6 may include a silicon-based active layer. For example, each of the driving transistor DT and the third through sixth transistors ST3 through ST6 may include an active layer formed of low-temperature polycrystalline silicon (LTPS). The active layer formed of LTPS may have high electron mobility and excellent turn-on characteristics. Thus, since the display device 10 includes the driving transistor DT and the third through sixth transistors ST3 through ST6 that all have excellent turn-on characteristics, the display device 10 can drive the subpixels SP stably and efficiently.

The driving transistor DT and the third through sixth transistors ST3 through ST6 may be p-type transistors. For example, the driving transistor DT and the third through sixth transistors ST3 through ST6 may output a current input to their source electrodes to their drain electrodes based on a gate-low voltage applied to their gate electrodes.

Each of the first and second transistors ST1 and ST2 may include an oxide-based active layer. For example, each of the first and second transistors ST1 and ST2 may have a coplanar structure in which a gate electrode is disposed above an oxide-based active layer. Transistors having the coplanar structure have excellent off-current characteristics, can be driven at a low frequency, and can reduce the consumption of power. Thus, since the display device 10 includes the first and second transistors ST1 and ST2 that have excellent off-current characteristics, the display device 10 can prevent the flow of an off-current in the subpixels SP and can stably maintain the voltage in the subpixels SP.

The first and second transistors ST1 and ST2 may be n-type transistors. For example, the first and second transistors ST1 and ST2 may output a current input to their drain electrodes to their source electrodes based on a gate-high voltage applied to their gate electrodes.

The first capacitor C1 may be connected between the first node N1, which is the gate electrode of the driving transistor DT, and the driving voltage line VDDL. For example, the first electrode of the first capacitor C1 may be connected to the first node N1, and the second electrode of the first capacitor C1 may be connected to the driving voltage line VDDL. Accordingly, the potential difference between the driving voltage line VDDL and the gate electrode of the driving transistor DT can be maintained.

In an example embodiment, the gate electrode of the driving transistor DT, the source electrode of the first transistor ST1, the source electrode of the second transistor ST2, and the first electrode of the first capacitor C1 are connected to one another via the first node N1. Each of these electrodes connected to the first node N1 may be overlapped by a light-blocking layer, as described further below.

Referring to FIG. 6, and further to FIG. 5, the display device 10 can be driven over first through fifth periods t1 through t5 of a frame.

The first transistor ST1 may receive a high-level first scan signal SCa during a first period t1 of an N-th frame (where N is a natural number of 2 or greater). Then, the first transistor ST1 may be turned on by the high-level first scan signal SCa and may provide the initialization voltage VI to the first node N1, which is the gate electrode of the driving transistor DT. Thus, the first transistor ST1 may initialize the gate electrode of the driving transistor DT during the first period t1 of the N-th frame.

The third transistor ST3 may receive a low-level second scan signal SCb(k) during a second period t2 of the N-th frame. Then, the third transistor ST3 may be turned on by the low-level second scan signal SCb(k) and may provide the data voltage Vdata to the third node N3, which is the source electrode of the driving transistor DT.

The second transistor ST2 may receive a high-level third scan signal SCc during a third period t3 of the N-th frame. Then, the second transistor ST2 may be turned on by the high-level third scan signal SCc and may connect the first and second nodes N1 and N2.

In a case in which the source electrode of the driving transistor DT receives the data voltage Vdata, the source-gate voltage Vsg of the driving transistor DT may correspond to the difference (e.g., Vdata−VI) between the data voltage Vdata and the initialization voltage VI, and the driving transistor DT may be turned on because the source-gate electrode Vsg is greater than the threshold voltage Vth (e.g., VI≥Vth). Thus, when the driving transistor DT is turned on, the source-drain current Isd of the driving transistor DT may be determined by the data voltage Vdata, the initialization voltage VI, and the threshold voltage Vth of the driving transistor DT, as indicated by the following equation: $Isd=k' *(Vdata-VI-Vth)^2$. The driving transistor DT may continue to supply the source-drain current Isd to the second node N2 until the source-gate voltage Vsg reaches the threshold voltage Vth of the driving transistor DT. The second transistor ST2 may be turned on during a third period t3 of the N-th frame to provide the voltage of the second node N2 to the first node N1. In this manner, the voltage of the first node N1 and the source-drain current Isd of the driving transistor DT may be changed when the driving transistor DT is being turned on, and the voltage of the first node N1 may eventually converge to the difference between the data voltage Vdata and the threshold voltage Vth of the driving transistor DT, e.g., Vdata-Vth.

The sixth transistor ST6 may receive a high-level second scan signal SCb(k+1) during a fourth period t4 of the N-th frame. Then, the sixth transistor ST6 may be turned on by the high-level second scan signal SCb(k+1) and may provide the initialization voltage to the fourth node N4, which is the anode electrode of the light-emitting element EL. Thus, the sixth transistor ST6 may initialize the anode electrode of the light-emitting element EL during the fourth period t4 of the N-th frame.

The emission signal EM may have a gate-low voltage during a fifth period t5 of the N-th frame. When the emission signal EM has a low level, the fourth and fifth transistors ST4 and ST5 may be turned on to supply the driving current Isd to the light-emitting element.

Figure 7:
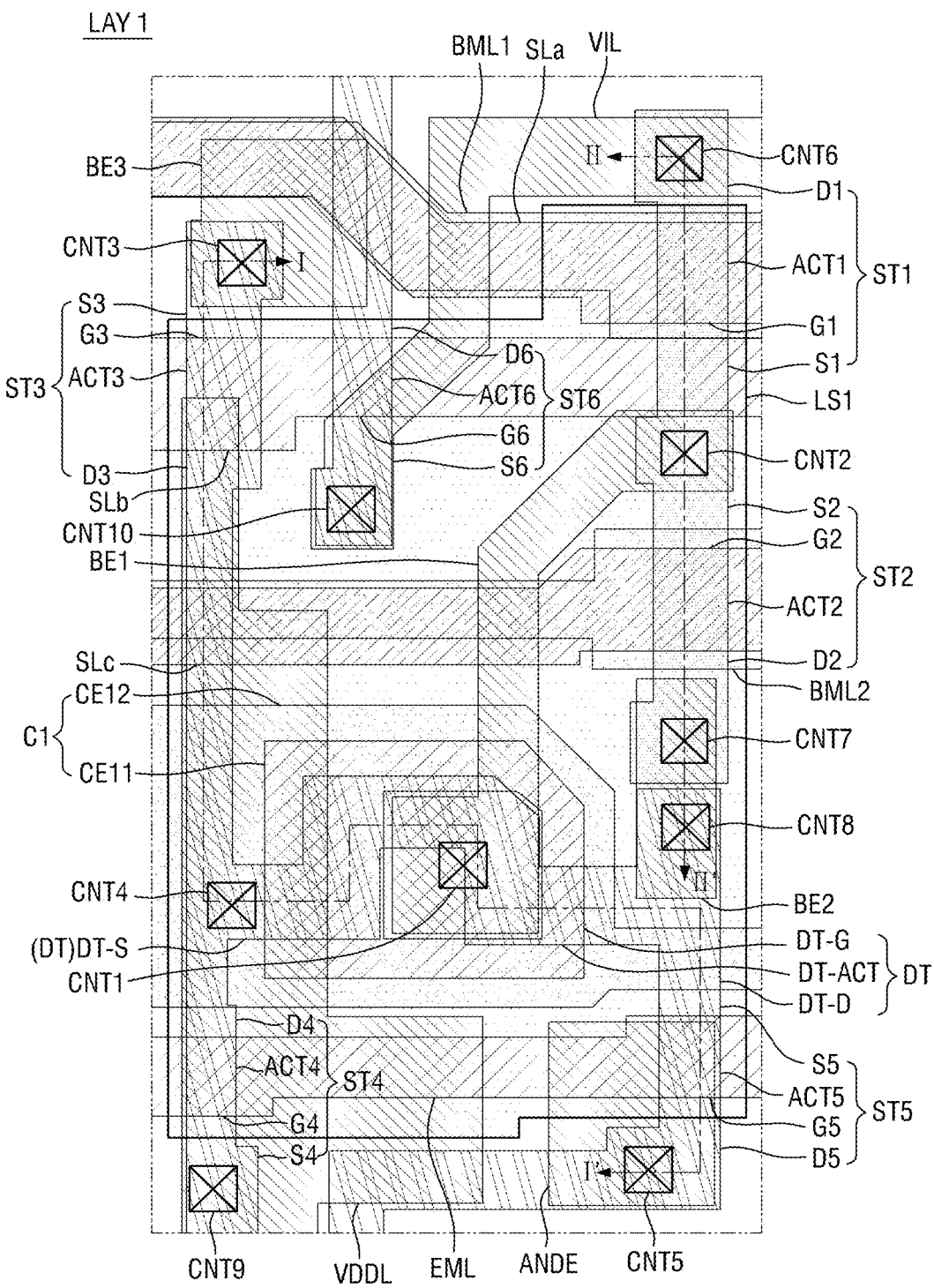
FIG. 7 is a plan view of an example of the subpixel of FIG. 5.
Figure 8:
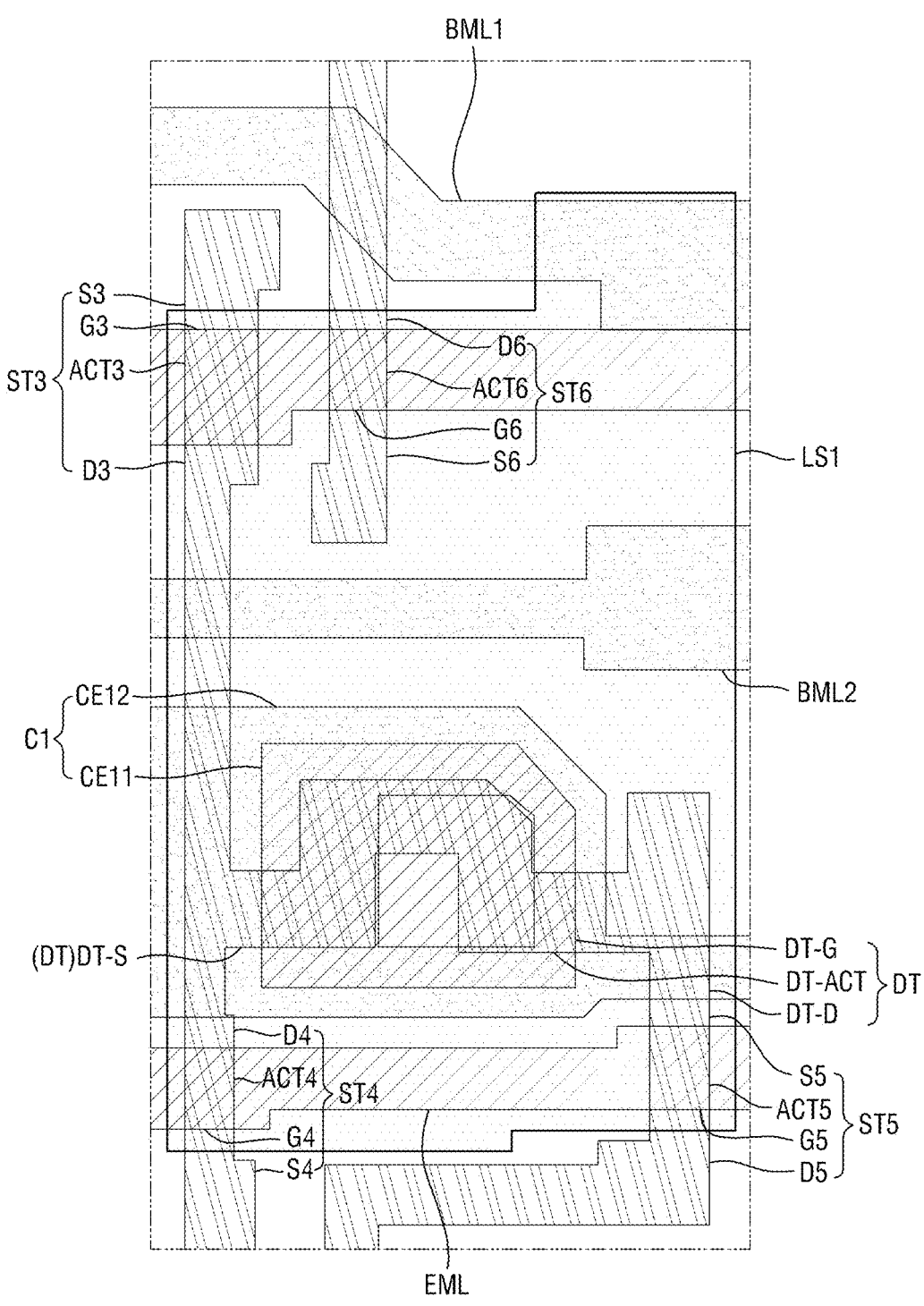
FIG. 8 is a plan view illustrating some layers of the subpixel of FIG. 7.
Figure 9:
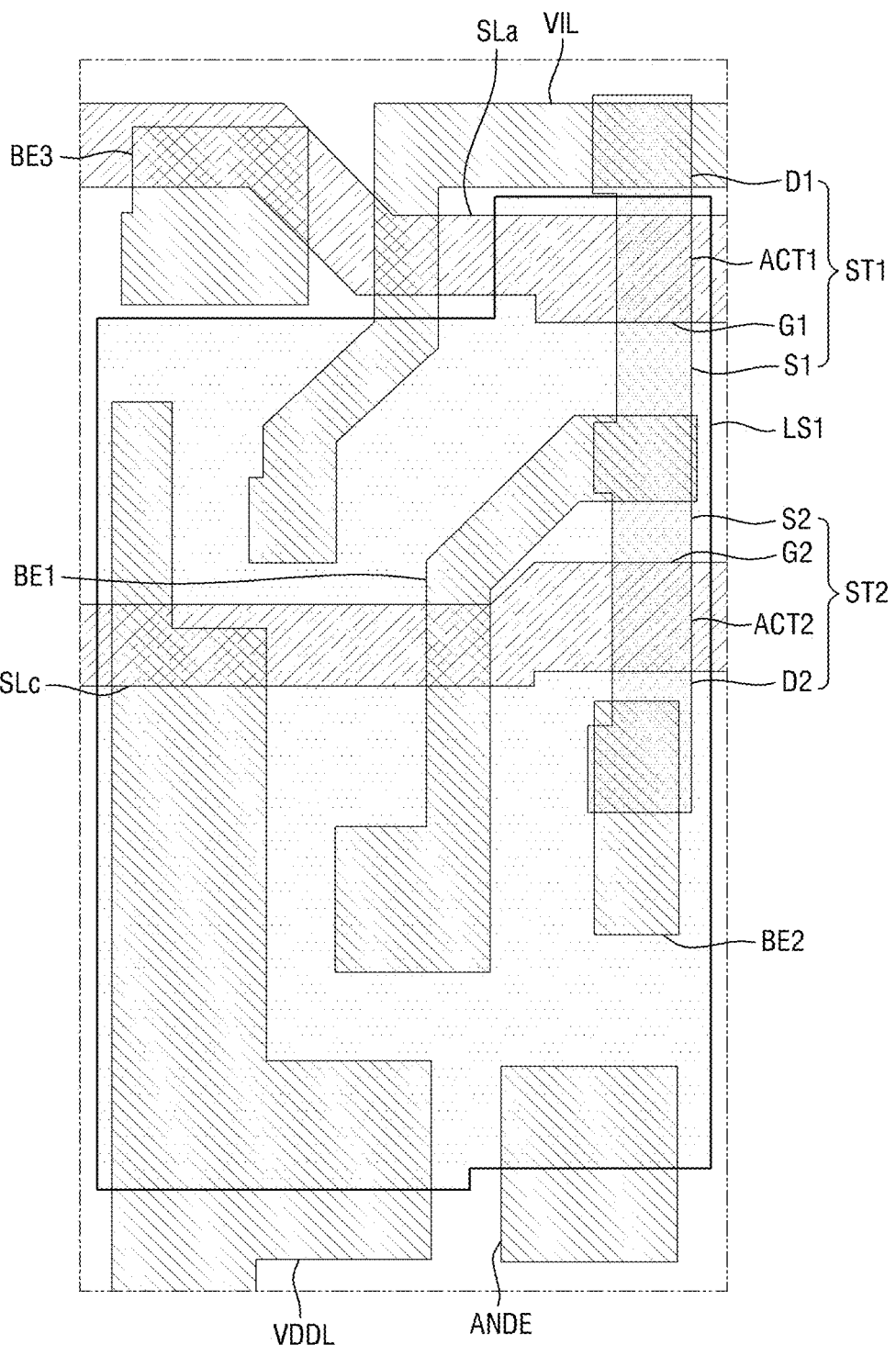
FIG. 9 is a plan view illustrating other layers of the subpixel of FIG. 7.

FIG. 7 is a plan view of an example of the subpixel of FIG. 5. Thus, FIG. 7 is a plan view of the first subpixel SP1 or the second subpixel SP2 of FIG. 5 according to example embodiments. FIG. 8 is a plan view illustrating some layers of the subpixel of FIG. 7. FIG. 9 is a plan view illustrating other layers of the subpixel of FIG. 7. For example, FIG. 7 illustrates a subpixel in which a first light-blocking layer, a first active layer, a first gate layer, a second gate layer, a second active layer, a third gate layer, and a source-drain layer are sequentially stacked, FIG. 8 illustrates the first light-blocking layer, the first active layer, the first gate layer, and the second gate layer that are sequentially stacked, and FIG. 9 illustrates only the first light-blocking layer, the second active layer, the third gate layer, and the source-drain layer that are sequentially stacked. The order in which the layers of FIGS. 7 through 9 are stacked will be described later with reference to FIGS. 10 and 11.

Referring to FIGS. 7 through 9, each of the first subpixels SP1 in the general area MDA and the second subpixels SP2 in the sensor area SDA may be realized as a first layout "LAY 1". Each of the first subpixels SP1 in the general area MDA and the second subpixels SP2 in the sensor area SDA may include a driving transistor DT, a light-emitting element EL, first through sixth transistors ST1 through ST6, and a first capacitor C1.

The driving transistor DT may include an active area DT-ACT, a gate electrode DT-G, a source electrode DT-S, and a drain electrode DT-D. The active area DT-ACT of the driving transistor DT may be disposed in a first active layer and may overlap the gate electrode DT-G of the driving transistor DT. For example, the first active layer may be formed of LTPS.

The gate electrode DT-G of the driving transistor DT may be connected to a first connecting electrode BE1 via a first contact hole CNT1, and the first connecting electrode BE1 may be connected to a second active layer via a second contact hole CNT2. For example, the second active layer may be formed of an oxide-based material. The first connecting electrode BE1 may be connected to a source electrode S1 of the first transistor ST1 and a source electrode S2 of the second transistor ST2. The overlapping area of the gate electrode DT-G of the driving transistor DT and a second gate layer may correspond to a first electrode CE11 of the first capacitor C1.

The source electrode DT-S of the driving transistor DT may be connected to drain electrodes D3 and D4 of the third and fourth transistors ST3 and ST4.

The drain electrode DT-D of the driving transistor DT may be connected to a second connecting electrode BE2 via an eighth contact hole CNT8, and the second connecting electrode BE2 may be connected to a drain electrode D2 of the second transistor ST2 via a seventh contact hole CNT7. The drain electrode DT-D of the driving transistor DT may also be connected to a source electrode S5 of the fifth transistor ST5.

The first transistor ST1 may include an active area ACT1, a gate electrode G1, a drain electrode D1, and the source electrode S1. The active area ACT1 of the first transistor ST1 may overlap the gate electrode G1 of the first transistor ST1. For example, the active area ACT1 of the first transistor ST1 may include an oxide-based active layer. The gate electrode G1 of the first transistor ST1, which is part of a first scan line SLa, may correspond to the overlapping area of the first scan line SLa and the active area ACT1.

The drain electrode D1 of the first transistor ST1 may be connected to an initialization voltage line VIL via a sixth contact hole CNT6 to receive an initialization voltage VI.

The source electrode S1 of the first transistor ST1 may be connected to the source electrode S2 of the second transistor ST2. The source electrode S1 of the first transistor ST1 may also be connected to the first connecting electrode BE1 via the second contact hole CNT2, and the first connecting electrode BE1 may be connected to the gate electrode DT-G of the driving transistor DT or the first electrode CE11 of the first capacitor C1 via the first contact hole CNT1.

The second transistor ST2 may include an active area ACT2, a gate electrode G2, the source electrode S2, and the drain electrode D2. The active area ACT2 of the second transistor ST2 may overlap the gate electrode G2 of the second transistor ST2. For example, the active area ACT2 of the second transistor ST2 may include an oxide-based active layer. The gate electrode G2 of the second transistor ST2, which is part of a third scan line SLc, may correspond to the overlapping area of the third scan line SLc and the active area ACT2.

The drain electrode D2 of the second transistor ST2 may be connected to the second connecting electrode BE2 via the seventh contact hole CNT7, and the second connecting electrode BE2 may be connected to the drain electrode DT-D of the driving transistor DT and the source electrode S5 of the fifth transistor ST5 via the eighth contact hole CNT8.

The source electrode S2 of the second transistor ST2 may be connected to the source electrode S1 of the first transistor ST1. The source electrode S2 of the second transistor ST2 may also be connected to the first connecting electrode BE1 via the second contact hole CNT2, and the first connecting electrode BE1 may be connected to the gate electrode DT-G of the driving transistor DT or the first electrode CE11 of the first capacitor C1 via the first contact hole CNT1.

The third transistor ST3 may include an active area ACT3, a gate electrode G3, a source electrode S3, and the drain electrode D3. The active area ACT3 of the third transistor ST3 may overlap the gate electrode G3 of the third transistor ST3. For example, the active area ACT3 of the third transistor ST3 may be formed of LTPS. The gate electrode G3 of the third transistor ST3, which is part of a second scan line SLb, may correspond to the overlapping area of the second scan line SLb and the active area ACT3.

The source electrode S3 of the third transistor ST3 may be connected to a third connecting electrode BE3 via a third contact hole CNT3, and the third connecting electrode BE3 may be connected to a data line DL. Accordingly, the source electrode S3 of the third transistor ST3 may receive the data voltage Vdata from the data line DL.

The drain electrode D3 of the third transistor ST3 may be connected to the source electrode DT-S of the driving transistor DT and the drain electrode D4 of the fourth transistor ST4.

The fourth transistor ST4 may include an active area ACT4, a gate electrode G4, a source electrode S4, and the drain electrode D4. The active area ACT4 of the fourth transistor ST4 may overlap the gate electrode G4 of the fourth transistor ST4. For example, the active area ACT4 of the fourth transistor ST4 may be formed of LTPS. The gate electrode G4 of the fourth transistor ST4, which is part of an emission control line EML, may correspond to the overlapping area of the emission control line EML and the active area ACT4.

The source electrode S4 of the fourth transistor ST4 may be connected to a driving voltage line VDDL via a ninth contact hole CNT9. Accordingly, the source electrode S4 of the fourth transistor ST4 may receive a driving voltage VDD from the driving voltage line VDDL.

The drain electrode D4 of the fourth transistor ST4 may be connected to the source electrode DT-S of the driving transistor DT and the drain electrode D3 of the third transistor ST3.

The fifth transistor ST5 may include an active area ACT5, a gate electrode G5, the source electrode S5, and a drain electrode D5. The active area ACT5 of the fifth transistor ST5 may overlap the gate electrode G5 of the fifth transistor ST5. For example, the active area ACT5 of the fifth transistor ST5 may be formed of LTPS. The gate electrode G5 of the fifth transistor ST5, which is part of the emission control line EML, may correspond to the overlapping area of the emission control line EML and the active area ACT5.

The source electrode S5 of the fifth transistor ST5 may be connected to the drain electrode DT-D of the driving transistor DT. The source electrode S5 of the fifth transistor ST5 may also be connected to the second connecting electrode BE2 via the eighth contact hole CNT8, and the second connecting electrode BE2 may be connected to the drain electrode D2 of the second transistor ST2 via the seventh contact hole CNT7.

The drain electrode D5 of the fifth transistor ST5 may be connected to an anode connecting electrode ANDE via a fifth contact hole CNT5. The anode connecting electrode ANDE may be connected to the anode electrode of the light-emitting element EL.

The sixth transistor ST6 may include an active area ACT6, a gate electrode G6, a source electrode S6, and a drain electrode D6. The active area ACT6 of the sixth transistor ST6 may overlap the gate electrode G6 of the sixth transistor ST6. For example, the active area ACT6 of the sixth transistor ST6 may be formed of LTPS. The gate electrode G6 of the sixth transistor ST6, which is part of the second scan line SLb, may correspond to the overlapping area of the second scan line SLb and the active area ACT6.

The source electrode of the sixth transistor ST6 may be connected to the initialization voltage line VIL via a tenth contact hole CNT10 to receive the initialization voltage VI.

The drain electrode D6 of the sixth transistor ST6 may be connected to the anode connecting electrode ANDE via the fifth contact hole CNT5. The anode connecting electrode ANDE may be connected to the anode electrode of the light-emitting element EL.

The first capacitor C1 may include the first electrode CE11 and a second electrode CE12. The first electrode CE11 of the first capacitor C1, which is part of the gate electrode DT-G of the driving transistor DT, may correspond to the overlapping area of the gate electrode DT-G of the driving transistor DT and the second gate layer. The first electrode CE11 of the first capacitor C1 may be connected to the first connecting electrode BE1 via the first contact hole CNT1, and the first connecting electrode BE1 may be connected to the source electrode S1 of the first transistor ST1 and the source electrode S2 of the second transistor ST2 via the second contact hole CNT2.

The second electrode CE12 of the first capacitor C1 may be connected to the driving voltage line VDDL via a fourth contact hole CNT4. Accordingly, the second electrode CE12 of the first capacitor C1 may receive the driving voltage VDD from the driving voltage line VDDL.

Figure 10:
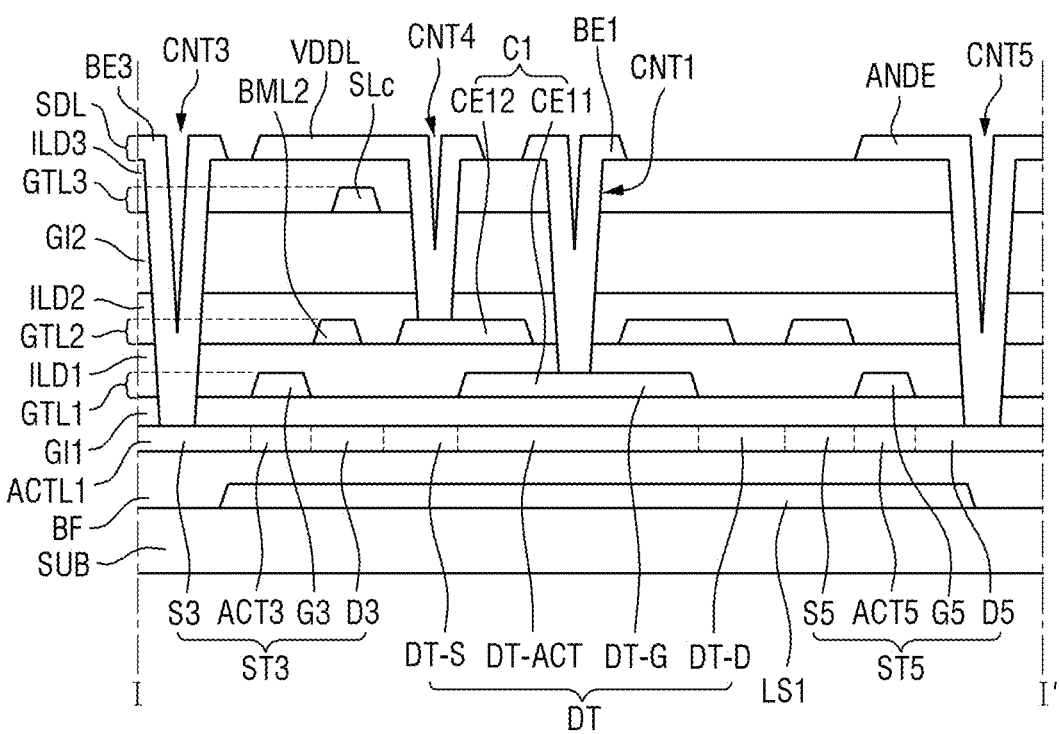
FIG. 10 is a cross-sectional view taken along line I-I' of FIG. 7.
Figure 11:
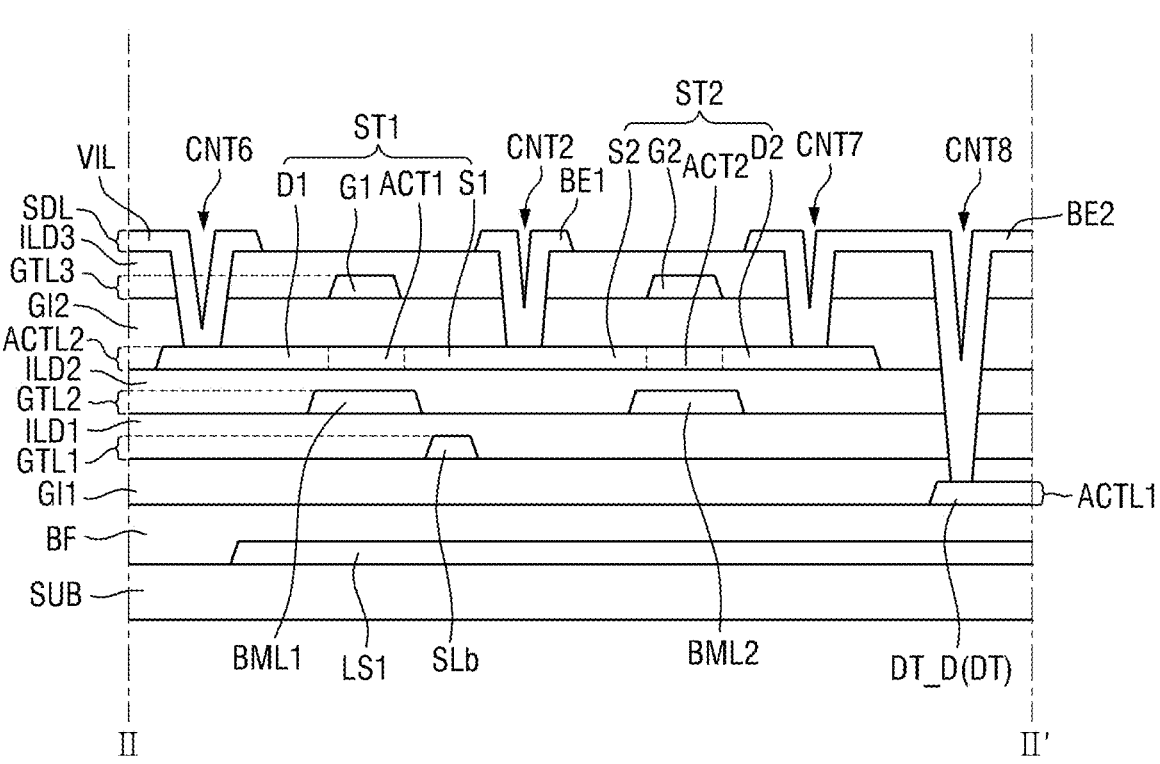
FIG. 11 is a cross-sectional view taken along line II-II' of FIG. 7.

FIG. 10 is a cross-sectional view taken along line I-I' of FIG. 7. FIG. 11 is a cross-sectional view taken along line II-II' of FIG. 7.

Referring to FIGS. 10 and 11, and further to FIGS. 7 through 9, a display panel 300 may include a substrate SUB, a first light-blocking layer LS1, a buffer layer BF, a first active layer ACTL1, a first gate insulating film GI1, a first gate layer GTL1, a first interlayer insulating film ILD1, a second gate layer GTL2, a second interlayer insulating film ILD2, a second active layer ACTL2, a second gate insulating layer GI2, a third gate layer GTL3, a third interlayer insulating film ILD3, and a source-drain layer SDL.

The substrate SUB may be a base substrate and may be formed of an insulating material such as a polymer resin. For example, the substrate SUB may be a flexible substrate that is bendable, foldable, or rollable.

The first light-blocking layer LS1 may be disposed between the substrate SUB and the buffer layer BF and may overlap a first node N1. For example, the first light-blocking layer LS1 may overlap the gate electrode DT-G of the driving transistor DT, the source electrode S1 of the first transistor ST1, the source electrode S2 of the second transistor ST2, and the first electrode CE11 of the first capacitor C1. The first light-blocking layer LS1 may at least partially overlap the first and second active layers ACTL1 and ACTL2 in the thickness direction (or the Z-axis direction). As can be seen in FIG. 8, the first light-blocking layer LS1 may overlap the third transistor ST3, the fourth transistor ST4, the fifth transistor ST5, and the sixth transistor ST6 in the thickness direction (or the Z-axis direction). The first light-blocking layer LS1 can improve the turn-on characteristics, threshold-voltage characteristics, and subthreshold swing (SS) characteristics of transistors by blocking light incident upon the first node N1.

The first light-blocking layer LS1 may be disposed between the substrate SUB and the buffer layer BF and may overlap the driving transistor DT and the first through sixth transistors ST1 through ST6. For example, a first light-blocking layer LS1 of each of the first subpixels SP1 and the second subpixels SP2 may overlap the driving transistor DT and the first through sixth transistors ST1 through ST6 of the corresponding first or second subpixel SP1 or SP2. In an example embodiment, each of the second subpixels SP2 may include a first light-blocking layer LS1, but the first subpixels SP1 do not include a first light-blocking layer LS1. The first light-blocking layer LS1 of each of the first subpixels SP1 or the second subpixels SP2 may overlap the first and second active layers ACTL1 and ACTL2. Thus, the first light-blocking layer of each of the first subpixels SP1 or the second subpixels SP2 can block light incident upon the first subpixels SP1 or the second subpixels SP2.

The second subpixels SP2 in the sensor area SDA may overlap the sensor devices 740, 750, 760, and 770 in the thickness direction. Light emitted from the proximity sensor 740, the illumination sensor 750, the iris sensor 760, the second camera sensor 770, or another sensor may be discharged out of the display device 10, and some of the discharged light may arrive at the second subpixels SP2. The turn-on characteristics, threshold-voltage characteristics, and SS characteristics of at least one of a driving transistor DT and first through sixth transistors ST1 through ST6 of each of the second subpixels SP2 may be affected by light from the sensor devices 740, 750, 760, and 770. For example, first nodes N1 of the second subpixels SP2 may be connected to first electrodes CE11 of first capacitors C1 of the second subpixels SP2, and may thus be affected by light from the sensor devices 740, 750, 760, and 770. The first light-blocking layer LS1 of each of the second subpixels SP2 overlaps the driving transistor DT and the first through sixth transistors ST1 through ST6 of the corresponding second subpixel SP2, and can thus block light from the sensor devices 740, 750, 760, and 770. Accordingly, the first light-blocking layer LS1 of each of the second subpixels SP2 can improve the turn-on characteristics, threshold-voltage characteristics, and SS characteristics of the driving transistor DT and the first through sixth transistors ST1 through ST6 of each of the second subpixels SP2.

Each of the first subpixels SP1 and the second subpixels SP2 includes a driving transistor DT, first through sixth transistors ST1 through ST6, and a first capacitor C1, and can internally compensate for the threshold-voltage characteristics of the driving transistor DT. For example, even if the second subpixels SP2 in the sensor area SDA overlap the sensor devices 740, 750, 760, and 770 in the thickness direction, each of the second subpixels SP2 can improve the turn-on characteristics, threshold-voltage characteristics, and SS characteristics of the transistors thereof because each of the second subpixels SP2 includes a first light-blocking layer LS1. Accordingly, the display device 10 can uniformly maintain the luminance of the display panel 300 by matching compensated values of the first subpixels SP1 with compensated values of the second subpixels SP2.

Alternatively, the first subpixels SP1 in the general area MDA may receive external light or reflected light, and the second subpixels SP2 in the sensor area SDA may receive light from the sensor devices 740, 750, 760, and 770. As a result, the turn-on characteristics, threshold-voltage characteristics, and SS characteristics of the driving transistor DT and the first through sixth transistors ST1 through ST6 of each of the first subpixels SP1 and the second subpixels SP2 may be affected. However, each of the first subpixels SP1 and the second subpixels SP2 further includes a first light-blocking layer LS1, and can thus improve the turn-on characteristics, threshold-voltage characteristics, and SS characteristics of the transistors thereof. Accordingly, the display device 10 can uniformly maintain the luminance of the display panel 300 by matching the compensated values of the first subpixels SP1 with the compensated values of the second subpixels SP2.

The first light-blocking layer LS1 may be electrically connected to the driving voltage line VDDL, the initialization voltage line VIL, a gate-high voltage line, a gate-low voltage line, a direct current (DC) voltage line, or an alternating current (AC) voltage line. For example, the first light-blocking layer LS1, which is disposed on the substrate SUB, may be connected to the driving voltage line VDDL, which is disposed in the source-drain layer SDL, via at least one connecting electrode. The at least one connecting electrode may be disposed in the first active layer ACTL1, the first gate layer GTL1, the second gate layer GTL2, the second active layer ACTL2, or the third gate layer GTL3. The first light-blocking layer LS1 may receive a different voltage from first and second metal layers BML1 and BML2. Thus, the first light-blocking layer LS1 may receive the driving voltage VDD, the initialization voltage VI, a gate-high voltage, a gate-low voltage, a DC voltage, or an AC voltage, thereby maintaining a stable voltage and preventing coupling with other electrodes.

The first light-blocking layer LS1 may be electrically connected to one of the first through fourth nodes N1 through N4. For example, the first light-blocking layer LS1 may be connected to one of the driving transistor DT and the first through sixth transistors ST1 through ST6 of FIG. 7. Thus, the first light-blocking layer LS1 can stably maintain the voltage of the node that it is connected to and can prevent coupling with other electrodes.

For example, the first light-blocking layer LS1 may be integrally formed. In an example embodiment, a plurality of first light-blocking layers LS1 may be formed to correspond to at least one transistor. In this example, each of the plurality of first light-blocking layers LS1 may be connected to a DC voltage line, an AC voltage line, or one electrode of the at least one transistor. The plurality of first light-blocking layers LS1 may receive different voltages, and can thus reduce coupling with other electrodes.

The buffer layer BF may be disposed on the substrate SUB and may cover the first light-blocking layer LS1. For example, the buffer layer BF may include a plurality of inorganic films and may be formed on the entire top surface of the substrate SUB to prevent the penetration of moisture into the light-emitting element EL through the substrate SUB.

The first active layer ACTL1 may be disposed on the buffer layer BF. The first active layer ACTL1 may be formed of a silicon-based material. For example, the first active layer ACTL1 may be formed of LTPS. The active areas DT-ACT and ACT3 through ACT6, the source electrodes DT-S and S3 through S6, and the drain electrodes DT-D and D3 through D6 of the driving transistor DT and the third through sixth transistors ST3 through ST6 may be disposed in the first active layer ACTL1.

The first gate insulating film GI1 may cover the buffer layer BF and the first active layer ACTL1, and may insulate the first active layer ACTL1 and the first gate layer GTL1.

The first gate layer GTL1 may be disposed on the first gate insulating film GI1. The gate electrode DT-G of the driving transistor DT, the second scan line SLb, and the emission control line EML may be disposed in the first gate layer GTL1.

Part of the gate electrode DT-G of the driving transistor DT may overlap the second electrode CE12 of the first capacitor C1 to form the first electrode CE11 of the first capacitor C1.

Part of the second scan line SLb may overlap the active area ACT3 of the third transistor ST3 to form the gate electrode G3 of the third transistor ST3. Part of the second scan line SLb may overlap the active area ACT6 of the sixth transistor ST6 to form the gate electrode G6 of the sixth transistor ST6.

Part of the emission control line EML may overlap the active area ACT4 of the fourth transistor ST4 to form the gate electrode G4 of the fourth transistor ST4. Part of the emission control line EML may overlap the active area ACT5 of the fifth transistor ST5 to form the gate electrode G5 of the fifth transistor ST5.

The first interlayer insulating film ILD1 may cover the first gate layer GTL1 and the first gate insulating film GIL. The first interlayer insulating film ILD1 may insulate the first gate layer GTL1 and the second gate layer GTL2.

The second gate layer GTL2 may be disposed on the first interlayer insulating film ILD1. The first and second metal layers BML1 and BML2 and the second electrode CE12 of the first capacitor C1 may be disposed in the second gate layer GTL2. The first metal layer BML1 may overlap the first transistor ST1 in the thickness direction and may block light incident upon the first transistor ST1. The second metal layer BML2 may overlap the second transistor ST2 in the thickness direction and may block light incident upon the second transistor ST2. As shown in FIG. 11, in an example embodiment, the second gate layer GTL2, which may be included in each of the second subpixels SP2, may include the first metal layer BML1 and the second metal layer BML2, which overlap the second active layer ACTL2 in the thickness direction. The first and second metal layers BML1 and BML2 can improve the turn-on characteristics of the first and second transistors ST1 and ST2, respectively, by blocking light incident upon the first and second transistors ST1 and ST2, respectively. The second electrode CE12 of the first capacitor C1 may overlap the first electrode CE11 of the first capacitor C1, which is disposed in the first gate layer GTL1.

The first transistor ST1 can block light from the sensor devices 740, 750, 760, and 770 primarily via the first light-blocking layer LS1, which is interposed between the substrate SUB and the buffer layer BF, and secondarily via the first metal layer BML1, which is disposed in the second gate layer GTL2. Similarly, the second transistor ST2 can block light from the sensor devices 740, 750, 760, and 770 primarily via the first light-blocking layer LS1 and secondarily via the second metal layer BML1. Thus, the display device 10 can double-block light incident upon the first and second transistors ST1 and ST2, via the first light-blocking layer LS1 and the first and second metal layers BML1 and BML2, and can thus increase the turn-on characteristics, threshold-voltage characteristics, and SS characteristics of the first and second transistors ST1 and ST2.

The second interlayer insulating film ILD2 may cover the second gate layer GTL2 and the first interlayer insulating film ILD1. The second interlayer insulating film ILD2 may insulate the second gate layer GTL2 and the second active layer ACTL2.

The second active layer ACTL2 may be disposed on the second interlayer insulating film ILD2. For example, the second active layer ACTL2 may be formed of an oxide-based material. As described above, the first active layer ACTL1 may be formed of a silicon-based material. Thus, in an example embodiment, the first active layer ACTL1 may be formed of a first material, and the second active layer ACTL2 may be formed of a second material different from the first material. The active areas ACT1 and ACT2, the drain electrodes D1 and D2, and the source electrodes S1 and S2 of the first and second transistors ST1 and ST2 may be disposed in the second active layer ACTL2. Thus, as shown in FIGS. 10 and 11, in an example embodiment, the active area DT-ACT of the driving transistor DT may be disposed in the first active layer ACTL1, and the active areas ACT1 and ACT2 of the first and second transistors ST1 and ST2 may be disposed in the second active layer ACTL2.

The second gate insulating film GI2 may cover the second interlayer insulating film ILD2 and the second active layer ACTL2, and may insulate the second active layer ACTL2 and the third gate layer GTL3.

The third gate layer GTL3 may be disposed on the second gate insulating film GI2. The first and third scan lines SLa and SLc may be disposed in the third gate layer GTL3. Part of the first scan line SLa may overlap the active area ACT1 of the first transistor ST1 to form the gate electrode G1 of the first transistor ST1. Part of the third scan line SLc may overlap the active area ACT2 of the second transistor ST2 to form the gate electrode G2 of the second transistor ST2.

The third interlayer insulating film ILD3 may cover the third gate layer GTL3 and the second gate insulating film GI2. The third interlayer insulating film ILD3 may insulate the third gate layer GTL3 and the source-drain layer SDL.

The source-drain layer SDL may be disposed on the third interlayer insulating film ILD3. The first through third connecting electrodes BE1 through BE3, the driving voltage line VDDL, the anode connecting electrode ANDE, and the initialization voltage line VIL may be disposed in the source-drain layer SDL.

The first connecting electrode BE1 may be connected to the gate electrode DT-G of the driving transistor DT via the first contact hole CNT1 and may be connected to the source electrodes S1 and S2 of the first and second transistors ST1 and ST2 via the second contact hole CNT2.

The second connecting electrode BE2 may be connected to the drain electrode D2 of the second transistor ST2 via the seventh contact hole CNT7 and may be connected to the drain electrode DT-D of the driving transistor DT and the source electrode S5 of the fifth transistor ST5 via the eighth contact hole CNT8.

The third connecting electrode BE3 may be connected to the source electrode S3 of the third transistor ST3 via the third contact hole CNT3. The third connecting electrode BE3 may also be connected to the data line DL.

The driving voltage line VDDL may be connected to the second electrode CE12 of the first capacitor C1 via the fourth contact hole CNT4 and may be connected to the source electrode S4 of the fourth transistor ST4 via the ninth contact hole CNT9.

The anode connecting electrode ANDE may be connected to the drain electrodes D5 and D6 of the fifth and sixth transistors ST5 and ST6 via the fifth contact hole CNT5. The anode connecting electrode ANDE may also be connected to the anode electrode of the light-emitting element EL.

The initialization voltage line VIL may be connected to the drain electrode D1 of the first transistor ST1 via the sixth contact hole CNT6 and may be connected to the source electrode S6 of the sixth transistor ST6 via the tenth contact hole CNT10.

Figure 12:
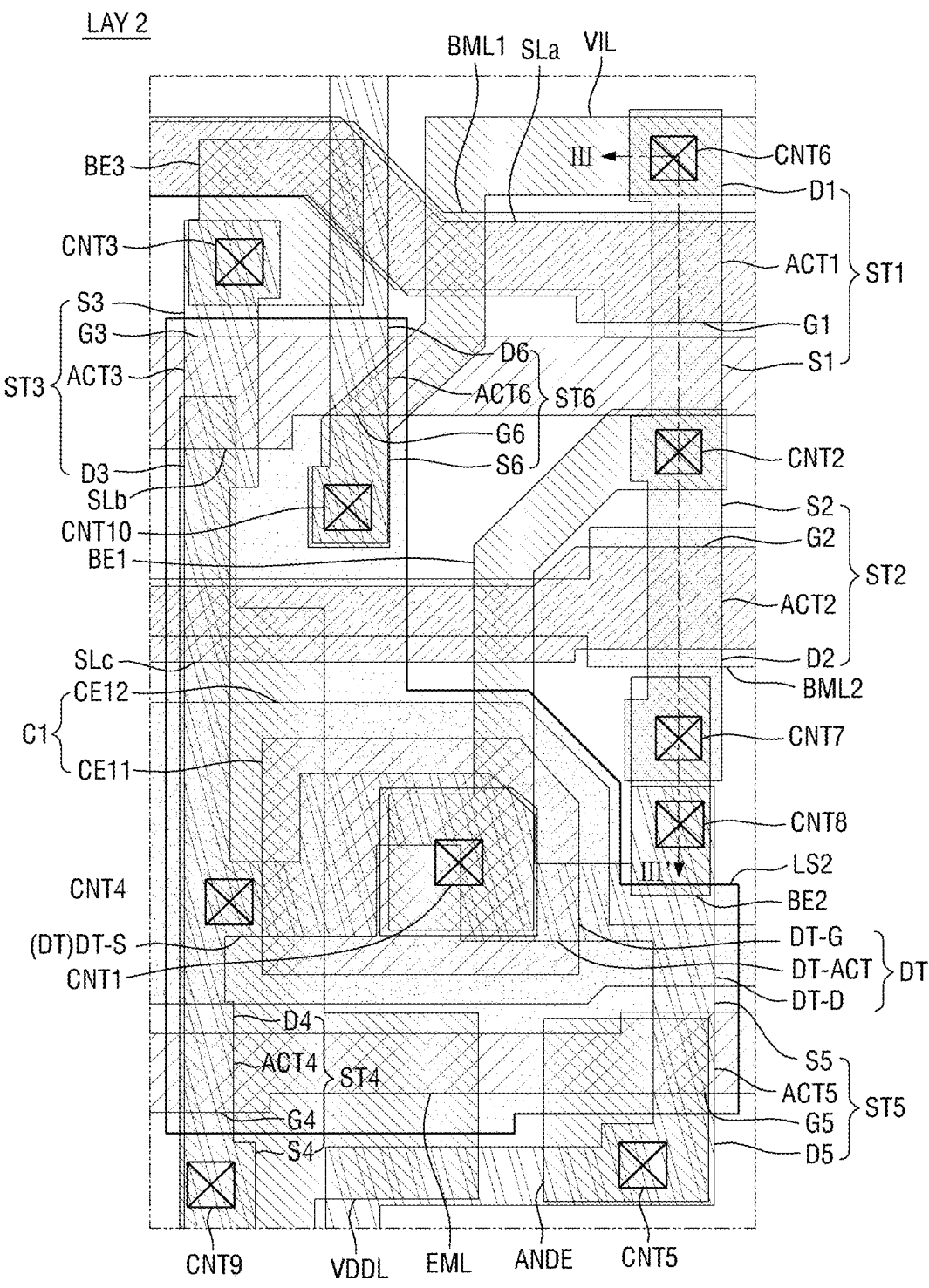
FIG. 12 is a plan view of an example of the subpixel of FIG. 5.
Figure 13:
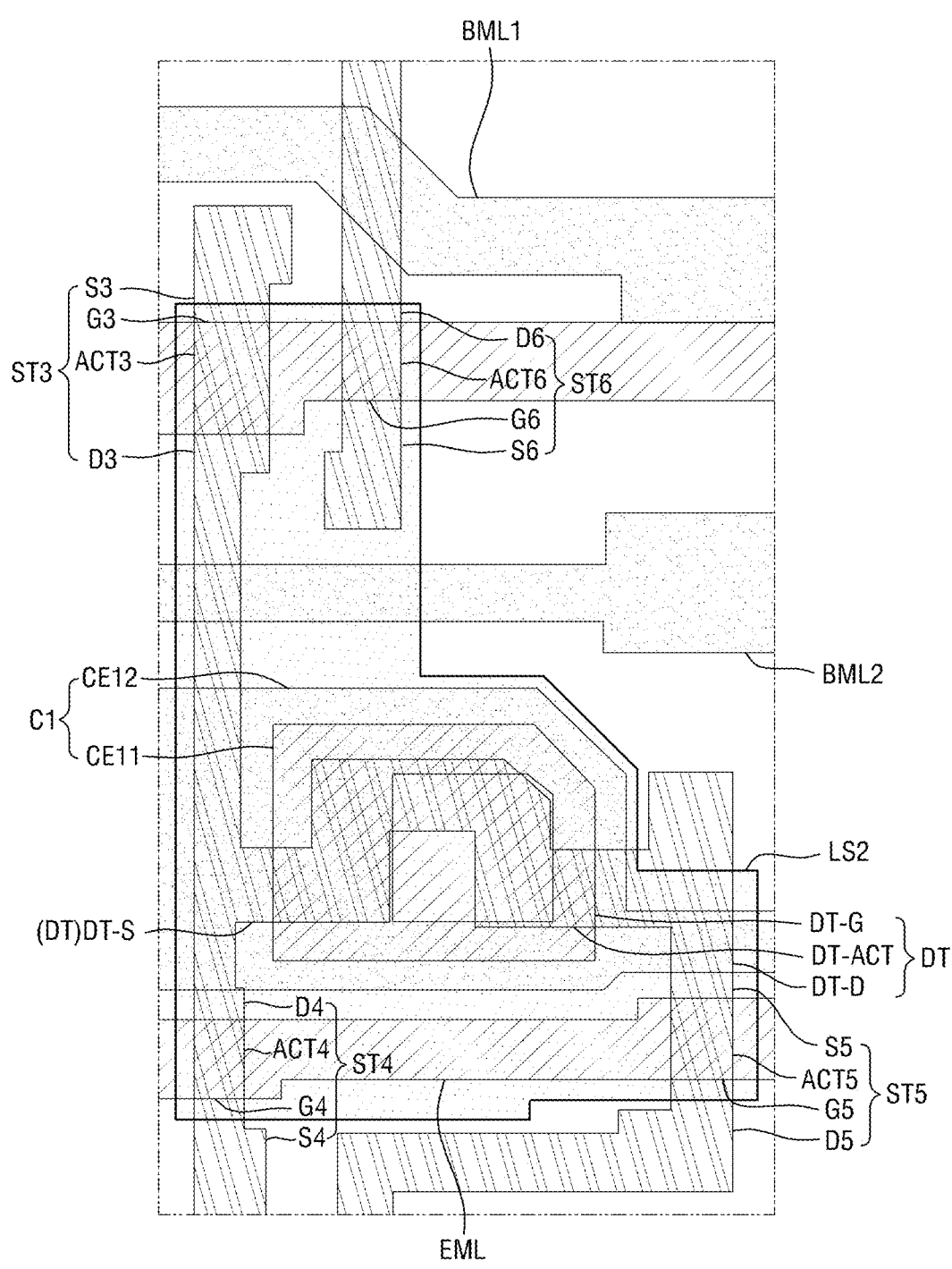
FIG. 13 is a plan view illustrating some layers of the subpixel of FIG. 12.
Figure 14:
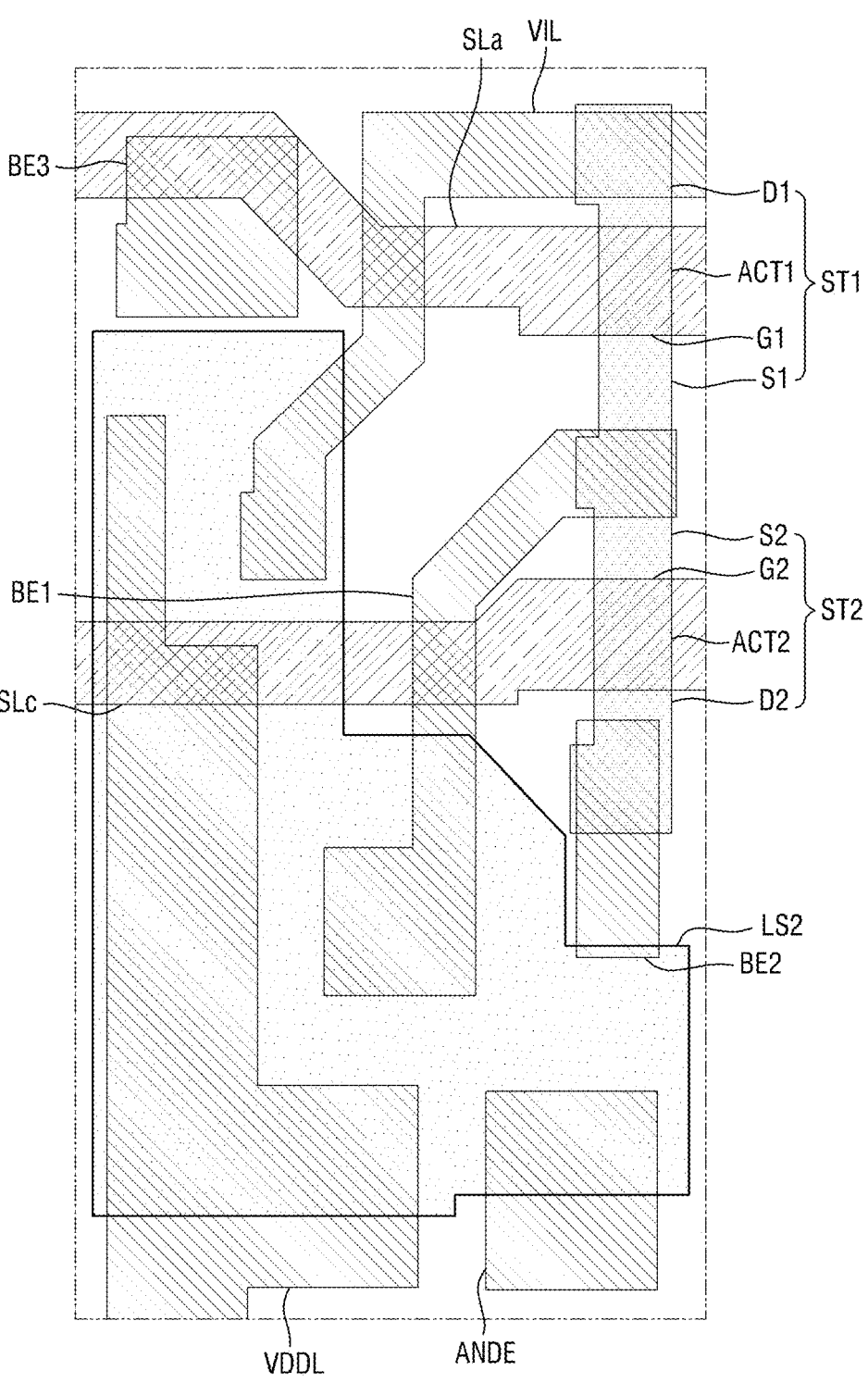
FIG. 14 is a plan view illustrating other layers of the subpixel of FIG. 12.
Figure 15:
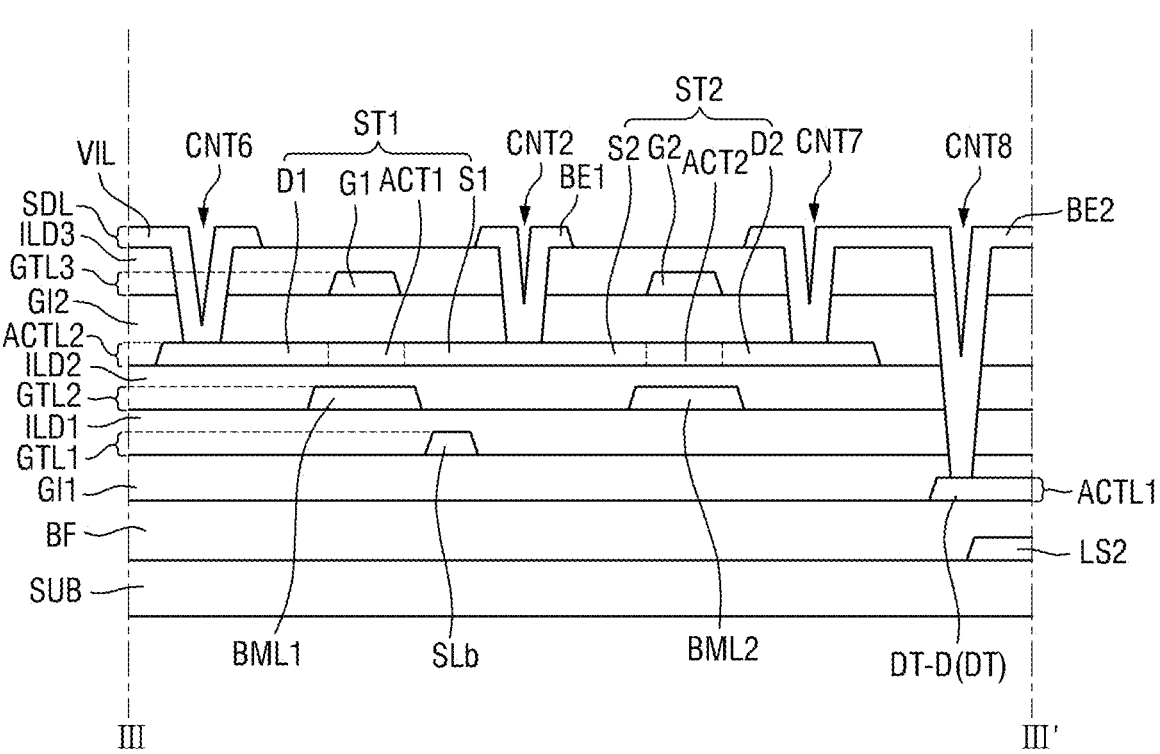
FIG. 15 is a cross-sectional view taken along line III-III' of FIG. 12.

FIG. 12 is a plan view of an example of the subpixel of FIG. 5. Thus, FIG. 12 is a plan view of the first subpixel SP1 or the second subpixel SP2 of FIG. 5 according to example embodiments. FIG. 13 is a plan view illustrating some layers of the subpixel of FIG. 12. FIG. 14 is a plan view illustrating other layers of the subpixel of FIG. 12. FIG. 15 is a cross-sectional view taken along line III-III' of FIG. 12. For example, FIG. 12 illustrates a subpixel in which a second light-blocking layer, a first active layer, a first gate layer, a second gate layer, a second active layer, a third gate layer, and a source-drain layer are sequentially stacked, FIG. 13 illustrates only the second light-blocking layer, the first active layer, the first gate layer, and the second gate layer of FIG. 12, and FIG. 14 illustrates only the second light-blocking layer, the second active layer, the third gate layer, and the source-drain layer of FIG. 12.

Referring to FIGS. 12 through 15, each of the first subpixels SP1 in the general area MDA and the second subpixels SP2 in the sensor area SDA may be realized as a second layout "LAY 2". The second layout "LAY 2" is substantially the same as the first layout "LAY 1" of FIG. 7, except that "LAY 2" includes a second light-blocking layer LS2. For convenience of explanation, a further description of features and elements that have already been described above will be omitted or simplified.

The display panel 300 may include a substrate SUB, a second light-blocking layer LS2, a buffer layer BF, a first active layer ACTL1, a first gate insulating film GI1, a first gate layer GTL1, a first interlayer insulating film ILD1, a second gate layer GTL2, a second interlayer insulating film ILD2, a second active layer ACTL2, a second gate insulating layer GI2, a third gate layer GTL3, a third interlayer insulating film ILD3, and a source-drain layer SDL. Each of the first subpixels SP1 and the second subpixels SP2 may include a driving transistor DT, first through sixth transistors ST1 through ST6, and a first capacitor CL.

The second light-blocking layer LS2 may be disposed between the substrate SUB and the buffer layer BF and may overlap the first active layer ACTL1. For example, the second light-blocking layer LS2 may overlap the driving transistor DT and the third through sixth transistors ST3 through ST6. The second light-blocking layer LS2 may block light incident upon the driving transistor DT and the third through sixth transistors ST3 through ST6, and may thus receive a different voltage from the first and second metal layers BML1 and BML2. As shown in FIG. 15, in an example embodiment, along the cross-section III-III' of FIG. 12, the second light-blocking layer LS2 overlaps the first active layer ACTL1 in the thickness direction, and does not overlap the second active layer ACTL2 in the thickness direction.

The first and second metal layers BML1 and BML2 may be disposed in the second gate layer GTL2. The first and second metal layers BML1 and BML2 may overlap the second active layer ACTL2. The first metal layer BML1 may overlap the first transistor ST1 in the thickness direction to block light incident upon the first transistor ST1. The second metal layer BML2 may overlap the second transistor ST2 to block light incident upon the second transistor ST2. The first and second metal layers BML1 and BML2 can improve the turn-on characteristics of the first and second transistors ST1 and ST2, respectively, by blocking light incident upon the first and second transistors ST1 and ST2, respectively.

For example, each of the first subpixels SP1 and the second subpixels SP2 may include the second light-blocking layer LS2 which overlaps the first active layer ACTL1, and the first and second metal layers BML1 and BML2 which overlap the second active layer ACTL2. Each of the first subpixels SP1 and the second subpixels SP2 can block light incident upon the driving transistor DT and the third through sixth transistors ST3 through ST6 thereof with the use of the second light-blocking layer LS2, and can block light incident upon the first and second transistors ST1 and ST2 thereof with the use of the first and second metal layers BML1 and BML2. Each of the first subpixels SP1 and the second subpixels SP2 includes a second light-blocking layer LS2 and first and second metal layers BML1 and BML2, and can thus improve the turn-on characteristics, threshold-voltage characteristics, and SS characteristics of the transistors thereof.

In an example embodiment, each of the first subpixels SP1 may be realized as the second layout "LAY 2" of FIG. 12, and each of the second subpixels SP2 may be realized as the first layout "LAY 1" of FIG. 7. Each of the first subpixels SP1 may include a second light-blocking layer LS2 and first and second metal layers BML1 and BML2, and each of the second subpixels SP2 may include a first light-blocking layer LS1 and first and second metal layers BML1 and BML2. To match the compensated values of the first subpixels SP1 with the compensated values of the second subpixels SP2, different light-blocking layers may be disposed in the first subpixels SP1 and in the second subpixels SP2. Each of the first subpixels SP1 can block light incident upon the first active layer ACTL1 with the use of the second light-blocking layer LS2 and can block light incident upon the second active layer ACTL2 with the use of the first and second metal layers BML1 and BML2. Each of the second subpixels SP2 can block light incident upon the first active layer ACTL1 with the use of the first light-blocking layer LS1 and can double-block light incident upon the second active layer ACTL2 with the use of the first light-blocking layer LS1 and the first and second metal layers BML1 and BML2. Accordingly, each of the first subpixels SP1 and the second subpixels can improve the turn-on characteristics, threshold-voltage characteristics, and SS characteristics of the transistors thereof. The display device 10 can uniformly maintain the luminance of the display panel 300 by matching the compensated values of the first subpixels SP1 with the compensated values of the second subpixels SP2.

Figure 16:
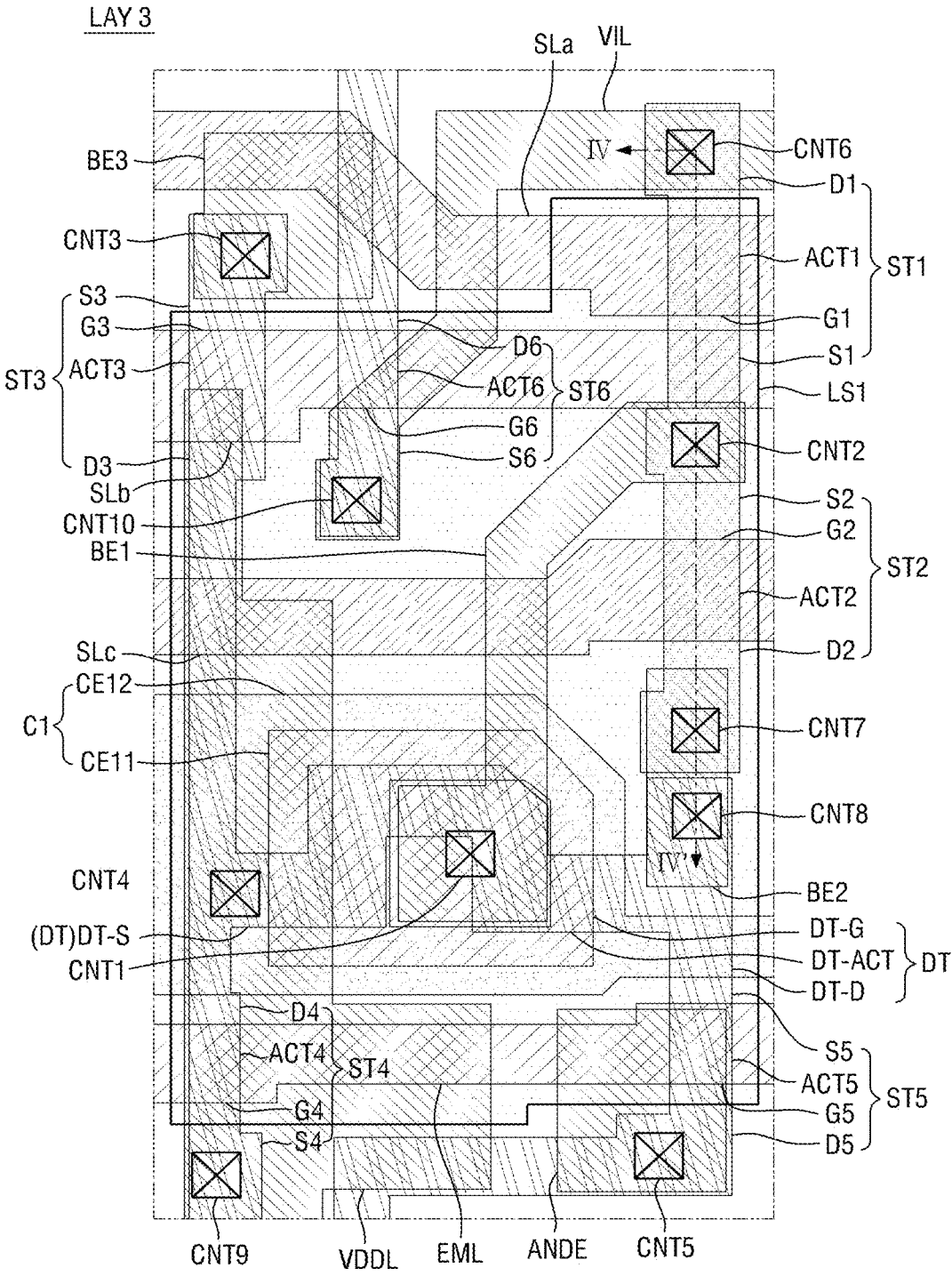
FIG. 16 is a plan view of an example of the subpixel of FIG. 5.
Figure 17:
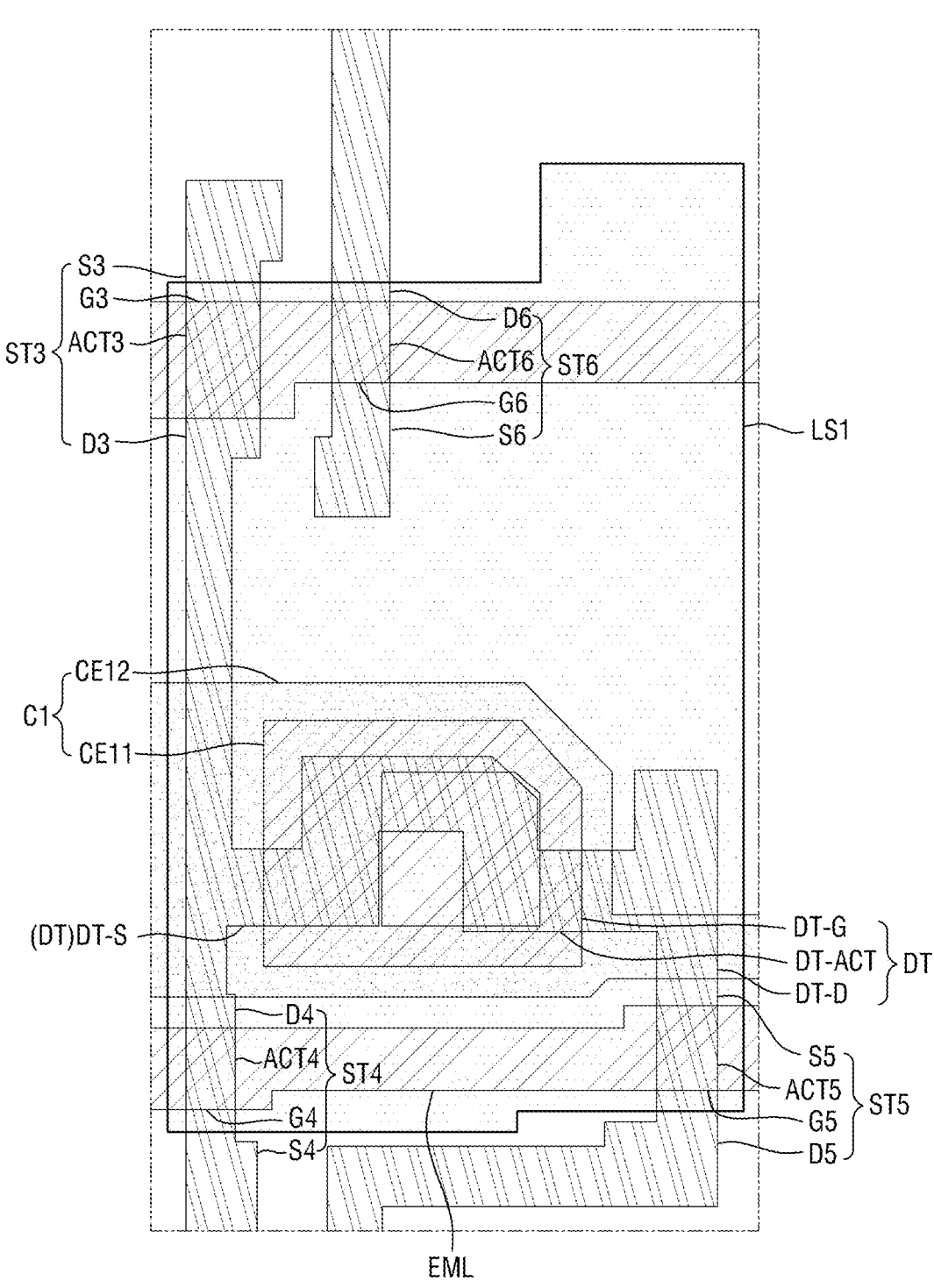
FIG. 17 is a plan view illustrating some layers of the subpixel of FIG. 16.
Figure 18:
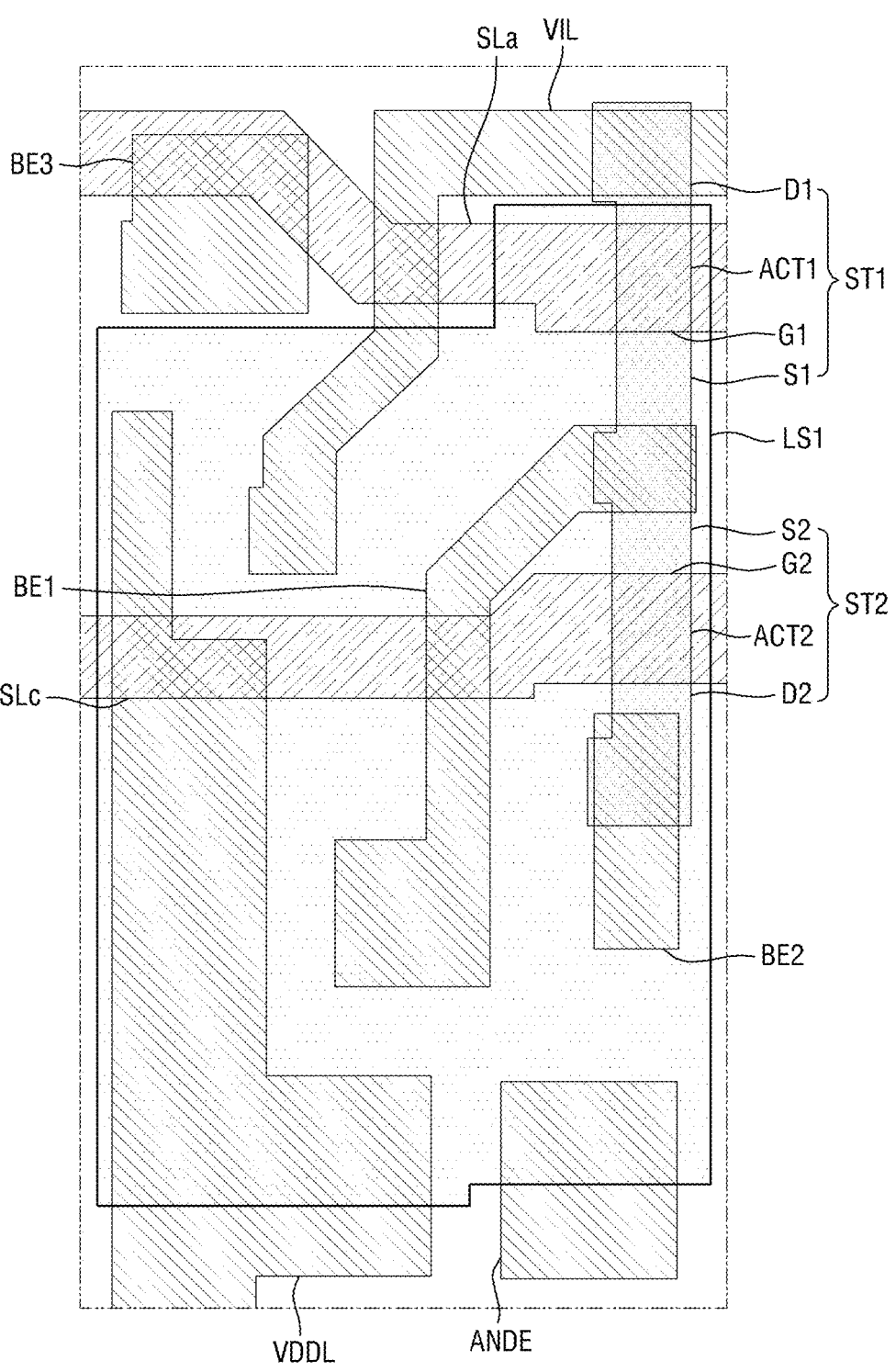
FIG. 18 is a plan view illustrating other layers of the subpixel of FIG. 16.
Figure 19:
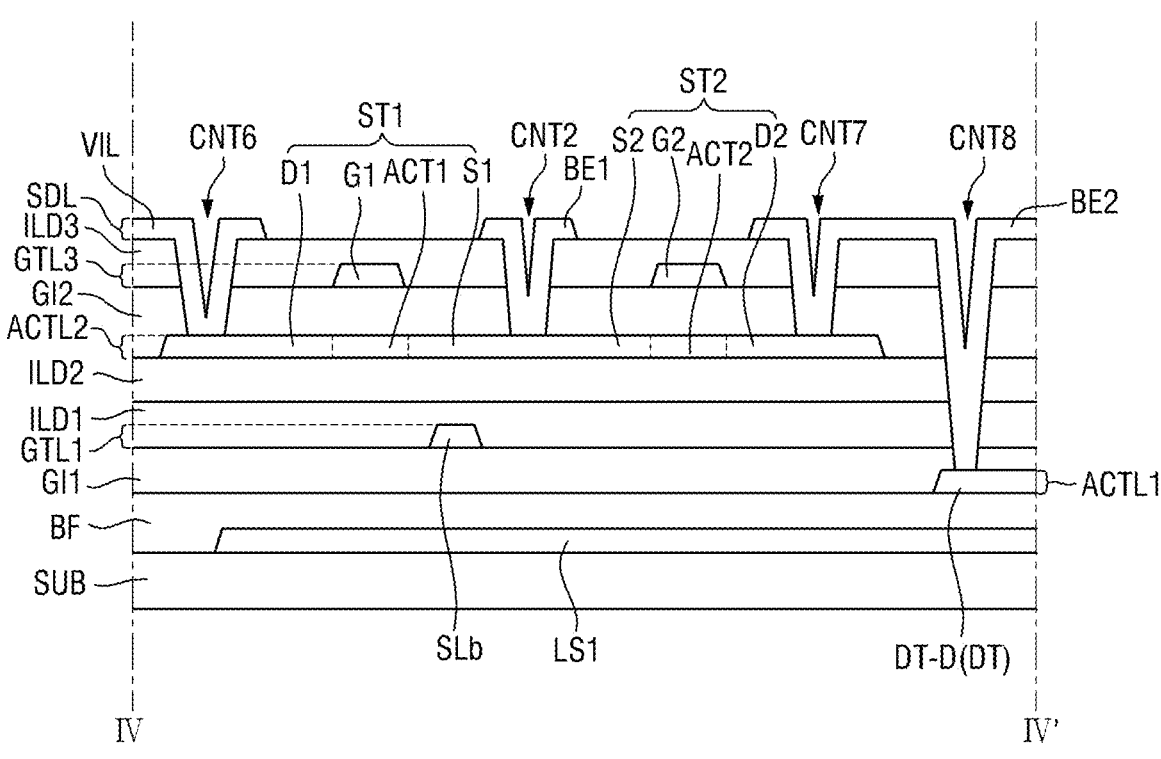
FIG. 19 is a cross-sectional view taken along line IV-IV' of FIG. 16.

FIG. 16 is a plan view of an example of the subpixel of FIG. 5. Thus, FIG. 16 is a plan view of the first subpixel SP1 or the second subpixel SP2 of FIG. 5 according to example embodiments. FIG. 17 is a plan view illustrating some layers of the subpixel of FIG. 16. FIG. 18 is a plan view illustrating other layers of the subpixel of FIG. 16. FIG. 19 is a cross-sectional view taken along line IV-IV' of FIG. 16. For example, FIG. 16 illustrates a subpixel in which a first light-blocking layer, a first active layer, a first gate layer, a second gate layer, a second active layer, a third gate layer, and a source-drain layer are sequentially stacked, FIG. 17 illustrates the first light-blocking layer, the first active layer, the first gate layer, and the second gate layer that are sequentially stacked, and FIG. 18 illustrates the first light-blocking layer, the second active layer, the third gate layer, and the source-drain layer that are sequentially stacked.

Referring to FIGS. 16 through 19, each of the first subpixels SP1 in the general area MDA and the second subpixels SP2 in the sensor area SDA may be realized as a third layout "LAY 3". The third layout "LAY 3" is substantially the same as the first layout "LAY 1" of FIG. 7, except that it does not include first and second metal layers BML1 and BML2. For convenience of explanation, a further description of features and elements that have already been described above will be omitted or simplified.

The display panel 300 may include a substrate SUB, a first light-blocking layer LS1, a buffer layer BF, a first active layer ACTL1, a first gate insulating film GI1, a first gate layer GTL1, a first interlayer insulating film ILD1, a second gate layer GTL2, a second interlayer insulating film ILD2, a second active layer ACTL2, a second gate insulating layer GI2, a third gate layer GTL3, a third interlayer insulating film ILD3, and a source-drain layer SDL. Each of the first subpixels SP1 and the second subpixels SP2 may include a driving transistor DT, first through sixth transistors ST1 through ST6, and a first capacitor C1.

The first light-blocking layer LS1 may be disposed between the substrate SUB and the buffer layer BF and may overlap the first and second active layers ACTL1 and ACTL2.

For example, each of the first subpixels SP1 and the second subpixels SP2 may include the first light-blocking layer LS1. Each of the first subpixels SP1 and the second subpixels SP2 can block light incident upon the driving transistor DT and the third through sixth transistors ST3 through ST6 thereof with the use of the first light-blocking layer LS1. Each of the first subpixels SP1 and the second subpixels SP2 includes a first light-blocking layer LS1, and can thus improve the turn-on characteristics, threshold-voltage characteristics, and SS characteristics of the transistors thereof.

In an example embodiment, each of the first subpixels SP1 may be realized as the third layout "LAY 3" of FIG. 16, and each of the second subpixels SP2 may be realized as the first layout "LAY 1" of FIG. 7. Each of the first subpixels SP1 may include a first light-blocking layer LS1, and each of the second subpixels SP2 may include a first light-blocking layer LS1 and first and second metal layers BML1 and BML2. To match the compensated values of the first subpixels SP1 with the compensated values of the second subpixels SP2, first and second metal layers BML1 and BML2 may be additionally disposed in each of the second subpixels SP2. Each of the first subpixels SP1 can block light incident upon the first and second active layers ACTL1 and ACTL2 with the use of the first light-blocking layer LS1. Each of the second subpixels SP2 can block light incident upon the first active layer ACTL1 with the use of the first light-blocking layer LS1 and can double-block light incident upon the second active layer ACTL2 with the use of the first light-blocking layer LS1 and the first and second metal layers BML1 and BML2. Accordingly, each of the first subpixels SP1 and the second subpixels SP2 can improve the turn-on characteristics, threshold-voltage characteristics, and SS characteristics of the transistors thereof. The display device 10 can uniformly maintain the luminance of the display panel 300 by matching the compensated values of the first subpixels SP1 with the compensated values of the second subpixels SP2.

Figure 20:
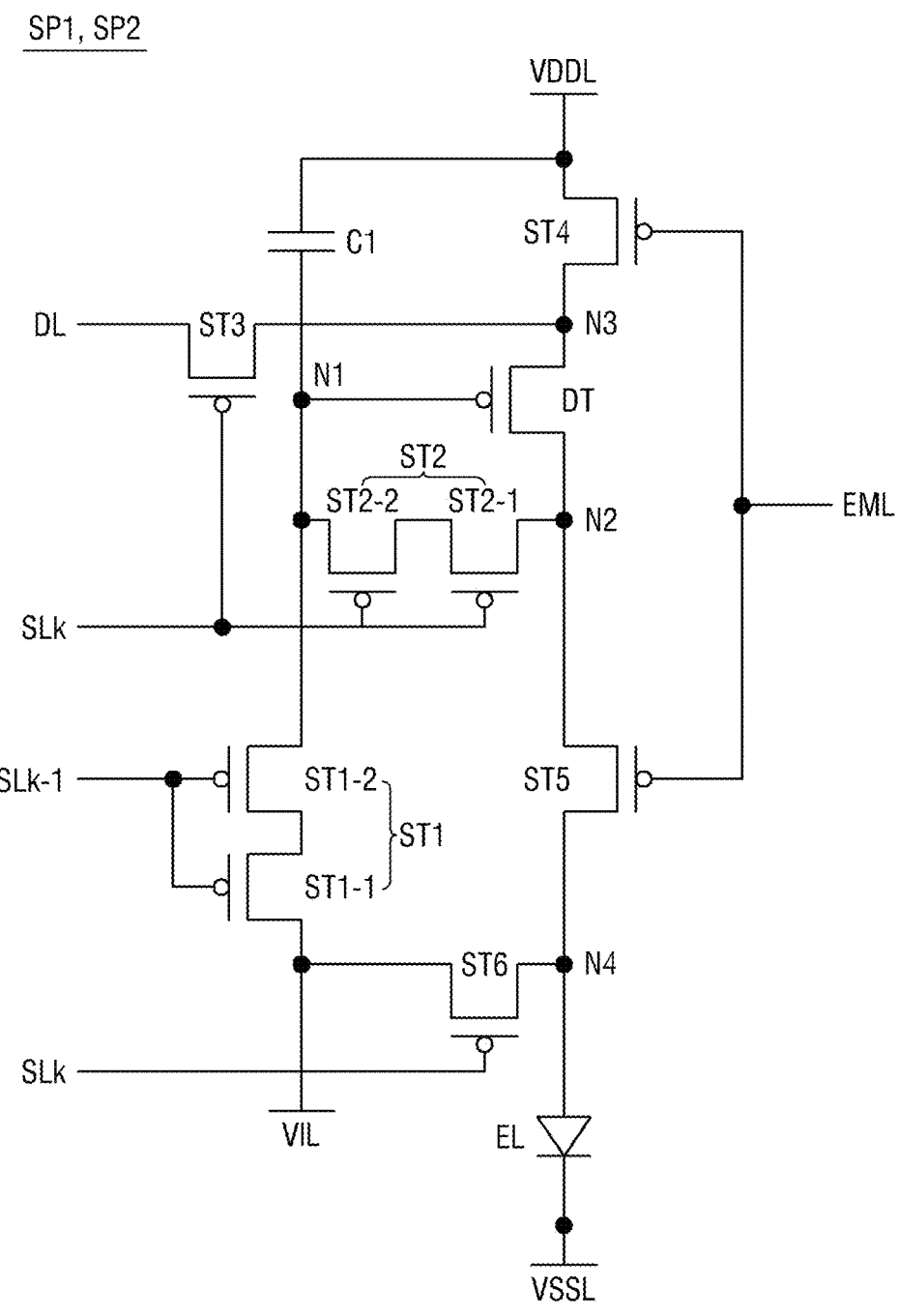
FIG. 20 is a circuit diagram of a subpixel according to an example embodiment of the present disclosure.
Figure 21:
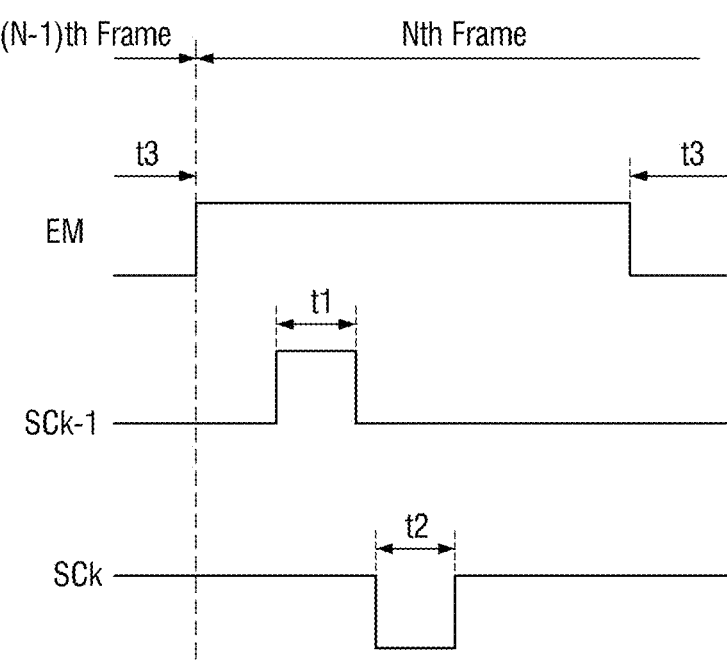
FIG. 21 is a waveform diagram illustrating signals provided to the subpixel of FIG. 20.

FIG. 20 is a circuit diagram of a subpixel according to an example embodiment of the present disclosure. FIG. 21 is a waveform diagram illustrating signals provided to the subpixel of FIG. 20. A subpixel SP of FIG. 20 may correspond to the first subpixels SP1 or the second subpixels SP2 of FIGS. 3 and 4. For convenience of explanation, a further description of features and elements that have already been described above will be omitted or simplified.

Referring to FIGS. 20 and 21, the display panel 300 may include a plurality of subpixels SP, which are arranged in k rows (where k is a natural number) and j columns (where j is a natural number). For example, the general area MDA of the display panel 300 may include first subpixels SP1, and the sensor area SDA of the display panel 300 may include second subpixels SP2. Each of first or second subpixels SP1 or SP2 in a k-th row may be connected to a k-th scan line SLk, a (k−1)-th scan line SLk-1, an emission control line EML, a data line DL, a driving voltage line VDDL, and an initialization voltage line VIL.

Each of the first subpixels SP1 and the second subpixels SP2 may include a driving transistor DT, a light-emitting element EL, a plurality of switching elements, and a first capacitor C1. The switching elements may include first through sixth transistors ST1 through ST6.

The driving transistor DT may include a gate electrode, a source electrode, and a drain electrode. The gate electrode of the driving transistor DT may be connected to a first node N1, the drain electrode of the driving transistor DT may be connected to a second node N2, and the source electrode of the driving transistor DT may be connected to a third node N3. The driving transistor DT may control a source-drain current or a driving current Isd in accordance with a data voltage Vdata applied to the gate electrode of the driving transistor DT. The driving current Isd, which flows through the channel of the driving transistor DT, may be proportional to the square of the difference between a threshold voltage Vth and a source-gate voltage Vsg, which is the voltage between the source and gate electrodes of the driving transistor DT. For example, $Isd=k'\times(Vsg-Vth)^2$ where k' is a proportionality coefficient determined by the structure and physical characteristics of the driving transistor DT, Vsg is the source-gate voltage of the driving transistor DT, and Vth is the threshold voltage of the driving transistor DT.

The light-emitting element EL may receive the driving current Isd and may thus emit light. The amount of light emitted by the light-emitting element EL or the luminance of the light-emitting element EL may be proportional to the magnitude of the driving current Isd.

The light-emitting element EL may be an OLED including an anode electrode, a cathode electrode, and an organic light-emitting layer, which is disposed between the anode electrode and the cathode electrode. Alternatively, in an example embodiment, the light-emitting element EL may be an inorganic EL element including an anode electrode, a cathode electrode, and an inorganic semiconductor, which is disposed between the anode electrode and the cathode electrode. Alternatively, in an example embodiment, the light-emitting element EL may be a QLED including an anode electrode, a cathode electrode, and a quantum-dot light-emitting layer, which is disposed between the anode electrode and the cathode electrode. Alternatively, in an example embodiment, the light-emitting element EL may be a micro-LED.

The anode electrode of the light-emitting element EL may be connected to a fourth node N4. The anode electrode of the light-emitting element EL may be connected to the drain electrodes of the fifth and sixth transistors ST5 and ST6 via the fourth node N4. The cathode electrode of the light-emitting element EL may be connected to a low-potential line VSSL. Parasitic capacitance may be formed between the anode electrode and the cathode electrode of the light-emitting element EL.

The first transistor ST1 may be turned on by a scan signal from a scan line of a previous stage, e.g., a (k−1)-th scan signal SCk-1 from the (k−1)-th scan line SLk-1, to connect the initialization voltage line VIL and the first node N1, which is the gate electrode of the driving transistor DT. For example, the first transistor ST1 may be a dual transistor including (1-1)- and (1-2)-th transistors ST1-1 and ST1-2. The (1-1)-th and (1-2)-th transistors ST1-1 and ST1-2 may be turned on by the (k−1)-th scan signal SCk-1 to discharge the gate electrode of the driving transistor DT to the initialization voltage VI. The gate electrode of the (1-1)-th transistor ST1-1 may be connected to the (k−1)-th scan line SLk-1, the source electrode of the (1-1)-th transistor ST1-1 may be connected to the initialization voltage line VIL, and the drain electrode of the (1-1)-th transistor ST1-1 may be connected to the source electrode of the (1-2)-th transistor ST1-2. The gate electrode of the (1-2)-th transistor ST1-2 may be connected to the (k−1)-th scan line SLk-1, the source electrode of the (1-2)-th transistor ST1-2 may be connected to the drain electrode of the (1-1)-th transistor ST1-1, and the drain electrode of the (1-2)-th transistor ST1-2 may be connected to the first node N1.

The second transistor ST2 may be turned on by a scan signal from a scan line of a current stage, e.g., a k-th scan signal SCk from the k-th scan line SLk, to connect the first node N1, which is the gate electrode of the driving transistor DT, and the second node N2, which is the drain electrode of the driving transistor DT. For example, the second transistor ST2 may be a dual transistor including (2-1)-th and (2-2)-th transistors ST2-1 and ST2-2. The gate electrode of the (2-1)-th transistor ST2-1 may be connected to the k-th scan line SLk, the source electrode of the (2-1)-th transistor ST2-1 may be connected to the second node N2, and the drain electrode of the (2-1)-th transistor ST2-1 may be connected to the source electrode of the (2-2)-th transistor ST2-2. The gate electrode of the (2-2)-th transistor ST2-2 may be connected to the k-th scan line SLk, the source electrode of the (2-2)-th transistor ST2-2 may be connected to the drain electrode of the (2-1)-th transistor ST2-1, and the drain electrode of the (2-2)-th transistor ST2-2 may be connected to the first node N1.

The third transistor ST3 may be turned on by the k-th scan signal SCk to connect the data line DL and the third node N3, which is the source electrode of the driving transistor DT. The third transistor ST3 may be turned on by the k-th scan signal SCk to provide the data voltage Vdata to the third node N3. The gate electrode of the third transistor ST3 may be connected to the k-th scan line SLk, the source electrode of the third transistor ST3 may be connected to the data line DL, and the drain electrode of the third transistor ST3 may be connected to the third node N3. The drain electrode of the third transistor ST3 may be connected to the source electrode of the driving transistor DT and the drain electrode of the fourth transistor ST4 via the third node N3.

The fourth transistor ST4 may be turned on by the emission signal EM from the emission control line EML to connect the driving voltage line VDDL and the third node N3, which is the source electrode of the driving transistor DT. The gate electrode of the fourth transistor ST4 may be connected to the emission control line EML, the source electrode of the fourth transistor ST4 may be connected to the driving voltage line VDDL, and the drain electrode of the fourth transistor ST4 may be connected to the third node N3. The drain electrode of the fourth transistor ST4 may be connected to the source electrode of the driving transistor DT and the drain electrode of the third transistor ST3 via the third node N3.

The fifth transistor ST5 may be turned on by the emission signal EM from the emission control line EML to connect the second node N2, which is the drain electrode of the driving transistor DT, and the fourth node N4, which is the anode electrode of the light-emitting element EL. The gate electrode of the fifth transistor ST5 may be connected to the emission control line EML, the source electrode of the fifth transistor ST5 may be connected to the second node N2, and the drain electrode of the fifth transistor ST5 may be connected to the fourth node N4. The source electrode of the fifth transistor ST5 may be connected to the drain electrode of the driving transistor DT and the drain electrode of the second transistor ST2 via the second node N2. The drain electrode of the fifth transistor ST5 may be connected to the anode electrode of the light-emitting element EL and the drain electrode of the sixth transistor ST6 via the fourth node N4.

When the fourth transistor ST4, the driving transistor DT, and the fifth transistor ST5 are all turned on, the driving current Isd may be supplied to the light-emitting element EL.

The sixth transistor ST6 may be turned on by the k-th scan signal SCk to connect the initialization voltage line VIL and the fourth node N4, which is the anode electrode of the light-emitting element EL. The sixth transistor ST6 may be turned on by the k-th scan signal SCk to discharge the anode electrode of the light-emitting element EL to the initialization voltage VI. The gate electrode of the sixth transistor ST6 may be connected to the k-th scan line SLk, the source electrode of the sixth transistor ST6 may be connected to the initialization voltage line VIL, and the drain electrode of the sixth transistor ST6 may be connected to the fourth node N4. The drain electrode of the sixth transistor ST6 may be connected to the anode electrode of the light-emitting element EL and the drain electrode of the sixth transistor ST5 via the fourth node N4.

Each of the driving transistor DT and the first through sixth transistors ST1 through ST6 may include a silicon-based active layer. For example, each of the driving transistor DT and the first through sixth transistors ST1 through ST6 may include an active layer formed of LTPS. The active layer formed of LTPS may have high electron mobility and excellent turn-on characteristics. Thus, since the display device 10 includes the driving transistor DT and the first through sixth transistors ST1 through ST6 that all have excellent turn-on characteristics, the display device 10 can drive the subpixels SP stably and efficiently.

The driving transistor DT and the first through sixth transistors ST1 through ST6 may be p-type transistors. For example, the driving transistor DT and the first through sixth transistors ST1 through ST6 may output a current input to their source electrodes to their drain electrodes based on a gate-low voltage applied to their gate electrodes.

The first capacitor C1 may be connected between the first node N1, which is the gate electrode of the driving transistor DT, and the driving voltage line VDDL. For example, the first electrode of the first capacitor C1 may be connected to the first node N1, and the second electrode of the first capacitor C1 may be connected to the driving voltage line VDDL. Accordingly, the potential difference between the driving voltage line VDDL and the gate electrode of the driving transistor DT can be maintained.

Referring to FIG. 21, and further to FIG. 20, the display device 10 can be driven over first through third periods t1 through t3 of a frame.

The first transistor ST1 may receive a high-level (k−1)-th scan signal SCk-1 during a first period t1 of an N-th frame (where N is a natural number of 2 or greater). Then, the first transistor ST1 may be turned on by the high-level (k−1)-th scan signal SCk-1 and may provide the initialization voltage VI to the first node N1, which is the gate electrode of the driving transistor DT. Thus, the first transistor ST1 may initialize the gate electrode of the driving transistor DT during the first period t1 of the N-th frame.

The second transistor ST2 may receive a low-level k-th scan signal SCk during a second period t2 of the N-th frame. Then, the second transistor ST2 may be turned on by the low-level k-th scan signal SCk and may connect the first and second nodes N1 and N2.

The third transistor ST3 may receive the low-level k-th scan signal SCk during the second period t2 of the N-th frame. Then, the third transistor ST3 may be turned on by the low-level k-th scan signal SCk and may provide the data voltage Vdata to the third node N3, which is the source electrode of the driving transistor DT.

The sixth transistor ST6 may receive the low-level k-th scan signal SCk during the second period t2 of the N-th frame. Then, the sixth transistor ST6 may be turned on by the low-level k-th scan signal SCk and may provide the initialization voltage to the fourth node N4, which is the anode electrode of the light-emitting element EL. Thus, the sixth transistor ST6 may initialize the anode electrode of the light-emitting element EL during the second period t2 of the N-th frame.

The emission signal EM may have a gate-low voltage during a third period t3 of the N-th frame. When the emission signal EM has a low level, the fourth and fifth transistors ST4 and ST5 may be turned on to supply the driving current Isd to the light-emitting element.

Figure 22:
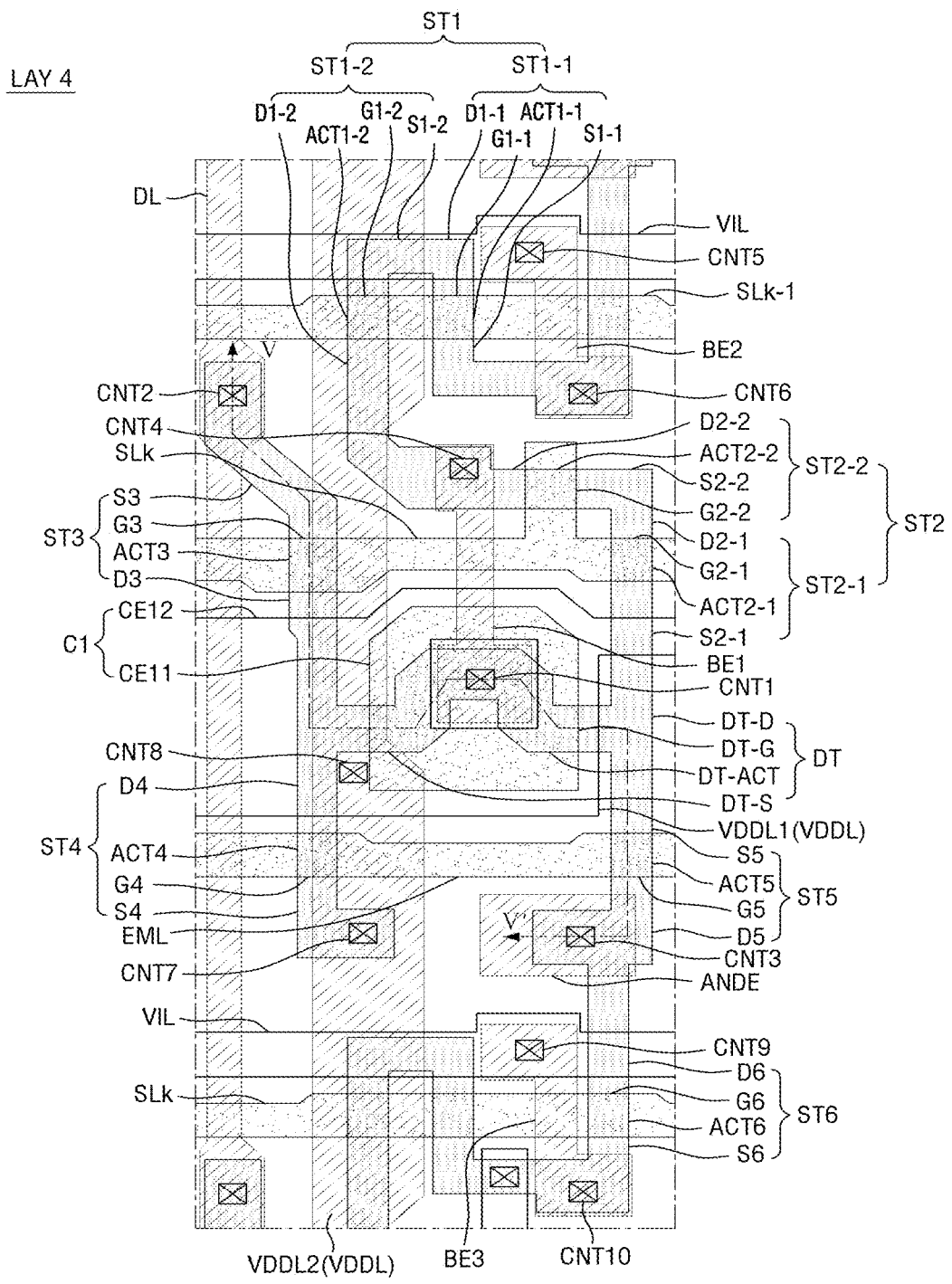
FIG. 22 is a plan view of an example of the subpixel of FIG. 20.
Figure 23:
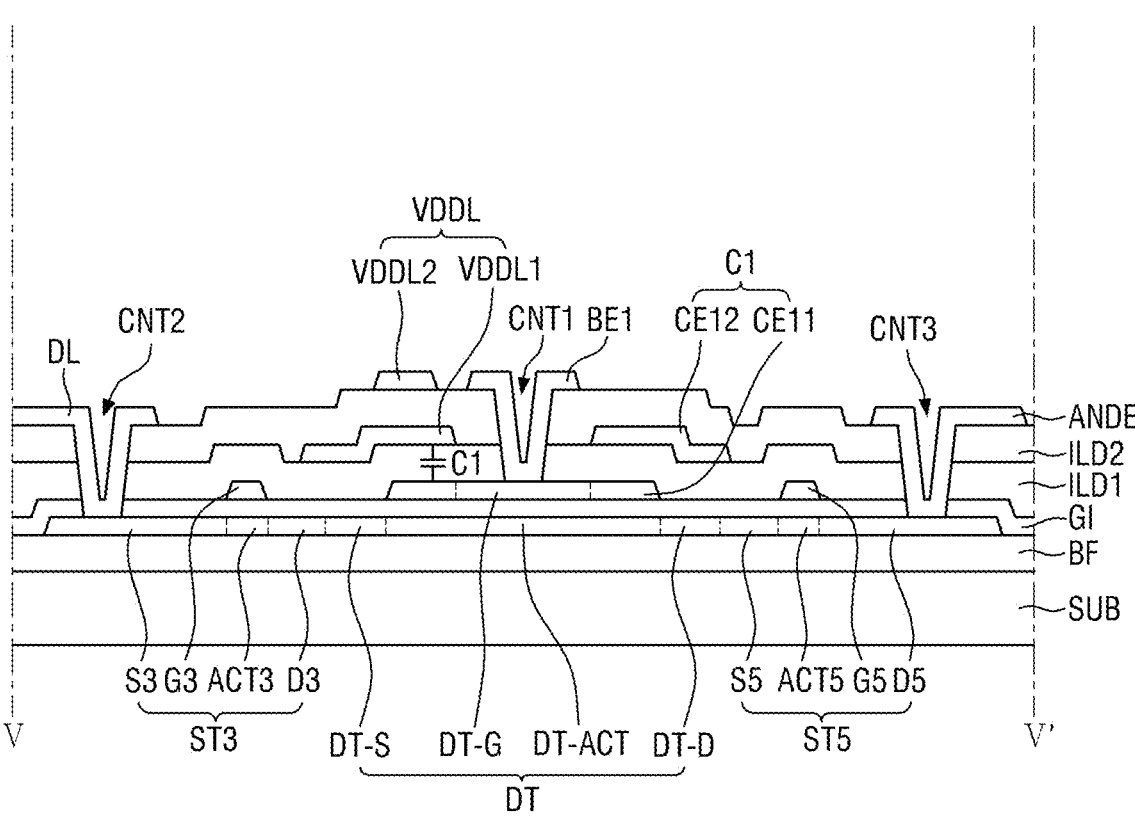
FIG. 23 is a cross-sectional view taken along line V-V' of FIG. 22.

FIG. 22 is a plan view of an example of the subpixel of FIG. 20. FIG. 23 is a cross-sectional view taken along line V-V' of FIG. 22. For convenience of explanation, a further description of features and elements that have already been described above will be omitted or simplified.

Referring to FIGS. 22 and 23, each of the first subpixels SP1 in the general area MDA and the second subpixels SP2 in the sensor area SDA may be realized as a fourth layout "LAY 4". Each of the first subpixels SP1 in the general area MDA and the second subpixels SP2 in the sensor area SDA may include a driving transistor DT, a light-emitting element EL, first through sixth transistors ST1 through ST6, and a first capacitor C1.

The driving transistor DT may include an active area DT-ACT, a gate electrode DT-G, a source electrode DT-S, and a drain electrode DT-D. The active area DT-ACT of the driving transistor DT may overlap the gate electrode DT-G of the driving transistor DT, which is disposed in a first gate layer GTL1.

The gate electrode DT-G of the driving transistor DT may be connected to a first connecting electrode BE1 via a first contact hole CNT1, and the first connecting electrode BE1 may be connected to drain electrodes D1-1 and D1-2 of (1-1)-th and (1-2)-th transistors ST1-1 and ST1-2 via a fourth contact hole CNT4. The overlapping area of the gate electrode DT-G of the driving transistor DT and a second gate layer GTL2 may correspond to a first electrode CE11 of the first capacitor C1.

The source electrode DT-S of the driving transistor DT may be connected to drain electrodes D3 and D4 of the third and fourth transistors ST3 and ST4.

The drain electrode DT-D of the driving transistor DT may be connected to a source electrode S2-1 of a (2-1)-th transistor ST2-1 and a source electrode S5 of the fifth transistor ST5.

The first transistor ST1 may be a dual transistor including the (1-1)-th and (1-2)-th transistors ST1-1 and ST1-2.

The (1-1)-th transistor ST1-1 may include an active area ACT1-1, a gate electrode G1-1, a source electrode S1-1, and a drain electrode D1-1. The active area ACT1-1 of the (1-1)-th transistor ST1-1 may overlap the gate electrode G1-1 of the (1-1)-th transistor ST1-1. The gate electrode G1-1 of the (1-1)-th transistor ST1-1, which is part of the (k−1)-th scan line SLk-1, may correspond to the overlapping area of the (k−1)-th scan line SLk-1 and the active area ACT1-1.

The source electrode S1-1 of the (1-1)-th transistor ST1-1 may be connected to a second connecting electrode BE2 via a sixth contact hole CNT6, and the second connecting electrode BE2 may be connected to the initialization voltage line VIL via a fifth contact hole CNT5. The source electrode S1-1 of the (1-1)-th transistor ST1-1 may be connected to the initialization voltage line VIL to receive the initialization voltage VI.

The drain electrode D1-1 of the (1-1)-th transistor ST1-1 may be connected to a source electrode S1-2 of the (1-2)-th transistor ST1-2.

The (1-2)-th transistor ST1-2 may include an active area ACT1-2, a gate electrode G1-2, the source electrode S1-2, and the drain electrode D1-2.

The active area ACT1-2 of the (1-2)-th transistor ST1-2 may overlap the gate electrode G1-2 of the (1-2)-th transistor ST1-2. The gate electrode G1-2 of the (1-2)-th transistor ST1-2, which is part of the (k−1)-th scan line SLk-1, may correspond to the overlapping area of the (k−1)-th scan line SLk-1 and the active area ACT1-2.

The source electrode S1-2 of the (1-2)-th transistor ST1-2 may be connected to the drain electrode D1-1 of the (1-1)-th transistor ST1-1.

The drain electrode D1-2 of the (1-2)-th transistor ST1-2 may be connected to the first connecting electrode BE1 via the fourth contact hole CNT4, and the first connecting electrode BE1 may be connected to the gate electrode DT-G of the driving transistor DT via the first contact hole CNT1. The drain electrode D1-2 of the (1-2)-th transistor ST1-2 may also be connected to a drain electrode D2-2 of a (2-2)-th transistor ST2-2.

The second transistor ST2 may be a dual transistor including the (2-1)-th and (2-2)-th transistors ST2-1 and ST2-2.

The (2-1)-th transistor ST2-1 may include an active area ACT2-1, a gate electrode G2-1, the source electrode S2-1, and a drain electrode D2-1. The active area ACT2-1 of the (2-1)-th transistor ST2-1 may overlap the gate electrode G2-1 of the (2-1)-th transistor ST2-1. The gate electrode G2-1 of the (2-1)-th transistor ST2-1, which is part of the k-th scan line SLk, may correspond to the overlapping area of the k-th scan line SLk and the active area ACT2-1.

The source electrode S2-1 of the (2-1)-th transistor ST2-1 may be connected to the drain electrode DT-D of the driving transistor DT and the source electrode S5 of the fifth transistor ST5.

The drain electrode D2-1 of the (2-1)-th transistor ST2-1 may be connected to a source electrode S2-2 of the (2-2)-th transistor ST2-2.

The (2-2)-th transistor ST2-2 may include an active area ACT2-2, a gate electrode G2-2, the source electrode S2-2, and the drain electrode D2-2.

The active area ACT2-2 of the (2-2)-th transistor ST2-2 may overlap the gate electrode G2-2 of the (2-2)-th transistor ST2-2. The gate electrode G2-2 of the (2-2)-th transistor ST2-2, which is part of the k-th scan line SLk, may correspond to the overlapping area of the k-th scan line SLk and the active area ACT2-2.

The source electrode S2-2 of the (2-2)-th transistor ST2-2 may be connected to the drain electrode D2-1 of the (2-1)-th transistor ST2-1.

The drain electrode D2-2 of the (2-2)-th transistor ST2-2 may be connected to the first connecting electrode BE1 via the fourth contact hole CNT4, and the first connecting electrode BE1 may be connected to the gate electrode DT-G of the driving transistor DT via the first contact hole CNT1. The drain electrode D2-2 of the (2-2)-th transistor ST2-2 may also be connected to the drain electrode D1-2 of the (1-2)-th transistor ST1-2.

The third transistor ST3 may include an active area ACT3, a gate electrode G3, a source electrode S3, and the drain electrode D3. The active area ACT3 of the third transistor ST3 may overlap the gate electrode G3 of the third transistor ST3. The gate electrode G3 of the third transistor ST3, which is part of the k-th scan line SLk, may correspond to the overlapping area of the k-th scan line SLk and the active area ACT3.

The source electrode S3 of the third transistor ST3 may be connected to a data line DL via a second contact hole CNT2. Accordingly, the source electrode S3 of the third transistor ST3 may receive the data voltage Vdata from the data line DL.

The drain electrode D3 of the third transistor ST3 may be connected to the source electrode DT-S of the driving transistor DT and the drain electrode D4 of the fourth transistor ST4.

The fourth transistor ST4 may include an active area ACT4, a gate electrode G4, a source electrode S4, and the drain electrode D4. The active area ACT4 of the fourth transistor ST4 may overlap the gate electrode G4 of the fourth transistor ST4. The gate electrode G4 of the fourth transistor ST4, which is part of an emission control line EML, may correspond to the overlapping area of the emission control line EML and the active area ACT4.

The source electrode S4 of the fourth transistor ST4 may be connected to a driving voltage line VDDL via a seventh contact hole CNT7. Accordingly, the source electrode S4 of the fourth transistor ST4 may receive a driving voltage VDD from the driving voltage line VDDL.

The drain electrode D4 of the fourth transistor ST4 may be connected to the source electrode DT-S of the driving transistor DT and the drain electrode D3 of the third transistor ST3.

The fifth transistor ST5 may include an active area ACT5, a gate electrode G5, the source electrode S5, and a drain electrode D5. The active area ACT5 of the fifth transistor ST5 may overlap the gate electrode G5 of the fifth transistor ST5. The gate electrode G5 of the fifth transistor ST5, which is part of the emission control line EML, may correspond to the overlapping area of the emission control line EML and the active area ACT5.

The source electrode S5 of the fifth transistor ST5 may be connected to the drain electrode DT-D of the driving transistor DT and the source electrode S2-1 of the (2-1)-th transistor ST2-1.

The drain electrode D5 of the fifth transistor ST5 may be connected to an anode connecting electrode ANDE via a third contact hole CNT3. The anode connecting electrode ANDE may be connected to the anode electrode of the light-emitting element EL.

The sixth transistor ST6 may include an active area ACT6, a gate electrode G6, a source electrode S6, and a drain electrode D6. The active area ACT6 of the sixth transistor ST6 may overlap the gate electrode G6 of the sixth transistor ST6. The gate electrode G6 of the sixth transistor ST6, which is part of the k-th scan line SLk, may correspond to the overlapping area of the k-th scan line SLk and the active area ACT6.

The source electrode of the sixth transistor ST6 may be connected to a third connecting electrode BE3 via a tenth contact hole CNT10, and the third connecting electrode BE3 may be connected to the initialization voltage line VIL via a ninth contact hole CNT9. The source electrode S6 of the sixth transistor ST6 may be connected to the initialization voltage line VIL to receive the initialization voltage VI.

The drain electrode D6 of the sixth transistor ST6 may be connected to the anode connecting electrode ANDE via the third contact hole CNT3. The anode connecting electrode ANDE may be connected to the anode electrode of the light-emitting element EL.

The first capacitor C1 may include the first electrode CE11 and a second electrode CE12. The first electrode CE11 of the first capacitor C1, which is part of the gate electrode DT-G of the driving transistor DT, may correspond to the overlapping area of the gate electrode DT-G of the driving transistor DT and the second gate layer GTL2. The first electrode CE11 of the first capacitor C1 may be connected to the first connecting electrode BE1 via the first contact hole CNT1, and the first connecting electrode BE1 may be connected to the drain electrodes D1-2 and D2-2 of the (1-2)-th and (2-2)-th transistors ST1-2 and ST2-2 via the fourth contact hole CNT4.

The driving voltage line VDDL may include first and second driving voltage lines VDDL1 and VDDL2. For example, the first driving voltage line VDDL1 may be disposed in the second gate layer GTL2, and the second driving voltage line VDDL2 may be disposed in a source-drain layer SDL.

The second electrode CE12 of the first capacitor C1, which is part of the first driving voltage line VDDL1, may correspond to the overlapping area of the first driving voltage line VDDL1 and the gate electrode DT-G of the driving transistor DT-G.

Referring to FIG. 23, and further to FIG. 22, a display panel 300 may include a substrate SUB, a buffer layer BF, an active layer ACTL, a gate insulating film GI, the first gate layer GTL1, a first interlayer insulating film ILD1, the second gate layer GTL2, a second interlayer insulating film ILD2, and the source-drain layer SDL.

The substrate SUB may be a base substrate and may be formed of an insulating material such as a polymer resin. For example, the substrate SUB may be a flexible substrate that is bendable, foldable, or rollable.

The buffer layer BF may be disposed on the substrate SUB. For example, the buffer layer BF may include a plurality of inorganic films and may be formed on the entire top surface of the substrate SUB to prevent the penetration of moisture into the light-emitting element EL through the substrate SUB.

The active layer ACTL may be disposed on the buffer layer BF. The active layer ACTL may be formed of a silicon-based material. For example, the active layer ACTL may be formed of LTPS. The active areas DT-ACT and ACT1 through ACT6, the source electrodes DT-S and S1 through S6, and the drain electrodes DT-D and D1 through D6 of the driving transistor DT and the first through sixth transistors ST1 through ST6 may be disposed in the active layer ACTL.

The gate insulating film GI may cover the buffer layer BF and the active layer ACTL, and may insulate the active layer ACTL and the first gate layer GTL1.

The first gate layer GTL1 may be disposed on the gate insulating film GI. The gate electrode DT-G of the driving transistor DT, the (k−1)-th and k-th scan lines SLk-1 and SLk of the previous and current stages, and the emission control line EML may be disposed in the first gate layer GTL1.

Part of the gate electrode DT-G of the driving transistor DT may overlap the second electrode CE12 of the first capacitor C1, which is disposed in the second gate layer GTL2, to form the first electrode CE11 of the first capacitor C1.

Parts of the (k−1)-th scan line SLk-1 may overlap the active areas ACT1-1 and ACT1-2 of the (1-1)-th and (1-2)-th transistors ST1-1 and ST1-2 to form the gate electrodes G1-1 and G1-2 of the (1-1)-th and (1-2)-th transistors ST1-1 and ST1-2.

Parts of the k-th scan line SLk may overlap the active areas ACT2-1 and ACT2-2 of the (2-1)-th and (2-2)-th transistors ST2-1 and ST2-2 to form the gate electrodes G2-1 and G2-2 of the (2-1)-th and (2-2)-th transistors ST2-1 and ST2-2. Part of the k-th scan line SLk may overlap the active area ACT3 of the third transistor ST3 to form the gate electrode G3 of the third transistor ST3. Part of the k-th scan line SLk may overlap the active area ACT6 of the sixth transistor ST6 to form the gate electrode G6 of the sixth transistor ST6.

Part of the emission control line EML may overlap the active area ACT4 of the fourth transistor ST4 to form the gate electrode G4 of the fourth transistor ST4. Part of the emission control line EML may overlap the active area ACT5 of the fifth transistor ST5 to form the gate electrode G5 of the fifth transistor ST5.

The first interlayer insulating film ILD1 may cover the first gate layer GTL1 and the gate insulating film GI. The first interlayer insulating film ILD1 may insulate the first and second gate layers GTL1 and GTL2.

The second gate layer GTL2 may be disposed on the first interlayer insulating film ILD1. Part of the second gate layer GTL2 may overlap the first electrode CE11 of the first capacitor C1, which is disposed in the first gate layer GTL1, to form the second electrode CE12 of the first capacitor C1.

The second interlayer insulating film ILD2 may cover the second gate layer GTL2 and the first interlayer insulating film ILD1. The second interlayer insulating film ILD2 may insulate the second gate layer GTL2 and the source-drain layer SDL.

The source-drain layer SDL may be disposed on the second interlayer insulating film ILD2. The first through third connecting electrodes BE1 through BE3, the data line DL, the second driving voltage line VDDL2, the anode connecting electrode ANDE, and the initialization voltage line VIL may be disposed in the source-drain layer SDL.

Figure 24:
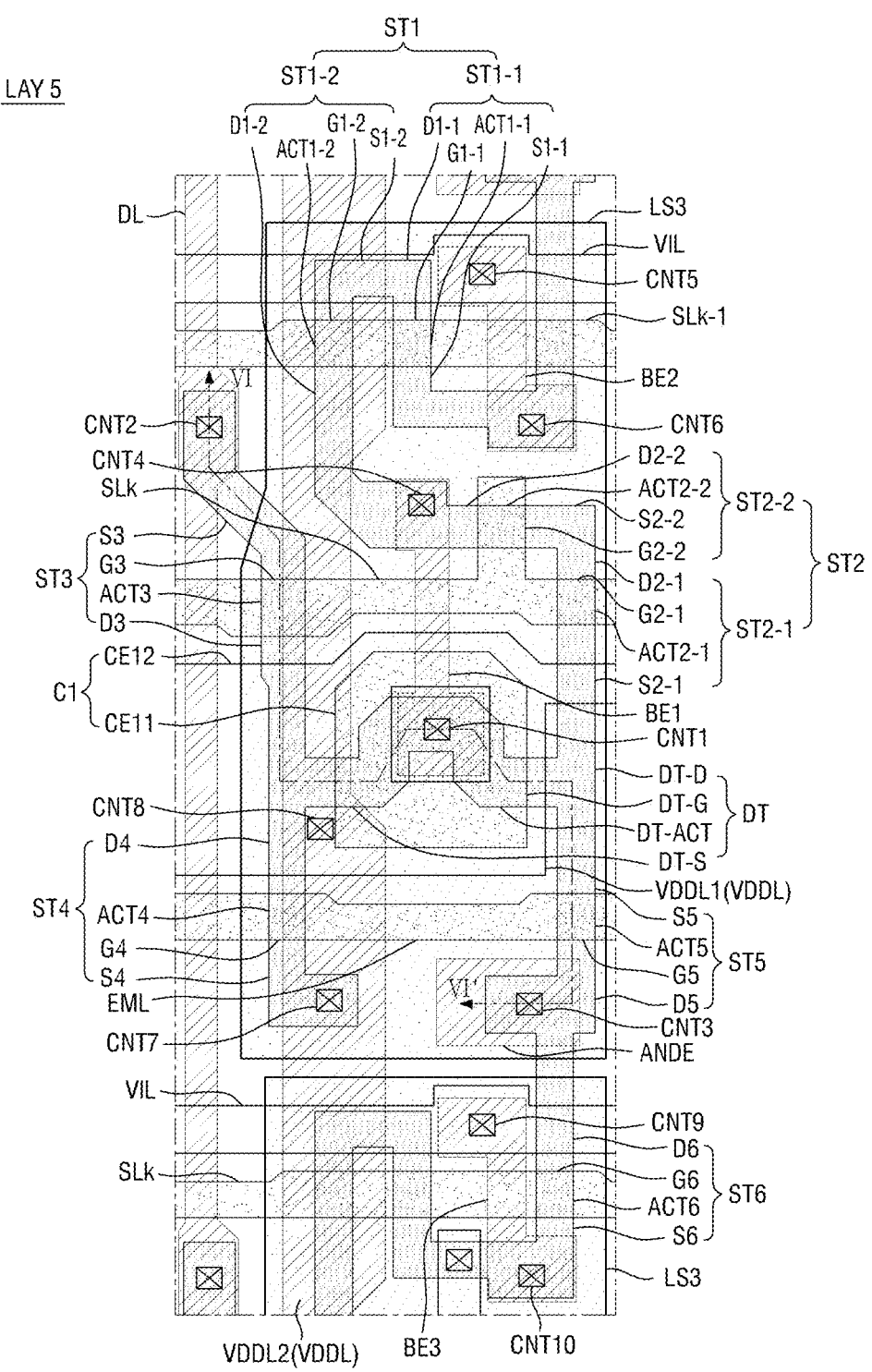
FIG. 24 is a plan view of an example of the subpixel of FIG. 20.
Figure 25:
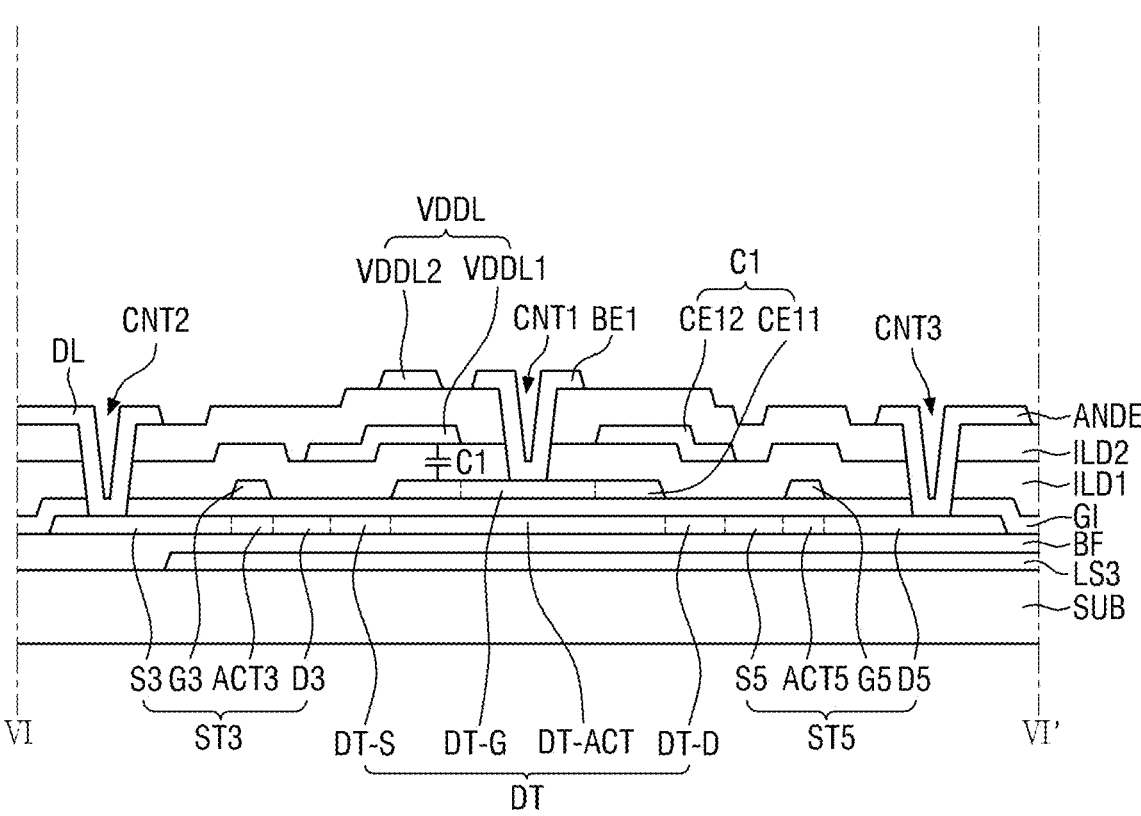
FIG. 25 is a cross-sectional view taken along line VI-VI' of FIG. 24.

FIG. 24 is a plan view of an example of the subpixel of FIG. 20. FIG. 25 is a cross-sectional view taken along line VI-VI' of FIG. 24.

Referring to FIGS. 24 and 25, each of the first subpixels SP1 in the general area MDA and the second subpixels SP2 in the sensor area SDA may be realized as a fifth layout "LAY 5". The fifth layout "LAY 5" is substantially the same as the fourth layout "LAY 4" of FIG. 22, except that it includes a third light-blocking layer LS3. For convenience of explanation, a further description of features and elements that have already been described above will be omitted or simplified.

The third light-blocking layer LS3 may be disposed between the substrate SUB and the buffer layer BF and may overlap the driving transistor DT and the first through sixth transistors ST1 through ST6. For example, a third light-blocking layer LS3 of each of the first subpixels SP1 and the second subpixels SP2 may overlap the driving transistor DT and the first through sixth transistors ST1 through ST6 of the corresponding first or second subpixel SP1 or SP2. In an example embodiment, each of the second subpixels SP2 may include a third light-blocking layer LS3, but the first subpixels SP1 do not include a third light-blocking layer LS3. Thus, the third light-blocking layer LS3 can block light incident upon the first subpixels SP1 or the second subpixels SP2 according to example embodiments.

The second subpixels SP2 in the sensor area SDA may overlap the sensor devices 740, 750, 760, and 770 in the thickness direction. Light emitted from the proximity sensor 740, the illumination sensor 750, the iris sensor 760, the second camera sensor 770, or another sensor may be discharged out of the display device 10, and some of the discharged light may arrive at the second subpixels SP2. The turn-on characteristics, threshold-voltage characteristics, and SS characteristics of at least one of a driving transistor DT and first through sixth transistors ST1 through ST6 of each of the second subpixels SP2 may be affected by light from the sensor devices 740, 750, 760, and 770. For example, the first nodes N1 of the second subpixels SP2 may be connected to the first electrodes CE11 of the first capacitors C1 of the second subpixels SP2, and may thus be affected by light from the sensor devices 740, 750, 760, and 770. The third light-blocking layer LS3 of each of the second subpixels SP2 overlaps the driving transistor DT and the first through sixth transistors ST1 through ST6 of the corresponding second subpixel SP2, and can thus block light from the sensor devices 740, 750, 760, and 770. Accordingly, the third light-blocking layer LS3 of each of the second subpixels SP2 can improve the turn-on characteristics, threshold-voltage characteristics, and SS characteristics of the driving transistor DT and the first through sixth transistors ST1 through ST6 of each of the second subpixels SP2.

Each of the first subpixels SP1 and the second subpixels SP2 includes a driving transistor DT, first through sixth transistors ST1 through ST6, and a first capacitor C1, and can internally compensate for the threshold-voltage characteristics of the driving transistor DT. For example, even if the second subpixels SP2 in the sensor area SDA overlap the sensor devices 740, 750, 760, and 770 in the thickness direction, each of the second subpixels SP2 can improve the turn-on characteristics, threshold-voltage characteristics, and SS characteristics of the transistors thereof because each of the second subpixels SP2 includes a first light-blocking layer LS1. Accordingly, the display device 10 can uniformly maintain the luminance of the display panel 300 by matching the compensated values of the first subpixels SP1 with the compensated values of the second subpixels SP2.

Alternatively, in an example embodiment, the first subpixels SP1 in the general area MDA may receive external light or reflected light, and the second subpixels SP2 in the sensor area SDA may receive light from the sensor devices 740, 750, 760, and 770. As a result, the turn-on characteristics, threshold-voltage characteristics, and SS characteristics of the driving transistor DT and the first through sixth transistors ST1 through ST6 of each of the first subpixels SP1 and the second subpixels SP2 may be affected. However, in example embodiments, each of the first subpixels SP1 and the second subpixels SP2 includes a third light-blocking layer LS3, and can thus improve the turn-on characteristics, threshold-voltage characteristics, and SS characteristics of the transistors thereof. Accordingly, the display device can uniformly maintain the luminance of the display panel 300 by matching the compensated values of the first subpixels SP1 with the compensated values of the second subpixels SP2.

The third light-blocking layer LS3 may be electrically connected to the driving voltage line VDDL, the initialization voltage line VIL, a gate-high voltage line, a gate-low voltage line, a DC voltage line, or an AC voltage line. For example, the third light-blocking layer LS3, which is disposed on the substrate SUB, may be connected to the driving voltage line VDDL, which is disposed in the source-drain layer SDL, via at least one connecting electrode. The at least one connecting electrode may be disposed in the active layer ACTL, the first gate layer GTL1, or the second gate layer GTL2. Thus, the third light-blocking layer LS3 may receive the driving voltage VDD, the initialization voltage VI, a gate-high voltage, a gate-low voltage, a DC voltage, or an AC voltage, thereby maintaining a stable voltage and preventing coupling with other electrodes.

The third light-blocking layer LS3 may be connected to one of the first through fourth nodes N1 through N4. For example, the third light-blocking layer LS3 may be connected to one of the driving transistor DT and the first through sixth transistors ST1 through ST6 of FIG. 7. Thus, the third light-blocking layer LS3 can stably maintain the voltage of the node that it is connected to and can prevent coupling with other electrodes.

In an example embodiment, the third light-blocking layer LS3 may be integrally formed. In an example embodiment, a plurality of first light-blocking layers LS1 may be formed to correspond to at least one transistor. In this example embodiment, each of the plurality of first light-blocking layers LS1 may be connected to a DC voltage line, an AC voltage line, or one electrode of the at least one transistor. The plurality of first light-blocking layers LS1 may receive different voltages, and can thus reduce coupling with other electrodes.

In an example embodiment, each of the first subpixels SP1 may be realized as the fourth layout "LAY 4" of FIG. 22, and each of the second subpixels SP2 may be realized as the fifth layout "LAY 5" of FIG. 24. Each of the first subpixels SP1 may not include a third light-blocking layer LS3, and each of the second subpixels SP2 may include a third light-blocking layer LS3. To match the compensated values of the first subpixels SP1 with the compensated values of the second subpixels SP2, a third light-blocking layer LS3 may be additionally disposed in each of the second subpixels SP2. Accordingly, each of the first subpixels SP1 and the second subpixels SP2 can improve the turn-on characteristics, threshold-voltage characteristics, and SS characteristics of the transistors thereof. The display device 10 can uniformly maintain the luminance of the display panel 300 by matching the compensated values of the first subpixels SP1 with the compensated values of the second subpixels SP2.

Figure 26:
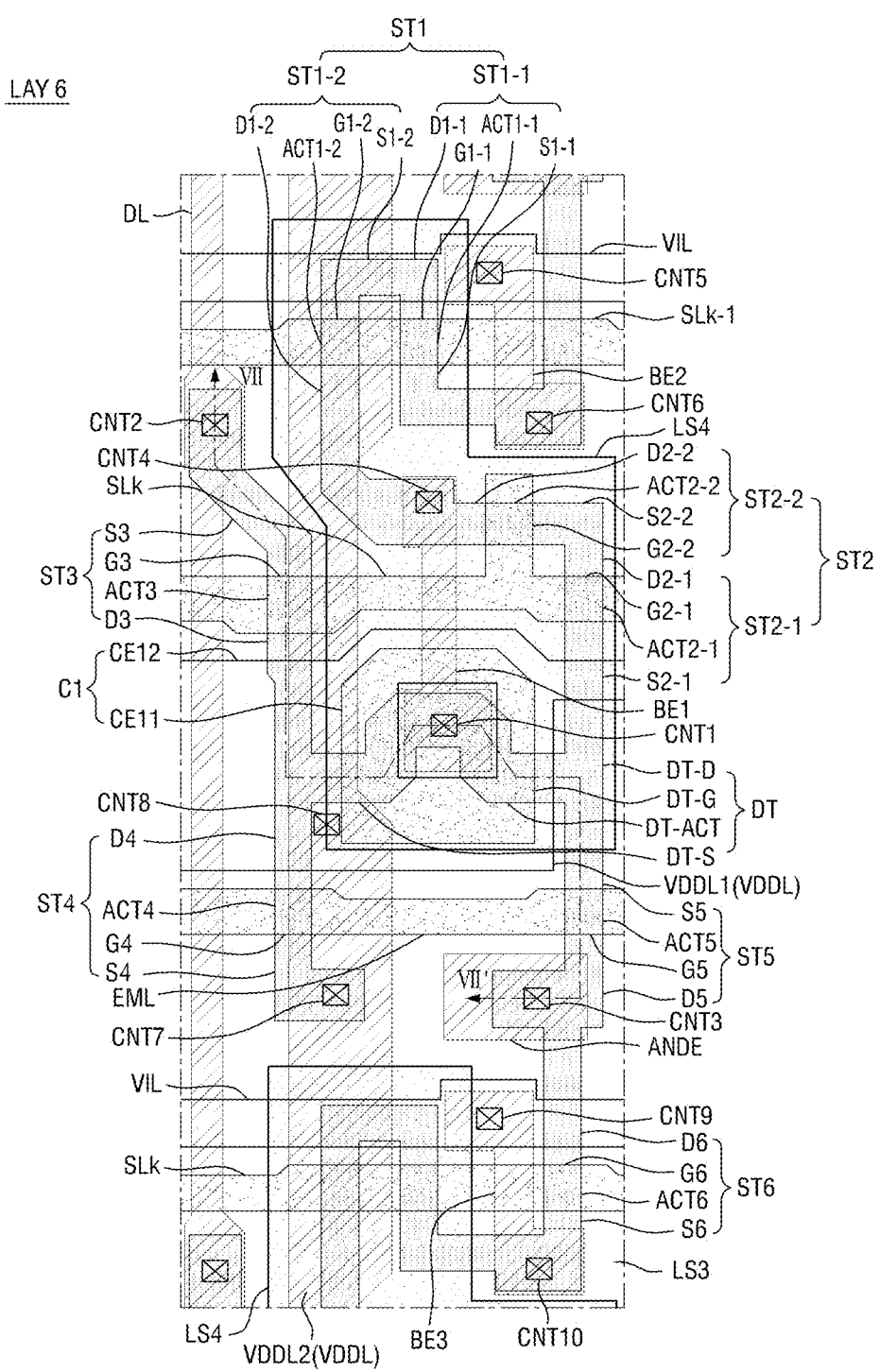
FIG. 26 is a plan view of an example of the subpixel of FIG. 20.
Figure 27:
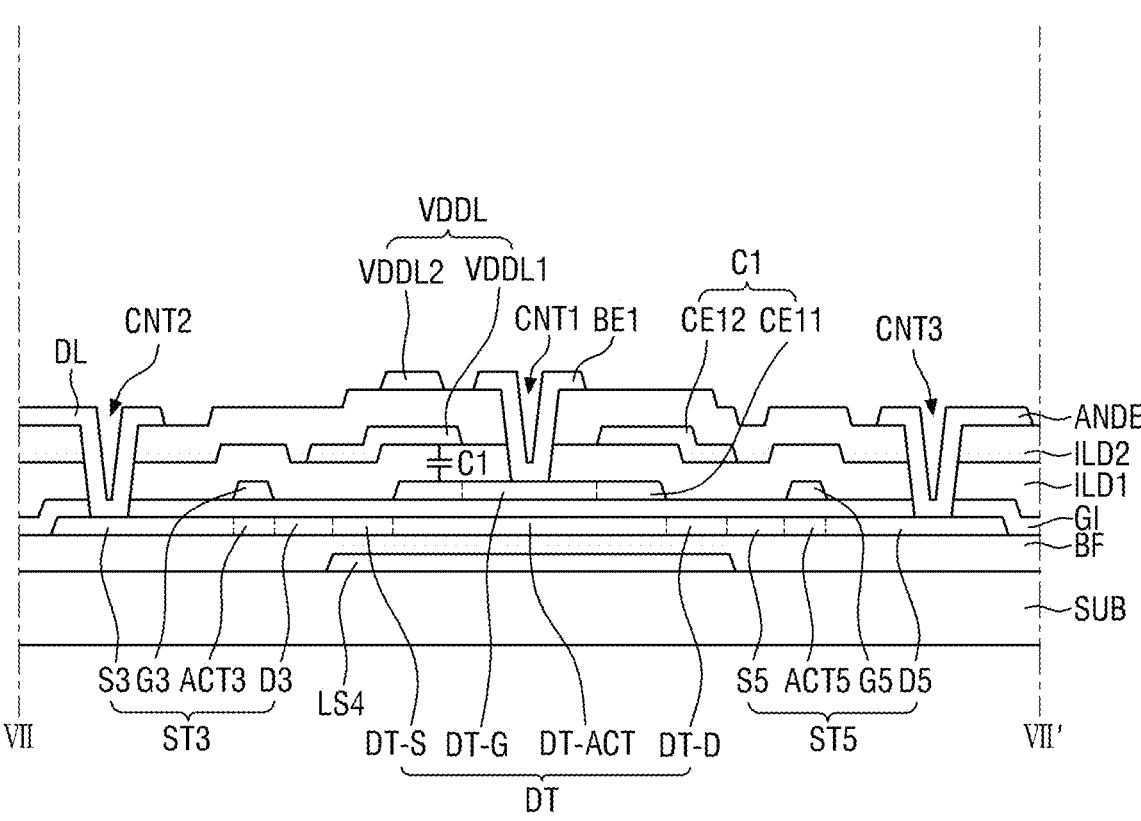
FIG. 27 is a cross-sectional view taken along line VII-VII' of FIG. 26.

FIG. 26 is a plan view of an example of the subpixel of FIG. 20. FIG. 27 is a cross-sectional view taken along line VII-VII' of FIG. 26.

Referring to FIGS. 26 and 27, each of the first subpixels SP1 in the general area MDA and the second subpixels SP2 in the sensor area SDA may be realized as a sixth layout "LAY 6". The sixth layout "LAY 6" is substantially the same as the fifth layout "LAY 5" of FIG. 24, except that it includes a fourth light-blocking layer LS4. For convenience of explanation, a further description of features and elements that have already been described above will be omitted or simplified.

The fourth light-blocking layer LS4 may be disposed between a substrate SUB and a buffer layer BF and may overlap a first node N1. For example, the fourth light-blocking layer LS4 may overlap a gate electrode DT-G of a driving transistor DT, drain electrodes D1-2 and D2-2 of (1-2)-th and (2-2)-th transistors ST1-2 and ST2-2, and a first electrode CE11 of a first capacitor C1. In an example embodiment, the fourth light-blocking layer LS4 may overlap the driving transistor DT, the first and second transistors ST1 and ST2, and the first capacitor C1. The fourth light-blocking layer LS4 can block light incident upon the first node N1, and can thus improve the turn-on characteristics, threshold-voltage characteristics, and SS characteristics of the transistors thereof.

For example, each of the first subpixels SP1 may be realized as the sixth layout "LAY 6" of FIG. 26, and each of the second subpixels SP2 may be realized as the fifth layout "LAY 5" of FIG. 24. Each of the first subpixels SP1 includes a fourth light-blocking layer LS4, and can thus block light incident upon the first node N1. Each of the second subpixels SP2 includes a third light-blocking layer LS3, and can thus block light incident upon the driving transistor DT and the first through sixth transistors ST1 through ST6 thereof. To match the compensated values of the first subpixels SP1 with the compensated values of the second subpixels SP2, different light-blocking layers may be disposed in each of the first subpixels SP1 and in each of the second subpixels SP2. Accordingly, each of the first subpixels SP1 and the second subpixels SP2 can improve the turn-on characteristics, threshold-voltage characteristics, and SS characteristics of the transistors thereof. The display device 10 can uniformly maintain the luminance of the display panel 300 by matching the compensated values of the first subpixels SP1 with the compensated values of the second subpixels SP2.

In an example embodiment, each of the first subpixels SP1 and the second subpixels SP2 may be realized as the sixth layout "LAY 6" of FIG. 26. Each of the first subpixels SP1 and the second subpixels SP2 includes a fourth light-blocking layer LS4 and can thus block light incident upon the first node N1. Accordingly, each of the first subpixels SP1 and the second subpixels SP2 can improve the turn-on characteristics, threshold-voltage characteristics, and SS characteristics of the transistors thereof. The display device 10 can uniformly maintain the luminance of the display panel 300 by matching the compensated values of the first subpixels SP1 with the compensated values of the second subpixels SP2.

Figure 28:
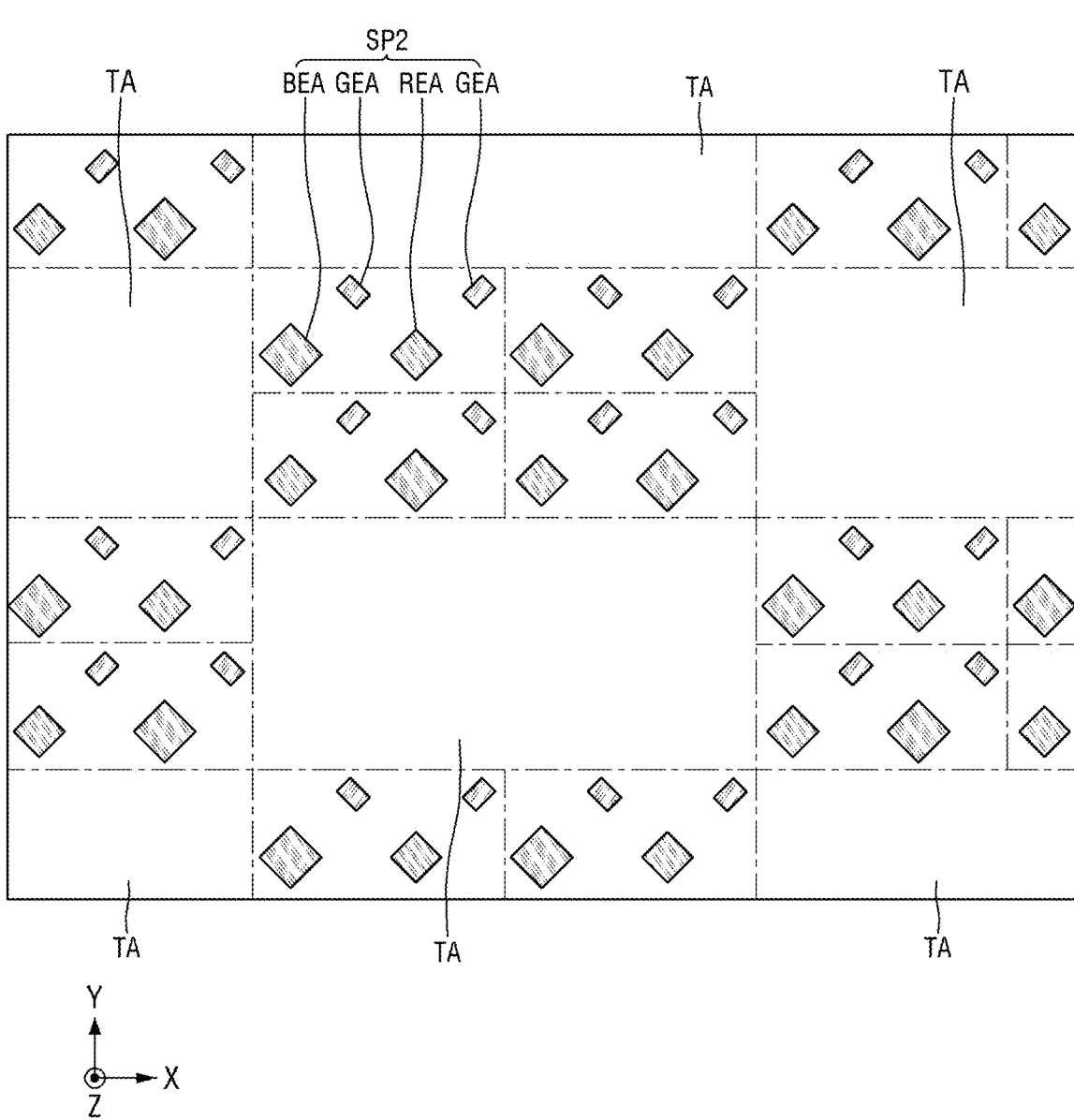
FIG. 28 is a plan view illustrating a sensor area of a display panel according to an example embodiment of the present disclosure.

FIG. 28 is a plan view illustrating a sensor area of a display panel according to an example embodiment of the present disclosure.

Referring to FIG. 28, a sensor area SDA of a display panel 300 may include second subpixels SP2 and light-transmitting areas TA. For example, each of the second subpixels SP2 may include one or more first light-emitting areas REA, one or more second light-emitting areas GEA, and one or more third light-emitting areas BEA. The first light-emitting areas REA, the second light-emitting areas GEA, and the third light-emitting areas BEA may emit light due to light-emitting elements EL of the second subpixels SP2.

The light-transmitting areas TA may transmit light incident upon the display panel 300 therethrough almost as it is (e.g., without having a substantial effect with regard to changing the light). For example, the light-transmitting areas TA may be surrounded by the first light-emitting areas REA, the second light-emitting areas GEA, and the third light-emitting areas BEA. The light-transmitting areas TA and light-emitting groups that include the first light-emitting areas REA, the second light-emitting areas GEA, and the third light-emitting areas BEA may be alternately arranged in a first direction (or an X-axis direction) or in a second direction (or a Y-axis direction).

For example, the number of first subpixels SP1 per unit area of a general area MDA of the display panel 300 may be smaller than the number of second subpixels SP2 per unit area of the sensor area SDA of the display panel 300. In the general area MDA, which is an area for the main function of the display panel 300, e.g., the display of an image, first subpixels SP1 may be densely disposed. The sensor area SDA may include pixel regions in which the second subpixels SP2 are disposed and the light-transmitting areas TA. Thus, as the size of the light-transmitting areas TA increases, the number of second subpixels SP2 per unit area may become much smaller than the number of first subpixels SP1 per unit area.

Referring to FIG. 28, and further to FIG. 2, since the display panel 300 includes the sensor area SDA, the sensor devices 740, 750, 760, and 770 can detect light incident from the top surface of the display panel 300, even if they are disposed at the bottom of the display panel 300.

While the present disclosure has been particularly shown and described with reference to the example embodiments thereof, it will be understood by those of ordinary skill in the art that various changes in form and detail may be made therein without departing from the spirit and scope of the present disclosure as defined by the following claims

What is claimed is:

1. A display device, comprising a plurality of first subpixels in a first area,
the first subpixels comprises:
a first light-emitting element;
a first driving transistor that controls a driving current provided to the first light-emitting element;
a first-first transistor providing an initialization voltage to a first node that is a gate electrode of the first driving transistor;

a first-second transistor connecting the first node and a second node that is a drain electrode of the first driving transistor;
a first-third transistor providing a data voltage to a third node that is a source electrode of the first driving transistor;
a first-fourth transistor connecting a driving voltage line and the third node;
a first-fifth transistor connecting the second node and a fourth node that is an anode electrode of the first light-emitting element;
a first active layer disposed on a substrate and including an active areas of the first driving transistor, the first-third transistor, and first-fifth transistor;
a second active layer disposed on the first active layer and including an active areas of the first-first transistor and the first-second transistor; and
a first light-blocking layer disposed between the substrate and the first active layer and overlapping the first active layer and the second active layer in a thickness direction.

2. The display device of claim 1, wherein the source electrode and the drain electrode of the first driving transistor are included in the first active layer,
the source electrode of the first driving transistor and a drain electrode of the first-third transistor are formed integrally, and
the drain electrode of the first driving transistor and a source electrode of the first-fifth transistor are formed integrally.

3. The display device of claim 2, wherein a drain electrode and a source electrode of the first-first transistor are included in the second active layer,
a drain electrode and a source electrode of the first-second transistor are included in the second active layer,
the source electrode of the first-first transistor and the source electrode of the first-second transistor are formed integrally.

4. The display device of claim 2, wherein the first subpixels further comprises a source-drain layer on the second active layer,
the source-drain layer comprises a first connecting electrode connecting the gate electrode of the first driving transistor and the source electrode of the first-second transistor.

5. The display device of claim 4, wherein the source-drain layer further comprises a second connecting electrode connecting the drain electrode of the first driving transistor and the drain electrode of the first-second transistor.

6. The display device of claim 5, wherein the source-drain layer further comprises a third connecting electrode connecting a data line providing the data voltage and a source electrode of the first-third transistor.

7. The display device of claim 1, wherein the first subpixels further comprises:
a first conductive layer disposed on the first active layer;
a second conductive layer disposed between the first conductive layer and the second active layer; and
a third conductive layer disposed on the second active layer,
the first conductive layer includes gate electrodes of the first driving transistor, the first-third transistor, and the first-fifth transistor,
the third conductive layer includes gate electrodes of the first-first transistor and the first-second transistor.

8. The display device of claim 7, wherein the second conductive layer includes:

a first metal layer overlaps the active area of the first-first transistor; and a second metal layer overlaps the active area of the first-second transistor.

9. The display device of claim 8, wherein the first light-blocking layer receives a different voltage from the first and second metal layers.

10. The display device of claim 1, further comprising a plurality of second subpixels in a second area adjacent to the first area, the second subpixels comprises:

a second light-emitting element;

a second driving transistor that controls a driving current provided to the second light-emitting element;

a second-first transistor providing an initialization voltage to a first node that is a gate electrode of the second driving transistor;

a second-second transistor connecting the first node and a second node that is a drain electrode of the second driving transistor;

a second-third transistor providing a data voltage to a third node that is a source electrode of the second driving transistor;

a second-fourth transistor connecting a driving voltage line and the third node;

a second-fifth transistor connecting the second node and a fourth node that is an anode electrode of the second light-emitting element;

a first active layer disposed on a substrate and including an active areas of the second driving transistor, the second-third transistor, and second-fifth transistor;

a second active layer disposed on the first active layer and including an active areas of the second-first transistor and the second-second transistor; and a second light-blocking layer disposed between the substrate and the first active layer and overlapping the first active layer in a thickness direction.

11. The display device of claim 10, wherein the second light-blocking layer is spaced apart from the second active layer in a plan view.

12. The display device of claim 10, the first active layer of the first subpixels and the first active layer of the second subpixels are disposed on a same layer, the second active layer of the first subpixels and the second active layer of the second subpixels are disposed on a same layer, and the first light-blocking layer and the second light-blocking layer are disposed on a same layer.

13. A display device, comprising a plurality of first subpixels in a first area, the first subpixels comprises:

a first light-emitting element;

a first driving transistor that controls a driving current provided to the first light-emitting element;

a first-first transistor providing an initialization voltage to a first node that is a gate electrode of the first driving transistor;

a first-second transistor connecting the first node and a second node that is a drain electrode of the first driving transistor;

a first-third transistor providing a data voltage to a third node that is a source electrode of the first driving transistor; and a first light-blocking layer overlapping active areas of the first driving transistor, the first-first transistor, the first-second transistor, and the first-third transistor in a thickness direction.

14. The display device of claim 13, wherein the source electrode and the drain electrode of the first driving transistor are included in a first active layer, the source electrode of the first driving transistor and a drain electrode of the first-third transistor are formed integrally.

15. The display device of claim 14, wherein a drain electrode and a source electrode of the first-first transistor are included in a second active layer on the first active layer, a drain electrode and a source electrode of the first-second transistor are included in the second active layer, the source electrode of the first-first transistor and the source electrode of the first-second transistor are formed integrally.

16. The display device of claim 15, wherein the first subpixels further comprises a source-drain layer on the second active layer, the source-drain layer comprises a first connecting electrode connecting the gate electrode of the first driving transistor and the source electrode of the first-second transistor.

17. The display device of claim 16, wherein the source-drain layer further comprises a second connecting electrode connecting the drain electrode of the first driving transistor and the drain electrode of the first-second transistor.

18. The display device of claim 17, wherein the source-drain layer further comprises a third connecting electrode connecting a data line providing the data voltage and a source electrode of the first-third transistor.

19. The display device of claim 15, wherein the first subpixels further comprises:

a first conductive layer disposed on the first active layer;

a second conductive layer disposed between the first conductive layer and the second active layer; and a third conductive layer disposed on the second active layer, the first conductive layer includes gate electrodes of the first driving transistor and the first-third transistor, the third conductive layer includes gate electrodes of the first-first transistor and the first-second transistor.

20. The display device of claim 19, wherein the second conductive layer includes:

a first metal layer overlaps the active area of the first-first transistor; and a second metal layer overlaps the active area of the first-second transistor.

21. The display device of claim 13, further comprising a plurality of second subpixels in a second area adjacent to the first area, the second subpixels comprises:

a second light-emitting element;

a second driving transistor that controls a driving current provided to the second light-emitting element;

a second-first transistor providing an initialization voltage to a first node that is a gate electrode of the second driving transistor;

a second-second transistor connecting the first node and a second node that is a drain electrode of the second driving transistor;

a second-third transistor providing a data voltage to a third node that is a source electrode of the second driving transistor; and a second light-blocking layer disposed between the substrate and the first active layer and overlapping active areas of the second driving transistor and the second-third transistor in a thickness direction.

22. The display device of claim 21, wherein the first driving transistor and second driving transistor are disposed on a same layer, the first-first transistor and the second-first transistor are disposed on a same layer, the first-second transistor and the second-second transistor are disposed on a same layer, the first-third transistor and the second-third transistor are disposed on a same layer, and the first light-blocking layer and the second light-blocking layer are disposed on a same layer.

\* \* \* \* \*